(12) United States Patent
Funk et al.

(10) Patent No.: US 7,571,074 B2
(45) Date of Patent: *Aug. 4, 2009

(54) METHOD OF USING A WAFER-THICKNESS-DEPENDANT PROFILE LIBRARY

(75) Inventors: Merritt Funk, Austin, TX (US); Sachin Deshpande, San Jose, CA (US); Kevin Lally, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 66 days.

This patent is subject to a terminal disclaimer.

(21) Appl. No.: 11/668,690

(22) Filed: Jan. 30, 2007

(65) Prior Publication Data

US 2008/0183411 A1  Jul. 31, 2008

(51) Int. Cl.
*G01B 11/02* (2006.01)
*G06F 17/40* (2006.01)

(52) U.S. Cl. .................... 702/170; 702/172; 702/84; 438/16

(58) Field of Classification Search ................ 702/170, 702/172

See application file for complete search history.

(56) References Cited

U.S. PATENT DOCUMENTS

| | | | |
|---|---|---|---|
| 6,538,731 B2 * | 3/2003 | Niu et al. ................ | 356/237.5 |
| 6,785,638 B2 * | 8/2004 | Niu et al. ................ | 702/189 |
| 6,943,900 B2 * | 9/2005 | Niu et al. ................ | 356/625 |
| 7,171,284 B2 | 1/2007 | Vuong et al. | |
| 7,330,279 B2 | 2/2008 | Vuong et al. | |
| 7,388,677 B2 | 6/2008 | Vuong et al. | |
| 7,451,054 B2 * | 11/2008 | Deshpande et al. ........ | 702/134 |
| 2004/0017574 A1 * | 1/2004 | Vuong et al. ............. | 356/625 |
| 2005/0209816 A1 * | 9/2005 | Vuong et al. ............. | 702/167 |
| 2006/0064280 A1 * | 3/2006 | Vuong et al. ............. | 702/182 |
| 2008/0077352 A1 * | 3/2008 | Willis et al. ............. | 702/155 |
| 2008/0077362 A1 * | 3/2008 | Willis et al. ............. | 702/189 |

* cited by examiner

*Primary Examiner*—Hal D Wachsman
(74) *Attorney, Agent, or Firm*—Oblon, Spivak, McClelland, Maier & Neustadt, P.C.

(57) ABSTRACT

A method for facilitating an ODP (optical digital profile) measurement of a semiconductor wafer. The method includes obtaining real time wafer characteristic data for a measurement site on the wafer and detecting a measured diffraction signal from a structure within the measurement site of the wafer. The measured diffraction signal is matched with a simulated diffraction signal stored in a wafer characteristic dependent profile library. A hypothetical profile structure associated with the simulated diffraction signal in the wafer characteristic dependent profile library is then identified. The real time wafer characteristic data is used to facilitate at least one of the matching and identifying. The real time wafer characteristic data may be real time wafer thickness data.

32 Claims, 6 Drawing Sheets

METHOD OF USING A WAFER-THICKNESS-DEPENDANT PROFILE LIBRARY

CROSS-REFERENCE TO RELATED APPLICATIONS

This application is related to co-pending Ser. No. 11/668,537, entitled "Real-Time Parameter Tuning For Etch Processes"; Ser. No. 11/668,572, entitled "Real-Time Parameter Tuning Using Wafer Thickness; Ser. No. 11/668,553, entitled "Real-Time Parameter Tuning Using Wafer Temperature"; and Ser. No. 11/668,654 (now U.S. Pat. No. 7,451,054), entitled "Method of Using a Wafer Temperature-Dependant Profile Library", each filed on even date herewith. The contents of each of these applications are herein incorporated by reference in their entireties.

BACKGROUND OF THE INVENTION

1. Field of the Invention

The present invention relates to profile libraries, and more particularly to improving the measurement accuracy using a wafer-thickness-dependent library.

2. Description of the Related Art

One example of optical metrology involves directing an incident beam at a structure, measuring the resulting diffracted beam, and analyzing the diffracted beam to determine various characteristics, such as the profile of the structure. In semiconductor manufacturing, optical metrology of periodic gratings is typically used for quality assurance.

For example, a periodic grating may be formed near an operating structure of a semiconductor chip. The periodic grating is then illuminated with an electromagnetic radiation, and the electromagnetic radiation that deflects off the periodic grating can be collected as a diffraction signal. The diffraction signal can then be analyzed to determine whether the periodic grating, and by extension whether the operating structure of the semiconductor chip, has been fabricated according to specifications.

In one conventional system, the diffraction signal collected from illuminating the periodic grating (the measured-diffraction signal) is compared to a library of simulated-diffraction signals. Each simulated-diffraction signal in the library is associated with a hypothetical profile. When a match is made between the measured-diffraction signal and one of the simulated-diffraction signals in the library, the hypothetical profile associated with the simulated-diffraction signal is presumed to represent the actual profile of the periodic grating, thus providing information about the operating structure which can be used for further processing, control etc.

Material variations can occur across a wafer, from wafer to wafer and from lot to lot. This variation, for example, can be due to CVD or spin on films not being uniform across the wafer, chamber to chamber variations and chamber drift in processing over time. Further, film properties can change across a wafer and/or wafer to wafer during a process, such as the etch process, due to the nature of using end pointing and sacrificial films to control a bottom CD. Etching of a film, for example, can change the optical properties and physical properties of a film. Such changes in material properties, film properties or other properties that occur during processing of the wafer can also cause variation in optical properties of the material, film, etc. Thus, optical metrology of a semiconductor wafer (by using a grating, for example) can produce measurement results that vary in accordance with the variations in the optical properties, rather than on the parameter intended to be measured.

SUMMARY OF THE INVENTION

One object of the invention is to address the above and/or other problems with optical metrology methods.

Another object of the invention is to provide a mechanism for considering prior process effects on optical metrology measurements in order to provide accurate measurement data.

The invention can provide a method of processing a wafer in real-time using Real-Time Parameter Tuning (RTPT) procedures. In addition, one or more Transparent Coupling Devices (TCDs) can be used to provide the tuning parameters when RTPT procedures are performed.

The invention can provide a method of using a thickness-dependent profile library for improving the accuracy of optical measurements. The method can include receiving a wafer, wafer data, and one or more input messages. The wafer can include a plurality of dies and a number of measurement sites, and the wafer data can include wafer state data, and at least one input message that can include feed-forwarded tuning data. The method can include determining a wafer state for the wafer, and a thickness-dependent profile library can be identified using the wafer state, and can include data for wavelengths between approximately 100 nm and approximately 1000 nm. The method can also include determining a real-time wafer thickness using the feed-forwarded tuning data, and establishing a first wafer-thickness-dependent profile data space in the thickness-dependent profile library using the real-time wafer thickness. The first wafer-thickness-dependent profile data space can include wafer-thickness-dependent profile signal data and associated wafer-thickness-dependent profile structure data based on real-time wafer thickness, and can include data points having accuracy limits based on real-time wafer thickness data. Next, a measurement site can be selected using the real-time wafer thickness, and the measurement site includes a reference structure. Then, an updated measurement recipe can be established using the real-time wafer thickness, and a signal can be measured off the reference structure using the updated measurement recipe. The measurement can generate an updated measurement signal that is dependent upon the real-time wafer thickness. A best estimate signal for the updated measurement signal can be selected, where the best estimate signal can be a data point of the first wafer-thickness-dependent profile data space with a thickness-dependent profile signal substantially close to the updated measurement signal. The best estimate signal can have a best estimate profile structure and/or best estimate profile parameters associated therewith. In the next steps, a difference can be calculated between the updated measurement signal and the best estimate signal, and the difference can be compared to a matching criteria. In additional steps, the reference structure can be identified as a member of the thickness-dependent profile library and the wafer can be identified as an updated wafer if matching criteria is met or a first corrective action can be applied if the matching criteria are not met.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The invention provides a system and methods for using real-time parameter tuning during wafer processing. One or more Transparent Coupling Devices (TCDs) can be used to feed forward messages and/or data in real-time to update models and/or recipes. TCDs can be installed and integrated into a factory system, a processing subsystem, and/or a measurement subsystem without large changes in factory automation and/or tool software.

Figure 1:
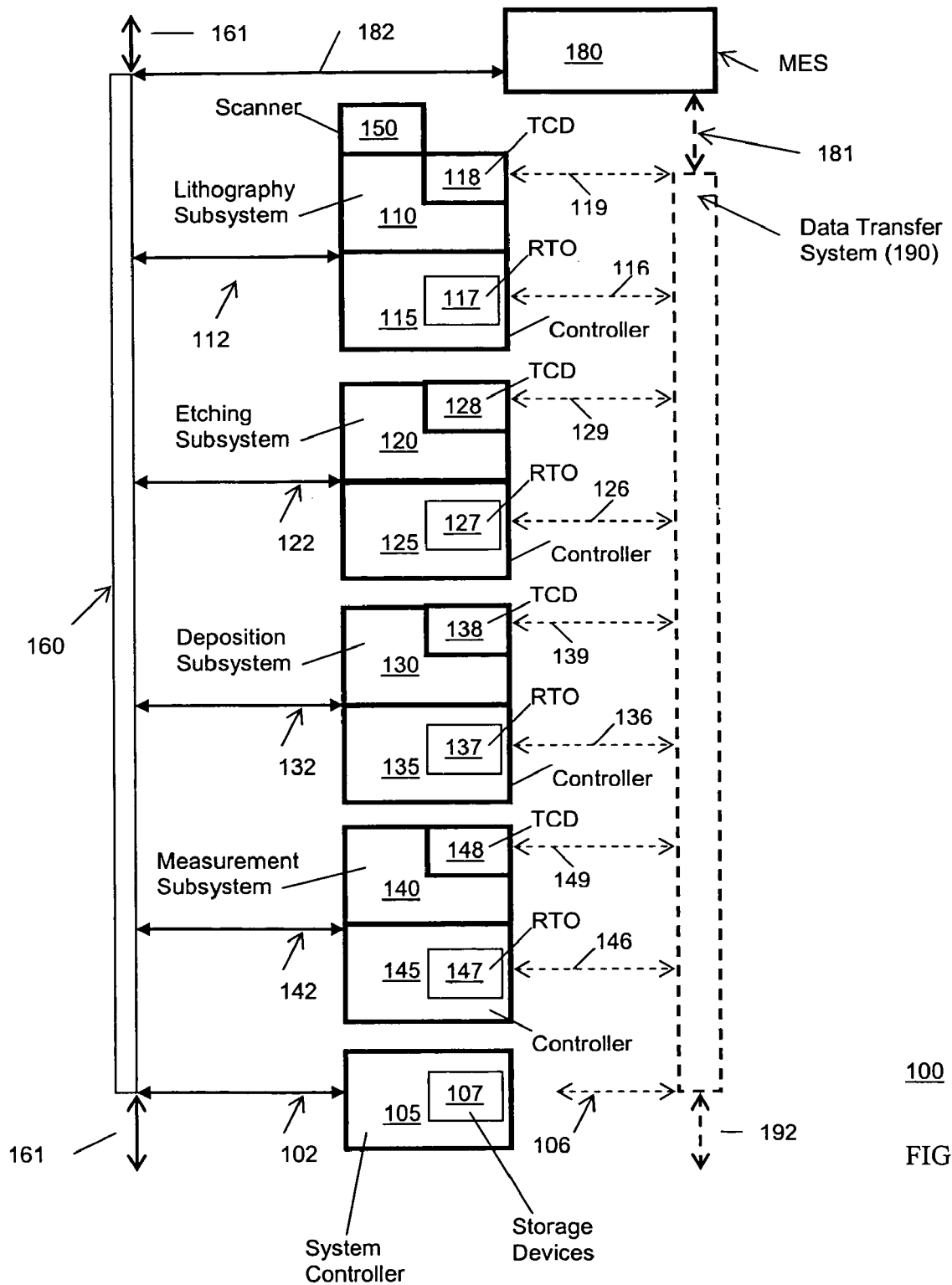
FIG. 1 shows an exemplary block diagram of a processing system in accordance with embodiments of the invention.

FIG. 1 shows an exemplary block diagram of a processing system in accordance with embodiments of the invention. In the illustrated embodiment, wafer-processing system 100 comprises a lithography subsystem 110, an etching subsystem 120, a deposition subsystem 130, and a measurement subsystem 140. The lithography subsystem 110, etching subsystem 120, deposition subsystem 130, and measurement subsystem 140 can be coupled to each other using transfer system 160. For example, transfer system 160 can be used to receive wafers, transfer wafers, align wafers, store wafers exchange process-related information, and exchange wafer-related information.

A manufacturing execution system (MES) 180 can be coupled 182 to the transfer system 160 and can be coupled 181 to the data transfer system 190. As used herein, the term "coupled" followed by a reference designator can indicate a physical or non-physical coupling of two systems to achieve data transfer and/or physical transfer of an object such as a wafer. Alternatively a factory level and/or host system may be used and other coupling techniques may be used. In alternate embodiments, one or more additional subsystems may be required. For example, wafer-processing system 100 may be coupled 161 to another processing system.

The wafer-processing system 100 can include a system controller 105 and storage devices 107. Alternatively, the system controller 105 and/or storage devices 107 may not be required. System controller 105 can be coupled 102 to the transfer system 160 and can be coupled 106 to the data transfer system 190. Alternatively other configurations may be used and other coupling techniques may be used.

The lithography subsystem 110 can include a Transparent Coupling Device (TCD) 118 that can be coupled 119 to the data transfer system 190, the etching subsystem 120 can include a TCD 128 that can be coupled 129 to the data transfer system 190, the deposition subsystem 130 can include a TCD 138 that can be coupled 139 to the data transfer system 190, and the measurement subsystem 140 can include TCD 148 that can be coupled 149 to the data transfer system 190. Alternatively, one or more of the TCDs 118, 128, 138, and 148 may not be required. Single TCDs are shown for each subsystem, but this is not required for the invention. In other embodiments, any number of TCDs can be used in a subsystem. The TCDs can be coupled in series and/or in parallel and can have one or more input ports and/or one or more output ports. TCDs can be coupled to each other and to other devices using a network such as an intranet, internet, and/or wireless connections. TCDs can be connected to one or more input devices and/or output devices in a subsystem.

The lithography subsystem 110 can include a controller 115 that can include a Real-Time Optimizer (RTO) 117, the etching subsystem 120 can include a controller 125 that can include a RTO 127, the deposition subsystem 130 can include a controller 135 that can include a RTO 137, and the measurement subsystem 140 can include a controller 145 that can include a RTO 127. The controllers (105, 115, 125, 135, and 145) can be coupled to each other as required. For example, controller 115 can be coupled 116 to a data transfer system 190, controller 125 can be coupled 126 to the data transfer system 190, controller 135 can be coupled 136 to the data transfer system 190, and controller 145 can be coupled 146 to a data transfer system 190. Alternatively, other coupling configurations may be used. In addition, a scanner 150 can be coupled to the lithography subsystem 110, or alternatively, the lithography subsystem 110 may include a scanning system.

One or more of the RTOs (117, 127, 137, and 147) and/or one or more of the TCDs (118, 128, 138, and 148) can be used when performing Real-Time Parameter Tuning (RTPT) procedures. A RTO can receive real-time data, such as real-time RTPT parameters from one or more TCDs to tune and/or optimize a recipe, profile, and/or model. In some embodiments, a tuning procedure can be performed in which fine adjustments are made to the optical measurement based on feedforward data, and an optimization procedure can then be performed in which the "tuned" data is then used to calculate an optimized recipe for processing or updating a process model. One or more of the RTOs (117, 127, 137, and 147) can perform real-time RTPT procedures using real-time tuning data and provide real-time tuned data as described herein. In some embodiments, one or more RTOs can be used to intercept one or more SECS (semiconductor equipment communication standard) messages from a MES 180, read and/or remove tuning information, feed forward the tuning information, and pass-through the remaining information as an SECS message. One or more of the RTOs (117, 127, 137, and 147) can perform real-time optimization procedures using real-time optimization data and provide real-time optimized data as described herein. For example, a TCD can be used to process the messages. In addition, one or more RTOs can be used to intercept one or more SECS messages from another subsystem, read and/or remove optimization information, feed forward the optimization information, and pass-through the remaining information as an SECS message. For example, a message can be passed-through to a MES 180 or another subsystem.

In addition, one or more of the controllers (105, 115, 125, 135, and 145) can be used to perform RTPT procedures. The controllers (105, 115, 125, 135, and 145) can include procedures and/or memory (not shown) as required. For example, a memory (not shown) can be used for storing information and instructions to be executed by the controllers (105, 115, 125, 135, and 145), and may be used for storing temporary variables or other intermediate information during the execution of instructions by the various computers/processors in the wafer-processing system 100. One or more controllers (105, 115, 125, 135, and 145), or other system components can comprise the means for reading data and/or instructions from a computer readable medium and can comprise the means for writing data and/or instructions to a computer readable medium.

The wafer-processing system 100 can perform a portion of or all of the processing steps of the invention in response to the computers/processors in the wafer-processing system executing one or more sequences of one or more instructions contained in a memory. Such instructions may be received from another computer, a computer readable medium, or a network connection.

Stored on any one or on any combination of computer readable media, the present invention includes software for controlling the wafer-processing system, for driving a device or devices for implementing the invention, and for enabling the wafer-processing system 100 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The term "computer readable medium" as used herein refers to any medium that participates in providing instructions to a processor of the system 100 for execution. A computer readable medium may take many forms, including but not limited to, non-volatile media, volatile media, and transmission media.

In some embodiments, an integrated system can be configured using system components manufactured by Tokyo Electron Limited (TEL). For example, an integrated metrology module (IMM) from TEL may be used. In other embodiments, different subsystems and/or tools may be included.

The processing tools can include one or more etch tools, deposition tools, ALD tools, measurement tools, ionizations tools, polishing tools, coating tools, developing tools, cleaning tools, exposure tools, and thermal treatment tools. In addition, the metrology tools can include a CD-Scanning Electron Microscopy (CDSEM) tool, a Transmission Electron Microscopy (TEM) tool, a focused ion beam (FIB) tool, an ODP tool, an Atomic Force Microscope (AFM) tool, or other optical metrology tools. The processing tools and/or metrology tools can have different interface requirements. TCDs can be configured to satisfy these different interface requirements and can be used to "transparently" couple a number of different processing tools and/or metrology tools to an existing processing system. As will be discussed below, "collected data" can include historical and real-time wafer data and/or process data. For example, real-time wafer thickness data and/or real time wafer temperature data can be extracted from the collected data.

One or more of the subsystems of the wafer-processing system 100 can comprise a control component, a GUI component, and/or a database component (not shown). For example, GUI components (not shown) can provide easy to use interfaces that enable users to: view status; create/view/edit TCDs, RTOs, RTPT procedures, strategies, plans, errors, faults, databases, rules, recipes, modeling applications, simulation/spreadsheet applications, email messages, and diagnostics screens. As should be apparent to those skilled in the art, the GUI components need not provide interfaces for all functions, and may provide interfaces for any subset of these functions or others not listed here.

TCDs 118, 128, 138, and 148 can be coupled to data transfer system 190 for exchanging information with the MES 180 and other subsystems. The data transfer system 190 can comprise hardwire and/or wireless components.

The system controller 105 can include Advanced Process Control (APC) applications, Fault Detection and Classification (FDC), and/or Run-to-Run (R2R) applications, and can be coupled to subsystem 110, 120, 130, and/or 140 using a bi-directional link 102 to the transfer system 160. Alternatively, the system controller may be coupled differently. In alternate embodiments, one or more TCDs (not shown) may be included in a system controller 105 and may exchange information with the MES and/or subsystems.

In some embodiments, a TCD, such as 118, 128, 138, or 148, can extract a recipe, profile, and/or a model tuning parameter message from a host message and can route the tuning parameter message to a controller, such as controller 105, 115, 125, 135, or 145. Other messages from the host message can be passed through to a subsystem associated with the message without any changes. In many cases, the TCD can be installed and operated with little or no changes required to the subsystem and/or tool software.

In other embodiments, a TCD, such as TCD 118, 128, 138, or 148, can extract a recipe, profile, and/or a model tuning parameter message from a host message and can route the tuning parameter message to a RTO, such as RTO 107, 117, 127, 137, or 147. Other messages from the host message can be passed through to a subsystem associated with the message without any changes. In still other embodiments, a TCD, such as 118, 128, 138, or 148, can extract a recipe, profile, and/or a model tuning parameter message from an internal message and can route the tuning parameter message internally within a subsystem and/or externally.

One or more of the RTOs (117, 127, 137, and 147) and/or one or more of the controllers (105, 115, 125, 135, and 145) can comprise process tuning and/or optimization procedures, model tuning and/or optimization procedures, or profile tuning and/or optimization procedures, or any combination thereof. For example, process (recipe) tuning and/or optimization procedures can include update procedures that can be performed just before a process (recipe) is executed. Process (recipe) tuning and/or optimization procedures can get update data that can be used to update a process recipe just before a process (recipe) is executed. Process (recipe) tuning and/or optimization procedures determine when a wafer gets processed by an updated recipe and when there is not enough time to change the recipe before processing the current wafer.

By using real-time tuning and/or optimization data, processes recipes, profiles, and/or models can be updated in real-time, can be performed with more precision, and more accurate process results can be achieved. In smaller geometry technologies below the 65 nm node, more accurate results are required. The real-time update data can include recipe/profile/model tuning parameters, and the optimization/update data can be fed forward in real-time by a TCD in a RTO, for example.

Material and/or process variations that can affect process recipes, profiles, models, and/or process results can change within a wafer, from wafer-to-wafer, and from lot-to-lot. These variations can be caused by changes and/or problems in the lithography subsystem 110, the etching subsystem 120, the deposition subsystem 130, the measurement subsystem 140, and/or the transfer system 160. Non-uniform films and/or non-uniform processes can cause problems. In addition, tool-to-tool variations, chamber-to-chamber variations, and chamber drift can lead to problems over time. For example, thermal properties, thicknesses and/or uniformities can change within a wafer, from wafer to wafer, and from lot to lot during the etch process due to the nature of using end pointing and sacrificial films to control a bottom critical dimension (CD). In addition, thickness and/or temperature variations can cause changes in the optical properties and other physical properties.

The latest information from material processing procedures and/or metrology procedures obtained just prior to a measurement process can be fed forward and can be used at the time of measurement calculations to optimize the measurement process accuracy and precision. The information can be passed to an etching and/or metrology tool calculation procedures in real-time as real-time variable parameters, overriding current model default values and narrowing the search space for resolving accurate results. Information can be used with a library-based system or in real-time regression or any combination of both library and real-time regression to optimize part of the measurement procedure.

A measurement subsystem, such as measurement subsystem 140, can include an integrated Optical Digital Profiling (iODP) system (not shown). Alternatively, other metrology systems may be used. An iODP tool is available from Timbre Technologies Inc. (a TEL company). For example, ODP techniques can be used to obtain critical dimension (CD) information, structure profile information, or via profile information, and the wavelength ranges for an iODP system can range from less than approximately 200 nm to greater than approximately 900 nm. An exemplary ODP system can include an ODP Profiler Library, a Profiler Application Server (PAS), and ODP Profiler Software. The ODP Profiler Library can comprise an application specific database of optical spectra and its corresponding semiconductor profiles, CDs, and film thicknesses. The PAS can comprise at least one computer that connects with optical hardware and computer network. The PAS handles the data communication, ODP library operation, measurement process, results generation, results analysis, and results output. The ODP Profiler Software includes the software installed on PAS to manage measurement recipe, ODP Profiler library, ODP Profiler data, ODP Profiler results search/match, ODP Profiler results calculation/analysis, data communication, and PAS interface to various metrology tools and computer networks.

A metrology subsystem, such as measurement subsystem 140, can use polarizing reflectometry, spectroscopic ellipsometry, reflectometry, or other optical measurement techniques to measure accurate device profiles, accurate critical dimensions (CD), and multiple layer film thickness of a wafer. The integrated metrology process can be executed in-line, which eliminates the need to break the wafer for performing the analyses or waiting for long periods for data from external tools. ODP techniques can be used with the existing thin film metrology tools for inline profile and CD measurement, and can be integrated with TEL processing tools and/or lithography systems to provide real-time process monitoring and control. An exemplary optical metrology system is described in U.S. Pat. No. 6,943,900, entitled GENERATION OF A LIBRARY OF PERIODIC GRATING DIFFRACTION SIGNAL, by Niu, et al., issued on Sep. 13, 2005, and is incorporated in its entirety herein by reference.

An alternative procedure for generating a library of simulated-diffraction signals can include using a machine learning system (MLS). Prior to generating the library of simulated-diffraction signals, the MLS is trained using known input and output data. In one exemplary embodiment, simulated diffraction signals can be generated using a machine learning system (MLS) employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. Patent Publication No. 2004/0017574, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

For detailed description of metrology model optimization, refer to U.S. Patent Publication No. 2004/0017574, OPTIMIZED MODEL AND PARAMETER SELECTION FOR OPTICAL METROLOGY, by Vuong, et al., filed Jun. 27, 2002; U.S. Patent Publication No. 2006/0064280, OPTICAL METROLOGY MODEL OPTIMIZATION BASED ON GOALS, by Vuong, et al., filed Sep. 21, 2004; and U.S. Patent Publication No. 2005/0209816, OPTICAL METROLOGY OPTIMIZATION FOR REPETITIVE STRUCTURES, by Vuong, et al., filed on Apr. 27, 2004, all of which are incorporated herein by reference in their entireties.

When a regression process is used, a measured diffraction signal measured off the patterned structure can be compared to simulated diffraction signals. The simulated diffraction signals can be iteratively generated based on sets of profile parameters, to get a convergence value for the set of profile parameters that generates the closest match simulated diffraction signal compared to the measured diffraction signal. For a more detailed description of a regression-based process, see U.S. Pat. No. 6,785,638, titled METHOD AND SYSTEM OF DYNAMIC LEARNING THROUGH A REGRESSION-BASED LIBRARY GENERATION PROCESS, issued on Aug. 31, 2004, which is incorporated herein by reference in its entirety.

When a library-based process is used, an optical metrology data library can be generated and/or enhanced using tuned and/or optimized recipes, profiles, and/or models. The optical metrology data library can comprise pairs of simulated diffraction signals and corresponding set of profile parameters. A detailed description of generating optical metrology data such as a library of simulated diffraction signals and a corresponding set of profile parameters is described in U.S. Pat. No. 6,943,900 which is incorporated herein by reference.

Controllers, such as 105, 115, 125, 135, or 145, can include APC, R2R, FDC, and/or RTPT procedures that can operate as control strategies, control plans, control models, and/or recipe managers to provide run-to-run (R2R) processing. For example, wafer level context matching at runtime allows for custom configuration by wafer (state, slot, waferID, lotID, etc.). In addition, feedforward and/or feedback control can be implemented by installing TCDs, and configuring control strategies, control plans, and control models to use the TCDs. A control strategy can be executed for each system process where feedforward and/or feedback control is implemented. When a system process executes, one or more of the control plans within the control strategy can be executed. Each control plan can be used to modify the recipe based on feedforward and/or feedback information.

Control and/or analysis strategies/plans can cover multiple process steps within a wafer processing sequence, and can be used to analyze the real-time and/or collected data, and establish error conditions. A procedure can be executed when a context is matched. During the execution of an analysis procedure, one or more analysis plans can be executed. A plan can create an error when a data failure occurs, an execution problem occurs, or a control problem occurs. When an error occurs, the plan can generate an alarm message; the parent strategy status can be changed to a failed status; the plan status can be changed to a failed status; and one or more messages can be sent to the alarm log and the FDC system. When a feedforward plan or a feedback plan fails, one or more of the plans in the parent strategy may be terminated, and their status can be changed to a failed status. In one case, when a defective incoming wafer, or a faulty RTO, or a defective TCD is detected, a control plan can detect and/or identify this as a fault. A data collection plan and/or analysis plan can reject the data at one or more of the measurement sites for this wafer or reject the data because a RTPT, a RTO-related and/or a TCD-related procedure fails.

In one embodiment, a feedforward and/or feedback plan failure may not terminate the strategy or other plans, and an etching and/or a measurement procedure failure may not terminate the strategy or other plans. For example, a feedforward plan can indicate a failure when a RTO and/or TCD fail. Successful plans, strategies, etching procedures, and/or measurement procedures do not create any error/alarm messages. Pre-specified failure actions for strategy and/or plan errors can be stored in a database, and can be retrieved from the database when an error occurs. Failure actions can use the nominal process recipe for this wafer or use a null process recipe for this wafer. A null recipe can be a control recipe that can be used by a processing tool and/or processing chamber to allow a wafer to pass through and/or remain in a processing chamber without processing. For example, a null recipe can be used when a process is paused or when a wafer does not require processing. When a RTO and/or TCD fail, the previous data can be used.

In some embodiments, the RTO 127 can use feedforward data received via the data transfer system 190 to tune and/or optimize an etching process. When a wafer lot is being processed by an etching subsystem 120 after being processed by a lithography subsystem 110, one or more of the wafers can be sent to a measurement subsystem 140. For example, new real-time measurement data can be created when a wafer is being measured in the measurement subsystem 140, and newly created measurement data can be fed forward in real-time from the measurement subsystem 140 to the etching subsystem 120 using formatted messages. One or more of the formatted messages from the measurement subsystem 140 can be exchanged between TCD 148 and TCD 128. The TCD 128 can process the formatted message and extract new data for the RTO 127. When new data is available, the RTO 127 in the etching subsystem 120 can either use the new data to tune and/or optimize an etching recipe, profile, and/or model currently being used for the wafer lot or RTO 127 can use the new data to tune and/or optimize an etching recipe, profile, and/or model for the next wafer lot. When the RTO 127 uses the new data to tune and/or optimize an etching recipe, an etching profile, and/or an etching model for the wafer lot currently being processed, the RTO 127 can determine if an etching recipe, an etching profile, and/or an etching model can be updated before the current wafer is processed. The current wafer is processed using the tuned and/or optimized etching recipe, profile, and/or model when the etching recipe, profile, and/or model can be updated before the current wafer is processed. The current wafer can be processed using a non-tuned and/or non-optimized etching recipe, profile, and/or model when the etching recipe cannot be updated before the current wafer is processed. When a newly tuned and/or optimized etching recipe, profile, and/or model are available, an etching subsystem and/or etching controller 125 may determine when to use the newly tuned and/or optimized etching recipe, profile, and/or model. For example, RTO 127 can use CD data, thermal data, thickness data, uniformity data, timing data, delay data, or optical properties data, or any combination thereof to tune and/or optimize an etching recipe, an etching profile, and/or an etching model.

In other embodiments, the RTO 147 can use feedforward data received via the data transfer system 190 to tune and/or optimize a measurement process. When a wafer lot is being measured by a measurement subsystem 140 after being processed by an etching subsystem 120, one or more of the wafers can be sent to a measurement subsystem 140. For example, new real-time etch processing data can be created when a wafer is being etched in the etching subsystem 120, and newly created etch processing data can be fed forward in real-time from the etching subsystem 120 to the measurement subsystem 140 using formatted messages. One or more of the formatted messages from the etching subsystem 120 can be sent from TCD 128 to TCD 148. The TCD 148 in the measurement subsystem 140 can process the formatted message and extract new data for the RTO 147. When new data is available, the RTO 147 can either use the new data to tune and/or optimize a measurement recipe, profile, and/or model currently being used for the wafer lot or RTO 147 can use the new data to tune and/or optimize a measurement recipe, profile, and/or model for the next wafer lot.

When the RTO 147 uses the new data to tune and/or optimize a measurement recipe, profile, and/or model for the wafer lot currently being processed, the RTO 147 can determine if the measurement recipe, profile, and/or model can be updated before the current wafer is measured. The current wafer can be measured using the tuned and/or optimized measurement recipe, profile, and/or model when the measurement recipe, profile, and/or model can be updated before the current wafer is measured. The current wafer can be measured using a non-tuned and/or non-optimized measurement recipe, profile, and/or model when the measurement recipe cannot be updated before the current wafer is measured. When a newly tuned and/or optimized measurement recipe, profile, and/or model are available, a measurement subsystem 140 and/or associated controller 145 may determine when to use the newly tuned and/or optimized measurement recipe, profile, and/or model. For example, RTO 147 can use CD data, thermal data, thickness data, uniformity data, or optical properties data, or any combination thereof to tune and/or optimize a measurement recipe, profile, and/or model.

The measurement subsystem 140 can measure isolated and/or nested structures at different times, and the etching subsystem 120 and/or RTO 127 can use new measurement data for isolated and/or nested structures to tune and/or optimize a process chemistry and/or process time. For example, wafer thickness or temperature can be different near isolated and/or nested structures. In addition, wafer thickness or temperature can be different near open areas and/or trench array areas.

The measurement subsystem 140 can provide measurement data for damaged layers, features, and/or structures for different wafers and/or lots, and the etching subsystem 120 and/or RTO 127 can use the measurement data for damaged layers, features, and/or structures to update, tune, and/or optimize an etching chemistry and/or etching time.

The measurement subsystem 140 can measure mask and/or photoresist features, structures, and/or thicknesses, and the etching subsystem 120 and/or RTO 127 can use new measurement data for the mask and/or the photoresist features, structures, and/or thicknesses to update, tune, and/or optimize a process recipe, a process chemistry, and/or process time. The measurement subsystem 140 can measure the etched features and use new process data from the etch process to update, tune, and/or optimize a measurement recipe.

The etching subsystem 120 can feed forward the end-point detection (EPD) times to the measurement subsystem 140 to improve the wafer film temperature or thickness computation. EPD times can also be used by RTO 127 to update, tune, and/or optimize an etching recipe, by the RTO 147 to update, tune, and/or optimize a measurement recipe and/or library selection, and RTO 127 to update, tune, and/or optimize a mask and/or photoresist model, an etching process model, and/or etching tool model.

While a wafer and/or lot is being processed, additional calculated data, simulated data, and/or measured data can be generated, and this data can be fed forward and/or fed back in real time by the processing system to update process, measurement, and/or simulation recipes before the current wafer is processes or before additional wafers in the wafer lot are processed.

When a wafer is measured before an etching process, the pre-etch measurement data can be used to narrow the search range of the post-etch measurements, and this can increase the accuracy and reduce the measurement calculation times. An expected measurement value can be fed forward based on pre-etch measurements and etch trim amount. The subsystem 110, 120, 130, and 140 can use the most up-to-date pre-processing information obtained from previously performed processes to perform new calculations.

Measurement data from subsystem 140 can include measured diffraction signals associated with patterned structures or un-patterned structures, and the diffraction signals can be stored using processing state data, and wafer, lot, recipe, site, or wafer location data. RTO data can include variables associated with patterned structure profile, metrology device type and associated variables, and ranges used for the variables floated in the modeling and values of variables that were fixed in the modeling. The library profile data, the feedforward messages, and/or data may include fixed profile parameters (such as pitch), the N and K parameters, and/or metrology device parameters (such as angle of incidence and/or azimuth angle).

In some embodiments, RTPT procedures can use measured diffraction signals, and the RTPT parameters can include recipe input information, historical data, tuning data, optimization data, library profile data, feedforward data, feedback data, and measured diffraction signal data to create, tune and/or optimize an optical metrology recipe, structure, and/or model. Feedback data can include correction data. Recipe data can include materials in the layers of the patterned and un-patterned structures in the stack. Tuning and/or optimization data can include profile parameters, material refraction parameters, and metrology device parameters that can be used to tune and/or optimize the optical metrology recipe, profile, and/or model. RTPT procedures may utilize context/identification information such as wafer ID, slot ID, lot ID, recipe, state, and patterned structure ID as a means for organizing and indexing data. Library data can include measured diffraction signals associated with devices, wafers, lots, recipes, site or wafer location, patterned and/or un-patterned structures. Metrology data can include variables associated with patterned structure profile, metrology device type and associated variables, and ranges used for the variables floated in the modeling and values of variables that were fixed in the modeling. RTPT procedures can use feedforward data and/or feedback data to determine the patterned structure profile, critical dimension, and underlying thicknesses in real time. RTPT output data can be selectively transmitted, stored, displayed, and/or transmitted to another system and/or subsystem.

Feedforward messages and/or data may include an underlying film thicknesses, CD, and/or values of one or more profile parameters of the patterned structure. The underlying film thicknesses, CD, and/or values of one or more profile parameters of the patterned structure may be used by the RTPT procedures to make real-time updates and/or corrections. The feedforward messages and/or data may include one or more CDs for a patterned structure that may be used to alter an etching recipe, measurement recipe and/or a deposition recipe. The data transmitted to the etching or measurement subsystem can comprise underlying film thicknesses, CD, and/or values of the profile parameters of the patterned structure together with identification information such as wafer identification (ID), slot ID, lot ID, recipe, and patterned structure ID to facilitate retrieval for other applications.

In addition, the RTPT procedures may create, tune, and/or optimize a library of simulated diffraction signals and the corresponding set of profile parameters. The RTPT procedures may create, tune, and/or optimize a second data set from a trained machine learning system (MLS), and the MLS may be trained with a subset of the library data. For example, values for the metrology device parameters, such as angle of incidence, may be obtained from the vendor specifications of the metrology device, and the values for azimuth angle can be obtained from the setup used in the diffraction measurement. Changed and/or updated values can be fed forward using a TCD to improve performance.

Intervention and/or judgment rules can be defined at a strategy level, a plan level, a model level, or a procedure level. Intervention and/or judgment rules can be assigned to execute whenever a matching context is encountered. When a matching context is encountered at a higher level as well as a lower level, the intervention and/or judgment rules associated with the higher level can be executed. GUI screens (not shown) can be used for defining and maintaining the intervention and/or judgment rules. Intervention and/or judgment rule definition and assignment can be controlled by the MES 180. The intervention and/or judgment rules can be for TCDs, RTOs, and/or RTPT procedures and can be maintained in a database. Documentation and help screens can be provided for the intervention and/or judgment rules.

The MES 180 can be configured to monitor some system processes, and factory level intervention and/or judgment rules can be used to determine which processes are monitored and which data can be used. In addition, factory level intervention and/or judgment rules can be used to determine how to manage the data when a process can be changed, paused, and/or stopped. In addition, the MES 180 can provide run-time configuration information and real-time update information. Data can be exchanged using GEM SECS communications protocol.

In general, rules allow system and/or tool operation to change based on the dynamic state of a semiconductor processing system and/or the processing state of a product. Some setup and/or configuration information can be determined by the processing system subsystems when they are initially configured. In addition, rules can be used to establish a control hierarchy at the system/tool level. Rules can be used to determine when a process can be paused and/or stopped, and what can be done when a process is paused and/or stopped. In addition, rules can be used to determine what corrective actions are to be performed, such as when to change a process, how to change the process, and how to manage the data.

Exemplary methods of processing a wafer can include receiving one or more wafers and associated wafer data, and establishing a processing sequence and/or a wafer state for each wafer.

The wafer state can include a sequencing state ($SQ_{n,m}$) variable that can be determined from the processing sequence, where n is the wafer number and m is the processing sequence number. For example, n and m can be integers. In some embodiments, the processing sequence may be obtained from a MES and cannot be modified. In other embodiments, a virtual (modifiable) processing sequence may be established, and the sequencing state and/or process start time can be changed by a subsystem computer and/or an operator. For example, additional sequence states altered start times may be used to establish additional measurement or etching steps, to hold wafers while measurement or etching steps are being performed, to hold wafers while calculations are being performed, to route wafers to different tools when a tool goes off-line, and/or to correct and/or analyze fault conditions. In addition, additional sequence states altered start times may be used to hold and/or re-route wafers while feedforward data and/or messages are created, processed, sent, and/or received, to hold and/or re-route wafers while tuning data and/or tuned data and/or messages are created, processed, sent, and/or received, and/or to hold and/or re-route wafers while optimization and/or optimized data and/or messages are created, processed, sent, and/or received.

For example, a wafer can be sent to a lithography subsystem 110 when the sequencing state is a first value (SQ1); a wafer can be sent to an etch subsystem 120 when the sequencing state is a second value (SQ2); a wafer can be sent to a deposition subsystem 130 when the sequencing state is a third value (SQ3); a wafer can be sent to a measurement subsystem 140 when the sequencing state is a fourth value (SQ4); a wafer can be sent to an external measurement system 150 when the sequencing state is a fifth value (SQ5); and a wafer can be sent to a transfer subsystem 160 when the sequencing state is a sixth value (SQ6). Alternatively, other configurations may be used.

In addition, the wafer state can include a tuned variable ($TV_{n,m}$), an optimized variable ($OV_{n,m}$), an updated variable ($UV_{n,m}$) a measured variable ($MV_{n,m}$), a processed variable ($PV_{n,m}$), and a delay time variable ($DTV_{n,m}$), where n is the wafer number and m is a processing sequence number. The tuned variable ($TV_{n,m}$) is a first value "true" when the wafer has been tuned and is a second value "false" when the wafer has not been tuned, the optimized variable ($OV_{n,m}$) is a first value "true" when the wafer has been optimized and is a second value "false" when the wafer has not been optimized, the updated variable ($UV_{n,m}$) is a first value "true" when the wafer has been updated and is a second value "false" when the wafer has not been updated, the measured variable ($MV_{n,m}$) is a first value "true" when the wafer has been measured and is a second value "false" when the wafer has not been measured, and the processed variable ($PV_{n,m}$) is a first value "true" when the wafer has been processed and is a second value "false" when the wafer has not been processed. A delay time variable ($DTV_{n,m}$) can be used to delay wafer sequencing, calculations, processes, and/or measurements. Alternatively, the wafer state may be characterized using different and/or additional variables.

When a feed-forward state is a first value "true", the feedforward data and/or messages can be fed forward, and when the feedforward state is a second value "false", the feedforward data and/or messages are not fed forward. When a pass-through state is a first value "true", pass-through data and/or messages can be passed through, and when the pass-through state is a second value "false", pass-through data and/or messages are not passed through.

When a RTPT state is a first value "true", a RTPT procedure can be performed, and when the RTPT state is a second value "false", a RTPT procedure is not performed. When an optimization state is a first value "true", an optimization procedure can be performed, and when the optimization state is a second value "false", an optimization procedure is not performed.

When the update state is the first value, a process can be updated using the tuned data and/or optimized data before the current wafer is processed, the current wafer can be processed using the updated process, and updated process result data can be established for the processed wafer. When the update state is the second value, a process cannot be updated using the tuned data and/or optimized data before the current wafer is processed, the current wafer is processed using a non-updated process, and non-updated process result data can be established for the processed wafer.

Input and output messages can include fault messages, response messages, error messages, feedforward messages, feedback messages, pass-through messages, internal messages, external messages, tuning messages, optimization messages, status messages, timing messages, process results messages, and/or other messages.

In various embodiments, one or more input messages can be received and/or processed by one or more subsystems (110, 120, 130, 140, and 160), by one or more controllers (105, 115, 125, 135, and 145), by one or more RTOs (117, 127, 137, and 147), or by one or more TCDs (118, 128, 138, and 148), or any combination thereof. In addition, one or more output messages can be created and/or sent by one or more subsystems (110, 120, 130, 140, and 160), by one or more controllers (105, 115, 125, 135, and 145), by one or more RTOs (117, 127, 137, and 147), or by one or more TCDs (118, 128, 138, and 148), or any combination thereof.

In addition, messages can include real-time command, calculation, and/or override information. Real-time processing and/or measurement data obtained just prior to the next process step can be fed forward and can be used before the next process is performed to delay the process, to calculate new process parameters, and to improve the process accuracy and precision. The real-time data can be passed to a processing tool as RTPT procedure variables/parameters, can be used to override current recipe data, profile, and/or model default values, to override current sequencing state data, to override current start times, and can be used to narrow the search space for determining recipes, profiles, and/or models and their associated accuracy limits.

Figure 2:
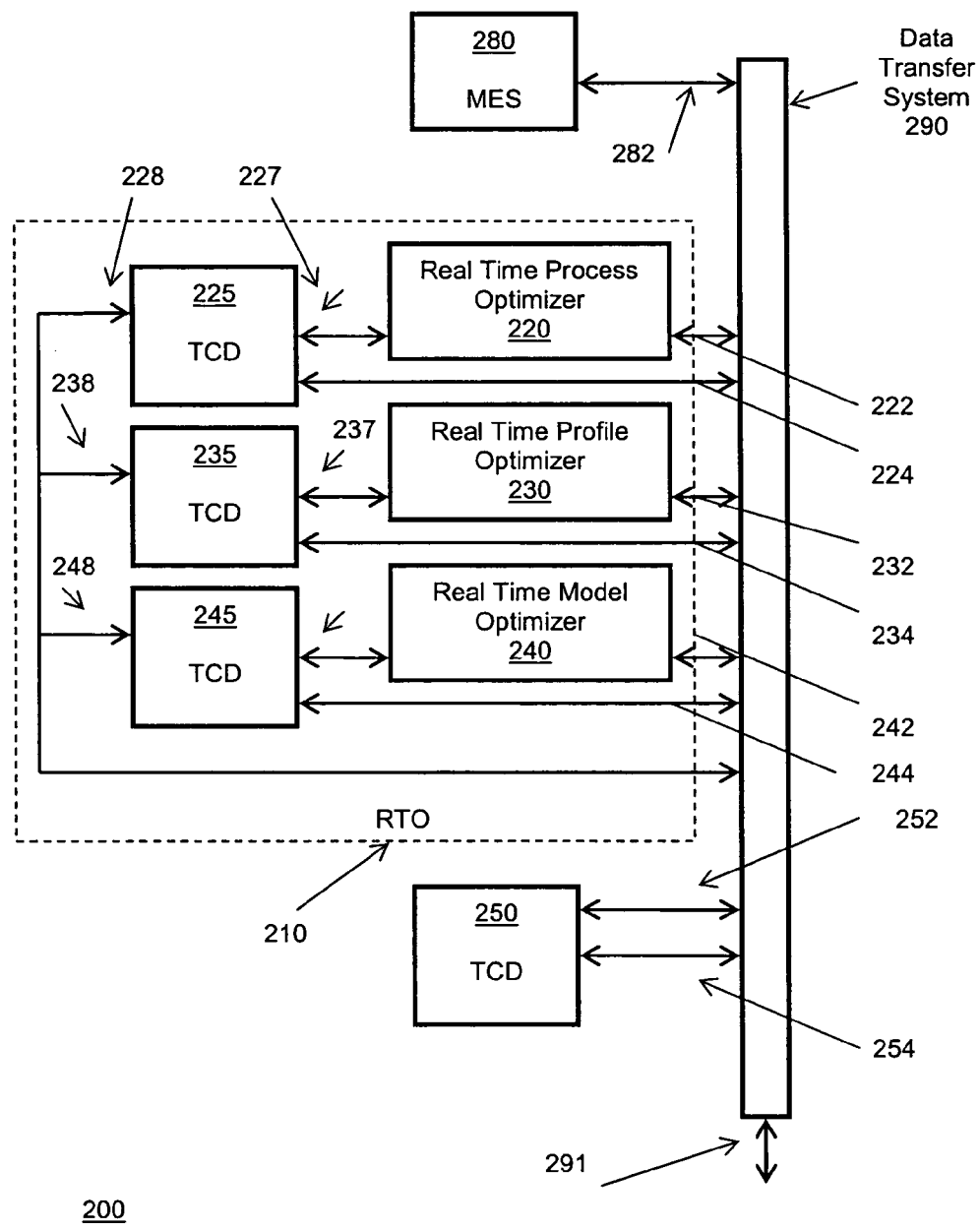
FIG. 2 illustrates an exemplary block diagram of an optimized system in accordance with embodiments of the invention.

FIG. 2 illustrates an exemplary block diagram of system in accordance with embodiments of the invention. In the illustrated embodiment, system 200 is shown comprising a Real-Time Optimizer (RTO) 210 that can include a real-time process optimizer 220, a real-time profile optimizer 230, and a real-time model optimizer 240. Alternatively, a real-time process optimizer 220, a real-time profile optimizer 230, or a real-time model optimizer 240, or any combination thereof may not be required, and/or the RTO 210 may be configured differently. One or more RTOs can be established when a system is configured and/or changed. For example, RTOs may be controlled by a MES (host) computer, by a processing system computer, and/or by a processing subsystem computer.

The real-time process optimizer 220 can be coupled 222 to a data transfer system 290, the real-time profile optimizer 230 can be coupled 232 to a data transfer system 290, and the real-time model optimizer 240 can be coupled 242 to the data transfer system 290. Alternatively, the real-time process optimizer 220, the real-time profile optimizer 230, the real-time model optimizer 240, and the data transfer system 290 may be configured and/or coupled differently. The real-time process optimizer 220, the real-time profile optimizer 230, the real-time model optimizer 240, and/or the data transfer system 290 can comprise hardware, firmware, or software, or any combination thereof. The data transfer system 290 can be coupled to other devices (not shown) using a link 291.

The RTO 210 can include a first TCD 225 that can be coupled to the data transfer system 290 using a link 228, can be coupled to the real-time process optimizer 220 using a link 227, and can be coupled 224 to the data transfer system 290. RTO 210 can include a second TCD 235 that can be coupled to the data transfer system 290 using a link 238, can be coupled to the real-time profile optimizer 230 using a link 237, and can be coupled 234 to the data transfer system 290. RTO 210 can include a third TCD 245 that can be coupled to the data transfer system 290 using a link 248, can be coupled to the real-time model optimizer 240 using a link 247, and can be coupled 244 to the data transfer system 290. The first TCD 225, the second TCD 235, and/or the third TCD 245 can comprise hardware, firmware, or software, or any combination thereof.

In various embodiments, one or more input messages can be received and/or processed by the RTO 210, and one or more output messages can be created and/or sent by the RTO 210. The RTO 210 can create internal messages that can include real-time feedforward messages and/or data. The RTO 210 can send internal messages and receive responses to the internal messages in real-time, and can send output messages, and receive responses to the output messages in real time, and can create, process, send and/or receive other messages in real time. For example, one or more real-time optimizers (220, 230, and 240) and/or one or more TCDs (225, 235, and 245) may use internal messages. In addition, internal messages can include real-time feedforward data, historical data, input data, output data, priority data, delay data, fault data, response data, error data, feedforward data, feedback data, pass-through data, internal data, external data, tuning and/or tuned data, optimization and/or optimized data, status data, timing data, process results data, and/or measured data.

The first TCD 225, the second TCD 235, and/or the third TCD 245 can receive in real-time input messages that can include real-time feedforward messages and/or real-time pass-through messages from the MES 280 and/or other devices using data transfer system 290. The first TCD 225 can process a first input message in real time and can feed forward a first real-time feedforward message to the real-time process optimizer 220 using a link 227 when the first input message includes a first real-time feedforward message. In addition, the first TCD 225 can process the first input message in real time and can pass-through a first real-time pass-through message to the data transfer system 290 using a link 224 when the first input message includes a first real-time pass-through message. The second TCD 235 can process a second input message in real time and can feedforward a second real-time feedforward message to the real-time profile optimizer 230 using a link 237 when the second input messages includes a second real-time feedforward message. In addition, the second TCD 235 can process the second input message in real time and can pass-through a second real-time pass-through message to the data transfer system 290 using a link 234 when the second input message includes a second real-time pass-through message. The third TCD 245 can process a third input message in real time and can feedforward a third real-time feedforward message to the real-time model optimizer 240 using a link 247 when the third input messages includes a third real-time feedforward message. In addition, the third TCD 245 can process the third input message in real time and can pass-through a third real-time pass-through message to the data transfer system 290 using a link 244 when the third input message includes a third real-time pass-through message.

In other embodiments, the real-time process optimizer 220, the real-time profile optimizer 230, or the real-time model optimizer 240, or any combination thereof can receive in real-time input messages that can include real-time feedforward messages and/or real-time pass-through messages from the MES 280 and/or other devices using data transfer system 290. The real-time process optimizer 220 can process a first input message in real time and can feedforward a first real-time feedforward message to the first TCD 225 using a link 227 when the first input messages includes a first real-time feedforward message. In addition, the real-time process optimizer 220 can process the first input message in real time and can pass-through a first real-time pass-through message to the data transfer system 290 using a link 222 when the first input message includes a first real-time pass-through message. The real-time profile optimizer 230 can process a second input message in real time and can feedforward a second real-time feedforward message to the second TCD 235 using a link 237 when the second input message includes a second real-time feedforward message. In addition, the real-time profile optimizer 230 can process the second input message in real time and can pass-through a second real-time pass-through message to the data transfer system 290 using a link 232 when the second input message includes a second real-time pass-through message. The real-time model optimizer 240 can process a third input message in real time and can feedforward a third real-time feedforward message to the third TCD 245 using a link 247 when the third input messages includes a third real-time feedforward message. In addition, the real-time model optimizer 240 can process the third input message in real time and can pass-through a third real-time pass-through message to the data transfer system 290 using a link 242 when the third input message includes a third real-time pass-through message. Furthermore, the real-time process optimizer 220, the real-time profile optimizer 230, or the real-time model optimizer 240, or any combination thereof can generate and send output messages in response to the input messages.

In other embodiments, the real-time process optimizer 220, the real-time profile optimizer 230, and/or the real-time model optimizer 240 can receive, process, and/or send non-optimized and/or un-tuned data in real time.

The real-time process optimizer 220 can process one or more input messages in real time and can use the tuning and/or optimization data from the one or more input messages in a tuning and/or optimization procedure thereby creating tuned and/or optimized process recipes. The real-time process optimizer 220 can feedforward one or more real-time feedforward messages to the first TCD 225 using a link 227, and the one or more real-time feedforward messages can include real-time tuned and/or optimized process recipes. In addition, the real-time process optimizer 220 can process one or more input messages in real time, can pass-through other messages to the first TCD 225 using a link 227, and/or can pass-through other messages (other than feed forward messages) to the data transfer system 290 using a link 222, when an input message includes other messages. Furthermore, the real-time process optimizer 220 can generate and send output messages in response to the input messages.

In some embodiments, the tuning and/or optimization data can include thermal or layer fabrication information. For example, the real-time process optimizer 220 can process one or more input messages in real time and can use real-time wafer thickness data, n&k data and/or real time wafer temperature data from the one or more input messages in a RTPT procedure to tune and/or optimize measurement recipe data. The real-time process optimizer 220 can feedforward one or more real-time feedforward messages to the first TCD 225 using a link 227, and the one or more real-time feedforward messages can include the real-time tuned and/or optimized measurement recipe data, and/or can pass-through other messages to the first TCD 225 using a link 227. For example, other messages may include historical, setup and/or configuration data. When the first TCD 225 receives the feedforward messages and/or other messages from the real-time process optimizer 220, the first TCD 225 can process in real time the feedforward messages and/or the other messages into feedforward messages and pass-through messages that can be sent to the MES 280 and/or other subsystems using data transfer system 290.

Alternatively, the real-time process optimizer 220 can feed forward the tuned and/or optimized measurement recipe data to the first TCD 225 using a link 227, and/or can pass-through other messages to the first TCD 225 using a link 227. When the first TCD 225 receives the tuned and/or optimized measurement recipe data from the real-time process optimizer 220, the first TCD 225 can process the tuned and/or optimized measurement recipe data into feedforward messages and pass-through messages that can be sent in real time to the MES 280 and/or other subsystems using data transfer system 290.

The real-time profile optimizer 230 can process one or more input messages in real time and can use the tuning and/or optimization data from the one or more input messages in a tuning and/or optimization procedure thereby creating tuned and/or optimized profile data. The real-time profile optimizer 230 can feedforward one or more real-time feedforward messages to the first TCD 225 using a link 227, and the one or more real-time feedforward messages can include real-time tuned and/or optimized profile data. In addition, the real-time profile optimizer 230 can process one or more input messages in real time, can pass-through other messages (messages not required by the real-time profile optimizer 230) to the second TCD 235 using a link 237, and/or can pass-through other messages to the data transfer system 290 using a link 232, when an input message includes other messages. Furthermore, the real-time profile optimizer 230 can generate and send output messages in response to the input messages.

For example, the real-time profile optimizer 230 can process one or more input messages in real time and can use real-time wafer thickness data, n&k data and/or real-time wafer temperature data from the one or more input messages in a RTPT procedure to create tuned and/or optimized profile data. The real-time profile optimizer 230 can feedforward one or more real-time feedforward messages to the second TCD 235 using a link 237, and the one or more real-time feedforward messages can include the real-time tuned and/or optimized profile data, and/or can pass-through other messages (messages not required by the real-time profile optimizer 230) to the second TCD 235 using a link 237. When the second TCD 235 receives the feedforward messages and/or other messages from the real-time process optimizer 220, the second TCD 235 can process in real time the feedforward messages and/or the other messages into feedforward messages and pass-through messages that can be sent to the MES 280 and/or other subsystems using data transfer system 290.

Alternatively, the real-time profile optimizer 230 can feed forward tuned and/or optimized profile data to the second TCD 235 using a link 237, and/or can pass-through other messages to the second TCD 235 using a link 237. When the second TCD 235 receives the tuned and/or optimized profile data from the real-time profile optimizer 230, the second TCD 235 can process the tuned and/or optimized profile data into feedforward messages and pass-through messages that can be sent in real time to the MES 280 and/or other subsystems using data transfer system 290.

The real-time model optimizer 240 can process one or more input messages in real time and can use the tuning and/or optimization data from the one or more input messages in a tuning and/or optimization procedure thereby creating tuned and/or optimized modeling data. The real-time model optimizer 240 can feedforward one or more real-time feedforward messages to the third TCD 245 using a link 247, and the one or more real-time feedforward messages can include the tuned and/or optimized modeling data. In addition, the real-time model optimizer 240 can process one or more input messages in real time, can pass-through other messages (messages not required by the real-time profile optimizer 240) to the third TCD 245 using a link 247, and/or can pass-through other messages to the data transfer system 290 using a link 232, when an input message includes other messages. Furthermore, the real-time model optimizer 240 can generate and send output messages in response to the input messages.

For example, the real-time model optimizer 240 can process one or more input messages in real time and can use real-time wafer thickness data, n&k data and/or real-time wafer temperature data from the one or more input messages in a RTPT procedure to create tuned and/or modeling data. The real-time model optimizer 240 can feedforward one or more real-time feedforward messages to the third TCD 245 using a link 247, and the one or more real-time feedforward messages can include the real-time tuned and/or optimized modeling data, and/or can pass-through other messages (messages not required by the real-time profile optimizer 240) to the third TCD 245 using a link 247. When the third TCD 245 receives the feedforward messages and/or other messages from the real-time model optimizer 240, the third TCD 245 can process in real time the feedforward messages and/or the other messages into feedforward messages and pass-through messages that can be sent to the MES 280 and/or other subsystems using data transfer system 290.

Alternatively, the real-time model optimizer 240 can feed forward tuned and/or optimized modeling data to the third TCD 245 using a link 247, and/or can pass-through other messages to the third TCD 245 using a link 247. When the third TCD 245 receives tuned and/or optimized modeling data from the real-time model optimizer 240, the third TCD 245 can process the tuned and/or optimized modeling data into feedforward messages and pass-through messages that can be sent in real time to the MES 280 and/or other subsystems using data transfer system 290.

Single TCDs 225, 235, 245 are shown, and single links 227, 237, 247, 228, 238, and 248 are shown, but this is not required for the invention. In other embodiments, any number of TCDs can be used, and any number of links can be used. Alternatively, an RTO may not include any TCDs, or TCDs can be configured outside of the RTO. Links 222, 224, 227, 228, 232, 234, 237, 238, 242, 244, 247, and 248 can be high-speed links that can be used to exchange data and/or formatted messages.

In addition, the system 200 can include another TCD 250 that can be coupled to a data transfer system 290 using a first link 252 and a second link 254. For example, the first link 252 and/or the second link 254 can be a high-speed link configured to feed forward real-time data. A single TCD 250 is shown, and single links 252, 254 are shown, but this is not required for the invention. In other embodiments, any number of TCDs can be used, and any number of links can be used.

The TCDs can be coupled in series and/or in parallel and can have one or more input ports and/or one or more output ports. TCDs can be coupled to each other and to other devices using intranet, internet, and/or wireless connections. TCDs can be connected to one or more input devices and/or output devices in one or more subsystems using the data transfer system 290. Alternatively, TCDs can be coupled directly to subsystems and/or be part of a subsystem as shown in FIG. 1. As also seen in FIG. 2, a MES 280 can be coupled 282 to a data transfer system 290.

The real-time process optimizer 220, the real-time profile optimizer 230, and/or the real-time model optimizer 240 can utilize context information such as time, wafer ID, slot ID, lot ID, recipe, and patterned structure ID as a means for organizing and indexing real-time and/or historical data.

The real-time process optimizer 220 can use wafer data, models, recipes, and profile data to tune and/or optimize a process, such as an etching process, a deposition process, a measurement process, an exposure process, a development process, a thermal process, a cleaning process, or a transfer process, or any combination thereof. The real-time process optimizer 220 can use a wafer model, an accuracy model, a recipe model, an optical properties model, a structure model, a FDC model, a prediction model, a confidence model, a measurement model, an etching model, a deposition model, a first wafer effect model, a chamber model, a tool model, a drift model, a delay time model, an electrical performance model, or a device model, or any combination thereof. In addition, the real-time process optimizer 220 can use historical data, wafer data, accuracy data, process data, optical properties data, structure data, FDC data, prediction data, confidence data, measurement data, etching data, chamber data, tool data, drift data, electrical performance data, or device data, or any combination thereof.

The real-time profile optimizer 230 can use wafer data, accuracy data, process data, optical properties data, structure data, FDC data, prediction data, confidence data, measurement data, etching data, chamber data, tool data, or drift data, or any combination thereof to estimate, enhance, tune, and/or optimize a profile, feature, structure, a pattern, a target, or a layer, or any combination thereof.

The real-time model optimizer 240 can be used to create, enhance, tune, and/or optimize a wafer model, an accuracy model, a recipe model, an optical properties model, a structure model, a FDC model, a prediction model, a confidence model, a measurement model, an etching model, a chamber model, a tool model, or a drift model, an electrical performance model, or any combination thereof.

A real-time process optimizer 220, a real-time profile optimizer 230, and/or a real-time model optimizer 240 can perform RTPT procedures using feedforward messages and/or data. The feedforward data can be updated on a within-wafer basis, on a wafer-to-wafer basis, and/or on a lot-to-lot basis. One or more RTPT parameters can be used in real time to create, enhance, tune, and/or optimize a recipe, a profile estimate, and/or model. Processing and/or material variations affecting the optical properties can change across a wafer, wafer-to-wafer, process-to-process, lot-to-lot.

The RTPT parameters can include layer information that can include wafer thermal and/or layer thickness data. For example, thickness data may be provided after a deposition process, and many current factory systems do not include procedures for communicating such information to the measurement subsystem. By feed forwarding real-time wafer temperature, layer thickness and/or other wafer characteristics data to a measurement and/or processing subsystem, improved wafer processing is provided. Material variations and/or process variations that affect the wafer temperature and/or layer thicknesses can change across a wafer, from wafer to wafer, and from lot to lot. For example, thickness variation can be due to a deposition process not being uniform across the wafer, and this can include chamber-to-chamber variations and chamber drift in processing over time. Thickness variations can cause optical property variations and/or thermal variations to occur.

In some examples, thickness or thermal variation can be due to a Chemical Vapor Deposition (CVD) or spin on process. New thickness and/or thermal data can be obtained after a CVD process, and the new thickness and/or thermal data can be obtained from a measurement process or a simulation process. In addition, thickness and/or thermal variation can be due to a Chemical Mechanical Polishing (CMP) or other polishing process. New thickness and/or thermal data can be obtained after a CMP process, and the new thickness and/or thermal data can be obtained from a measurement process or a simulation process.

In other examples, thickness and/or thermal variation can occur because of an etching and/or ashing process. New thickness and/or thermal data can be obtained after an etching and/or ashing process, and the new thickness and/or thermal data can be obtained from a measurement process or a simulation process. Film properties can change across a wafer and from wafer to wafer during the etch process when EPD (end point detection) and/or sacrificial films are used to control a bottom CD (critical dimension). The deposition and/or etching of a film can change the optical properties, thermal properties and/or physical properties.

The RTO 210 can use real-time wafer thickness and/or temperature data to create tuned lithography data when the RTPT state is the first value, and the sequencing state is the first value (SQ1); can use real-time wafer thickness and/or temperature data to create optimized lithography data when the optimization state is the first value, and the sequencing state is the first value (SQ1); can feed forward the tuned lithography data and/or the optimized lithography data when the feedforward state is the first value; and/or can pass-through the tuned lithography data and/or the optimized lithography data when the pass-through state is the first value. The tuned lithography data can include tuned recipe data, tuned profile data, or tuned modeling data, or any combination thereof. The optimized lithography data can include optimized recipe data, optimized profile data, or optimized modeling data, or any combination thereof.

When the wafer is sent to the lithography subsystem, the wafer can be processed by the lithography subsystem using the tuned lithography data and/or optimized lithography data when the update state is the first value, and updated lithography process result data can be established for the processed wafer. The wafer can be processed using non-updated procedures when the update state is the second value, and non-updated process result data can be established for the processed wafer. For example, when the update state is the first value, the tuned lithography data and/or the optimized lithography data can be used by the lithography subsystem to update a procedure before the wafer is processed and the current wafer can be processed by the lithography subsystem using the updated procedure, and when the update state is the second value, the tuned lithography data and/or the optimized lithography data cannot be used by the lithography subsystem to update a procedure before the wafer is processed by the lithography subsystem and the wafer can be processed using a non-updated procedure.

The RTO 210 can use real-time wafer thickness, temperature and/or n&k data to create tuned etching data when the RTPT state is the first value, and the sequencing state is the second value (SQ2); can use real-time wafer thickness, temperature and/or n&k data to create optimized etching data when the optimization state is the first value, and the sequencing state is the second value (SQ2); can feed forward the tuned etching data and/or the optimized etching data when the feedforward state is the first value; and/or can pass-through the tuned etching data and/or the optimized etching data when the pass-through state is the first value. The tuned etching data can include tuned recipe data, tuned profile data, or tuned modeling data, or any combination thereof. The optimized etching data can include optimized recipe data, optimized profile data, or optimized modeling data, or any combination thereof.

When the wafer is sent to the etching subsystem, the wafer can be processed by the etching subsystem using the tuned etching data and/or optimized etching data when the update state is the first value, and updated process result data can be established for the processed wafer. The wafer can be processed using non-updated procedures when the update state is the second value, and non-updated process result data can be established for the processed wafer. For example, when the update state is the first value, the tuned etching data and/or the optimized etching data can be used by the etching subsystem to update a procedure before the wafer is processed and the current wafer can be processed by the etching subsystem using the updated procedure, and when the update state is the second value, the tuned etching data and/or the optimized etching data cannot be used by the etching subsystem to update a procedure before the wafer is processed by the etching subsystem and the wafer can be processed using a non-updated procedure.

The RTO 210 can use real-time wafer thickness, temperature and/or n&k data to create tuned deposition data when the RTPT state is the first value, and the sequencing state is the third value (SQ3); can use real-time wafer thickness, temperature and/or n&k data to create optimized deposition data when the optimization state is the first value, and the sequencing state is the third value (SQ3); can feed forward the tuned deposition data and/or the optimized deposition data when the feedforward state is the first value; and/or can pass-through the tuned deposition data and/or the optimized deposition data when the pass-through state is the first value. The tuned deposition data can include tuned recipe data, tuned profile data, or tuned modeling data, or any combination thereof. The optimized deposition data can include optimized recipe data, optimized profile data, or optimized modeling data, or any combination thereof.

When the wafer is sent to the deposition subsystem, the wafer can be processed by the deposition subsystem using the tuned deposition data and/or optimized deposition data when the update state is the first value, and updated deposition data can be established for the processed wafer. The wafer can be processed using non-updated procedures when the update state is the second value, and non-updated measurement data can be established for the measured wafer. For example, when the update state is the first value, the tuned deposition data and/or the optimized deposition data can be used by the deposition subsystem to update a procedure before the wafer is processed and the current wafer can be processed by the deposition subsystem using the updated procedure, and when the update state is the second value, the tuned deposition data and/or the optimized deposition data cannot be used by the deposition subsystem to update a procedure before the wafer is processed by the deposition subsystem and the wafer can be processed using a non-updated procedure.

The RTO 210 can use real-time wafer thickness, temperature and/or n&k data to create tuned measurement data when the RTPT state is the first value, and the sequencing state is the fourth value (SQ4); can use real-time wafer thickness, temperature and/or n&k data to create optimized measurement data when the optimization state is the first value, and the sequencing state is the fourth value (SQ4); can feed forward the tuned measurement data and/or the optimized measurement data when the feedforward state is the first value; and/or can pass-through the tuned measurement data and/or the optimized measurement data when the pass-through state is the first value. The tuned measurement data can include tuned recipe data, tuned profile data, or tuned modeling data, or any combination thereof. The optimized measurement data can include optimized recipe data, optimized profile data, or optimized modeling data, or any combination thereof.

When the wafer is sent to the measurement subsystem, the wafer can be measured by the measurement subsystem using the tuned measurement data and/or optimized measurement data when the update state is the first value, and updated measurement data can be established for the measured wafer. The wafer can be measured using non-updated procedures when the update state is the second value, and non-updated measurement data can be established for the measured wafer. For example, when the update state is the first value, the tuned measurement data and/or the optimized measurement data can be used by the measurement subsystem to update a procedure before the wafer is measured and the current wafer can be measured by the measurement subsystem using the updated procedure, and when the update state is the second value, the tuned measurement data and/or the optimized measurement data cannot be used by the measurement subsystem to update a procedure before the wafer is measured by the measurement subsystem and the wafer can be measured using a non-updated procedure.

The RTO 210 can use real-time wafer thickness, temperature and/or n&k data to create tuned external measurement data when the RTPT state is the first value, and the sequencing state is the fifth value (SQ5); can use real-time wafer thickness, temperature and/or n&k data to create optimized external measurement data when the optimization state is the first value, and the sequencing state is the fifth value (SQ5); can feedforward the tuned external measurement data and/or the optimized external measurement data when the feedforward state is the first value; and/or can pass-through the tuned external measurement data and/or the optimized external measurement data when the pass-through state is the first value. The tuned external measurement data can include tuned recipe data, tuned profile data, or tuned modeling data, or any combination thereof. The optimized external measurement data can include optimized recipe data, optimized profile data, or optimized modeling data, or any combination thereof.

When the wafer is sent to the external measurement subsystem, the wafer can be measured by the external measurement subsystem using the tuned external measurement data and/or optimized external measurement data when the update state is the first value, and updated external measurement data can be established for the measured wafer. The wafer can be measured using non-updated procedures when the update state is the second value, and non-updated external measurement data can be established for the measured wafer. For example, when the update state is the first value, the tuned external measurement data and/or the optimized external measurement data can be used by the external measurement subsystem to update a procedure before the wafer is measured and the current wafer can be measured by the external measurement subsystem using the updated procedure, and when the update state is the second value, the tuned external measurement data and/or the optimized external measurement data cannot be used by the external measurement subsystem to update a procedure before the wafer is measured by the external measurement subsystem and the wafer can be measured using a non-updated procedure.

The RTO 210 can use real-time wafer thickness, temperature and/or n&k data to create tuned alignment data when the RTPT state is the first value, and the sequencing state is the sixth value (SQ6); can use real-time wafer thickness, temperature and/or n&k data to create optimized alignment data when the optimization state is the first value, and the sequencing state is the sixth value (SQ6); can feedforward the tuned alignment data and/or the optimized alignment data when the feedforward state is the first value; and/or can pass-through the tuned alignment data and/or the optimized alignment data when the pass-through state is the first value. The tuned alignment data can include tuned recipe data, tuned profile data, or tuned modeling data, or any combination thereof. The optimized alignment data can include optimized recipe data, optimized profile data, or optimized modeling data, or any combination thereof.

Alternatively, a wafer can be stored temporally in the transfer subsystem 160 when the sequencing state is the sixth value (SQ6) and when delay time is required or an error has occurred. In addition, a wafer can be stored temporally in another subsystem when delay time is required or an error has occurred. For example, short delay times may be used to allow more time for feedforward messages and/or data to be created, processed, sent, and/or received.

When the wafer is sent to the transfer subsystem, the wafer can be processed by the transfer subsystem using the tuned alignment data and/or optimized alignment data when the update state is the first value, and updated process result data can be established for the processed wafer. The wafer can be processed using non-updated procedures when the update state is the second value, and non-updated process result data can be established for the processed wafer. For example, when the update state is the first value, the tuned alignment data and/or the optimized alignment data can be used by the transfer subsystem to update a procedure before the wafer is processed and the current wafer can be processed by the transfer subsystem using the updated procedure, and when the update state is the second value, the tuned alignment data and/or the optimized alignment data cannot be used by the transfer subsystem to update a procedure before the wafer is processed by the transfer subsystem and the wafer can be processed using a non-updated procedure.

The MES can collect data including measured, processing, historical, and real-time data, can establish the wafer state, and can create and send output messages that can include real-time feedforward messages and/or data. Alternatively, a subsystem can collect data including set-up data, configuration data, historical data, input data, output data, priority data, delay data, fault data, response data, error data, feedforward data, feedback data, pass-through data, internal data, external data, tuning and/or tuned data, optimization and/or optimized data, status data, timing data, process results data, and/or measured data, can change the wafer state, and can create real-time feedforward messages and/or data.

A transfer subsystem (160 FIG. 1) can be used to receive and/or store a plurality of wafers. A controller can be used to select a wafer from the plurality of wafers, and the controller can use wafer state data and the processing sequence data from the MES.

Formatted messages can be parsed to create the output messages, the internal messages, or the real-time feedforward messages. For example, a TCD can parse the formatted message, can remove data targeted for the etching subsystem, and can reconstruct a message compatible with the processing system.

The real-time wafer data and/or process data can include bottom CD data, middle CD data, top CD data, or angle data, or any combination thereof and the processing system can comprise an etching tool and the etching tool uses the real-time wafer state and/or process state data to determine an etching time to use when etching a deep trench on the wafer, to determine an etching time to use when etching a dual damascene structure on the wafer, to determine an etching time to use when etching a gate structure on the wafer.

A RTO and/or TCD can be coupled to another TCD, to another RTO, an external processing tool, or an external measurement tool, or any combination thereof. A RTO and/or TCD can be used to translate from XML to SML, or from SML to XML, or any combination thereof.

Furthermore, one or more of the TCDs (225, 235, and 245) in the RTO 210 can generate and send output messages in response to the input messages.

The RTPT parameters can include layer or thermal information. In some embodiments, the RTPT parameters can include real-time wafer thickness, temperature and/or n&k data. In one example, real-time wafer thickness and uniformity data may be provided to a measurement subsystem after a developing process. Material variations and/or process variations that occur during and/or after the development process can affect the layer or thermal properties and can change across a wafer, wafer-to-wafer, process-to-process, lot-to-lot. In a second example, real-time wafer thickness and uniformity data may be provided to a measurement subsystem after an etching process. Material variations and/or process variations that occur during and/or after the etching process can affect the physical properties and can change across a wafer, wafer-to-wafer, process-to-process, lot-to-lot. In another example, real-time wafer thickness and uniformity data may be provided to a measurement subsystem after a deposition process. Material variations and/or process variations that occur during and/or after the deposition process can affect the wafer temperature, thickness and/or uniformity and can change across a wafer, wafer-to-wafer, process-to-process, lot-to-lot.

For example, many current factory systems do not include procedures for communicating wafer layer thickness or thermal information to the measurement subsystem after the wafer is processed. Layer thickness or thermal variations caused by a wafer process may not be uniform across the wafer, due to, for example, chamber-to-chamber variations, processing times, processing chemistries, and chamber drift over time.

The new thickness data may be used by a real-time process optimizer 220 to update, tune, and/or optimize an etching recipe by using the thickness variations to establish new etching times and/or re-prioritize the end-point timing. The new thickness data may be used by a real-time profile optimizer 230 to reduce a search range associated with profile specific etching recipes and improve the accuracy of the etching process. The new thickness data may be used by a real-time model optimizer 240 to update an etching and/or chamber model by over-riding the current and/or default model values.

Real-time data from material processing procedures obtained just prior to the next process step can be fed forward and can be used before the next process is performed to calculate new process parameters to improve the process accuracy and precision. The real-time data can be passed to a processing tool as RTPT procedure variables/parameters, can be used to override current recipe, profile, and/or model default values, and can be used to narrow the search space for determining recipes, profiles, and/or models and their associated accuracy limits.

When the sequencing state is the first value (SQ1), a wafer can be sent to a lithography subsystem 110, and process data that can include real-time wafer thickness, temperature and/or n&k data can be obtained when a wafer is being processed. Some of the process data from the lithography subsystem can be fed forward to one or more other subsystems that will perform subsequent processes.

RTO 210 can be used to prevent the feedforward messages and/or data from being sent until the recipient is ready to use the feedforward messages and/or data. In one example, before messages and/or data are sent, the recipient can be sent test messages, and the recipient can send back response messages that can include status data. In other examples, the RTO can wait a pre-determined length of time, or can obtain delay time data from a response message.

Delay time variables can be used to delay wafers, calculations, processes, and/or measurements. For example, delay times can be used to prevent feedforward data from arriving before it can be used by calculations, processes, and/or measurements for the current wafer. Delay times can be determined by a wafer state, a sequencing state, a MES, a controller, and/or a subsystem. Delay time variables can be used by one or more of the real-time optimizers (220, 230, and/or 240), and/or one or more of the TCDs (225, 235, and 245) in the RTO 210.

One or more RTOs can be configured inside or outside the measurement subsystem and/or the processing subsystem. For example, when a RTO is separated from a subsystem, a feedforward state value can be used to control the inputs to the RTO and an update state value can be used to control the outputs from the RTO to the subsystem. For example, when the feedforward state is the first value, a RTPT and/or optimized procedure can be created before the wafer is processed, and when the feedforward state is the second value, the processing procedure cannot be tuned and/or optimized before the wafer is processed. When the feedforward state is the first value, tuning data and/or optimization data can be fed forward to the RTO before the wafer is processed, and when the feedforward state is the second value, the tuning and/or optimization data cannot be fed forward to the RTO before the wafer is processed. When the update state is the first value, the tuned and/or optimized data created by the RTO can be fed forward from the RTO to the subsystem and can be used to process the wafer, and when update state is the second value the tuned and/or optimized data cannot be used to process the wafer.

Some procedures can include processing the wafer using an optimized processing when the optimization state is the first value; identifying the processed wafer as an optimized wafer by changing the wafer state for the wafer; and identifying processing data associated with the optimized wafer as optimized processing data. In addition, the wafer can be processed using a non-optimized processing procedure when the optimization state is a second value; the processed wafer can be identified as a non-optimized wafer by changing the wafer state for the wafer; and the processing data associated with the non-optimized wafer can be identified as non-optimized processing data.

The wafer can be processed using a tuned processing procedure when the RTPT state is the first value; the processed wafer can be identified as a tuned wafer by changing the wafer state for the wafer; and the processing data associated with the tuned wafer can be identified as tuned processing data. The wafer can be processed using an un-tuned processing procedure when the RTPT state is the second value; the processed wafer can be identified as an un-tuned wafer by changing the wafer state for the wafer; and the processing data associated with the un-tuned wafer can be identified as un-tuned processing data.

In some examples, an input message can be a formatted message comprising recipe data and feedforward data. A TCD can process the formatted message and create a separate recipe message for the processing tool and a separate feedforward message for the measurement tool. For example, the TCD can parse the formatted message. When the TCD is operating in a "Feed Forward" mode, a separate recipe message may or may not be sent to the processing tool, and a separate feedforward message can be sent to a measurement tool. The feedforward message can include real-time wafer thickness, temperature and/or n&k data that can be used to determine in real-time which profile library to use when analyzing information from the measurement tool. When real-time wafer thickness, temperature and/or n&k data is provided to a metrology tool, the calculation errors can be reduced and the accuracy is improved. In some cases, a smaller profile space within a library space can be identified using the feedforward data. For example, the feedforward thickness data allows the ODP procedure to determine profiles from the profile library in real-time, thereby decreasing measurement time and increasing throughput.

Figure 3:
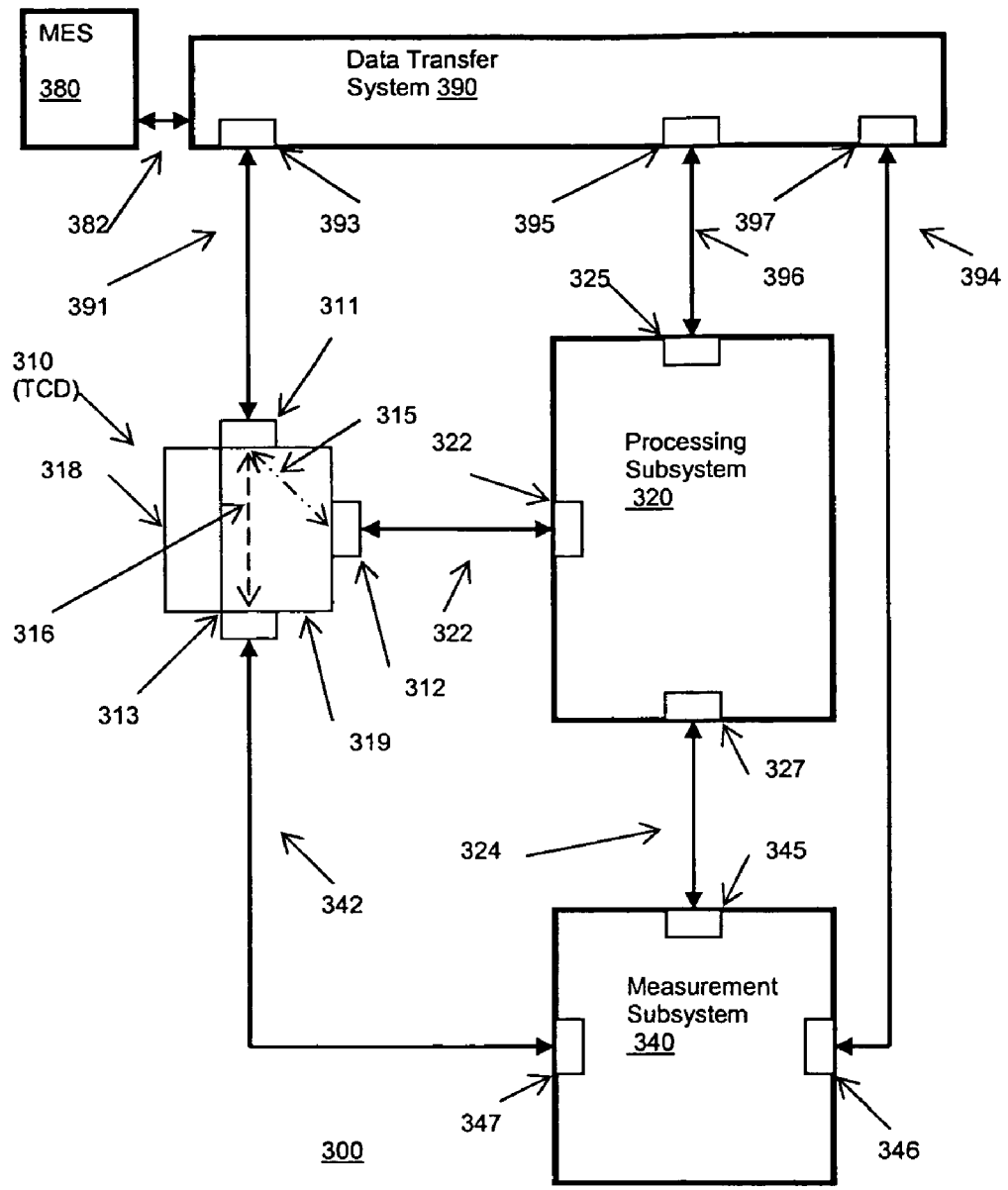
FIG. 3 illustrates a schematic representation of a Transparent Coupling Device (TCD) in accordance with embodiments of the invention.

FIG. 3 illustrates a schematic representation of a Transparent Coupling Device (TCD) in accordance with embodiments of the invention. In the illustrated embodiment, a semiconductor processing system 300 is shown that includes a data transfer system 390, a MES system 380, a processing subsystem 320, a measurement subsystem 340, and a TCD 310. In addition, multiple devices and/or systems can be included. Alternatively, other systems, other devices, other elements, and/or other systems may be included.

The data transfer system 390 can be coupled to one or more processing subsystems 320 and can exchange information with the processing subsystem 320 using one or more bi-directional links 396 and one or more ports (395, 325). Alternatively, a port and/or a bi-directional link may not be required. For example, link 396 can support XML and/or SECS-GEM messages and data transfers. In addition, other transfer protocols can be supported. A processing subsystem 320 can be part of an integrated semiconductor processing system 300 or be external to a semiconductor processing system.

The data transfer system 390 can be coupled to one or more measurement subsystems 340 and can exchange information with the measurement subsystem 340 using one or more bi-directional links 394 and one or more ports (397, 346). Alternatively, a port and/or a bi-directional link may not be required. For example, link 394 can support XML and/or SECS-GEM messages and data transfers. In addition, other transfer protocols can be supported. A measurement subsystem 340 can be part of an integrated semiconductor processing system 300 or be external to the semiconductor processing system 300.

The MES 380 can be coupled to the data transfer system 390 using one or more bi-directional links 382.

The one or more processing subsystems 320 can be coupled to one or more measurement subsystems 340 and these subsystems can exchange information with each other using one or more bi-directional links 324 and one or more ports (327, 345). Alternatively, a port and/or a bi-directional link may not be required. For example, link 324 can support XML and/or SECS-GEM messages and data transfers. In addition, other transfer protocols can be supported. For example, a processing system 320 can include one or more subsystems such as subsystems (110, 120, 130, 140, and 150, FIG. 1). Alternatively, other configurations may be used.

The data transfer system 390 can be coupled to one or more TCDs 310 and can exchange information with the TCD 310 using one or more bi-directional links 391 and one or more ports (311, 393). Alternatively, a port and/or a bi-directional link may not be required. For example, link 391 can support XML and/or SECS-GEM messages and data transfers. In addition, other transfer protocols can be supported. A TCD 310 can be integrated into a semiconductor processing system 300 in a variety of ways or can be external to the semiconductor processing system 300.

One or more TCDs 310 can be coupled to one or more processing subsystems 320 can exchange information with the one or more processing subsystems 320 using one or more bi-directional links 322 and one or more ports (312, 323). Alternatively, a port and/or a bi-directional link may not be required. For example, link 322 can support XML and/or SECS-GEM messages and data transfers. In addition, other transfer protocols can be supported.

In addition, one or more TCDs 310 can be coupled to one or more measurement subsystems 340, and can exchange information with the one or more measurement subsystems 340 using one or more bi-directional links 342 and one or more ports (313, 347). Alternatively, a port and/or a bi-directional link may not be required. For example, link 342 can support XML and/or SCS-GEM messages and data transfers. In addition, other transfer protocols can be supported.

TCD 310 can comprise a controller 318 and a message handler 319 that can perform message-processing procedures for receiving, building, parsing, sending, splitting, combining, and/or routing messages and other data items. The message handler 319 can comprise a first port 311, a second port 312, and a third port 313. Alternatively, a different number of ports may be used.

In one embodiment, a first path 315 can be established between the first port 311 and the second port 312, and a second path 316 can be established between the first port 341 and the third port 343, and one or more input messages can be received at port 311.

In some embodiments, TCD 311 can receive one or more input messages that can include one or more feedforward messages and one or more pass-through messages. Alternatively, the input messages can include other messages and/or data. TCD 311 can process the input messages, and can send one or more output messages. The output messages include feedforward messages and/or pass-through messages. Alternatively, the output messages can include other messages and/or data. TCD 311 can feed forward one or more feedforward messages when the input message includes a feedforward message, and/or can pass through a pass-through message when the input message includes a pass-through message.

In some examples, the first path 315 can be used for transferring messages and/or data between the MES 380 and the processing system 320. The second path 316 can be used for transferring messages and/or data between the MES 380 and the measurement subsystem 340. For example, the first path 315 is established when a first TCD enablement parameter is a first value ("true"), and the first path 315 is not established when the first TCD enablement parameter is a second value ("false"). In addition, the second path 316 is established when a second TCD enablement parameter is a first value ("true"), and the second path 316 is not established when the second TCD enablement parameter is a second value ("false"). Alternatively, other logic may be used.

In a first mode, a first TCD enablement parameter can be the first value ("true"), a first path 315 can be established through the TCD, the TCD can send one or more output messages to the processing subsystem 320 using link 322, and can receive one or more input (response) messages from the processing subsystem 320 using link 322. The second TCD enablement parameter can be the first value ("true"), a second path 316 can be established through the TCD, the TCD can send one or more output messages to the measurement subsystem 340 using link 342, and can receive one or more input (response) messages from the measurement subsystem 340 using link 342.

In some examples, the first TCD enablement parameter can be the first value when the pass-through state is the first value ("pass-thru"), and/or when the input message includes a pass-through message. TCD 311 can use the first path 315 to pass through the pass-through message to the processing subsystem 320 using link 322 and can receive one or more response messages from the processing subsystem 320 using link 322. In addition, the second TCD enablement parameter can be the first value when the feed-forward state is the first value ("feed-forward"), and/or when the input message includes a feed-forward message. TCD 311 can use the second path 316 to feed forward the feed-forward message to the measurement subsystem 340 using link 342 and can receive one or more response messages from the measurement subsystem 340 using link 342.

In other examples, the first TCD enablement parameter can be the first value when the feed-forward state is the first value ("feed-forward"), and/or when the input message includes a feed-forward message. TCD 311 can use the first path 315 to feed forward the feed-forward message to the processing subsystem using link 322, and can receive one or more response messages from the processing subsystem 320 using link 322. In addition, the second TCD enablement parameter can be the first value when the pass-through state is the first value ("pass-thru"), and/or when the input message includes a pass-through message. TCD 311 can use the second path 316 to pass through the pass-through message to the measurement subsystem 340 using link 342, and can receive one or more response messages from the measurement subsystem 340 using link 342.

Alternatively, the first TCD enablement parameter and the second TCD enablement parameter can be the first value when the feed-forward state is the first value ("feed-forward"), and/or when the input message includes a feed-forward message. TCD 311 can feed forward the feed-forward message to processing subsystem 320 and/or the measurement subsystem 340 and can receive one or more input (response) messages from processing subsystem 320 and/or the measurement subsystem 340. In addition, the first TCD enablement parameter and the second TCD enablement parameter can be the first value when the pass-through state is the first value ("pass-thru"), and/or when the input message includes a pass-through message. TCD 311 can pass through the pass-through message to processing subsystem 320 and/or the measurement subsystem 340 and can receive one or more input (response) messages from processing subsystem 320 and/or the measurement subsystem 340.

In other cases, a first TCD enablement parameter can be the first value ("true"), a first path 315 can be established through the TCD, and the TCD can send one or more output messages to the processing subsystem 320 using link 322, and receive one or more input (response) messages from the processing subsystem 320 using link 322. The second TCD enablement parameter can be the second value ("false"), a second path 316 is not established through the TCD, and the TCD does not send one or more output messages to the measurement subsystem 340 via port 313. For example, the first TCD enablement parameter can be the first value when the pass-through state is the first value, and/or when the input message includes a pass-through message. TCD 311 can use the first path 315 to pass through the pass-through message to the processing subsystem using link 322, and can receive one or more response messages from the processing subsystem 320 using link 322. In addition, the second TCD enablement parameter can be the second value when the feedforward state is the second value ("do not feed forward"), and/or when the input message does not include a feedforward message. TCD 311 does not feed forward a feedforward message to the measurement subsystem 340.

Alternatively, the first TCD enablement parameter can be the first value when the feedforward state is the first value ("feedforward"), and/or when the input message includes a feedforward message. TCD 311 can use the first path 315 to feed forward the feedforward message to the processing subsystem using link 322, and can receive one or more response messages from the processing subsystem 320 using link 322. In addition, the second TCD enablement parameter can be the second value when the pass-through state is the second value ("do not pass-thru"), and/or when the input message does not include a pass-through message. TCD 311 does not pass through a pass-through message to the measurement subsystem 340.

In additional cases, a first TCD enablement parameter can be the second value ("false"), a first path 315 is not established through the TCD, and the TCD does not send one or more output messages to the processing subsystem 320 using port 312. The second TCD enablement parameter can be the first value ("true"), a second path 316 can be established through the TCD, and the TCD can send one or more output messages to the measurement subsystem 340 using link 342, and receive one or more response messages from the measurement subsystem 340 using link 342. For example, the first TCD enablement parameter can be the second value when the pass-through state is the second value ("do not pass-thru"), and/or when the input message does not include a pass-through message. TCD 311 does not pass through a pass-through message to the processing subsystem via port 312. In addition, the second TCD enablement parameter can be the first value when the feedforward state is a first value ("feed forward"), and/or when the input message includes a feedforward message. TCD 311 can use the second path 316 to feed forward the feedforward message to the measurement subsystem 340 using link 342, and can receive one or more response messages from the measurement subsystem 340 using link 342.

Alternatively, the first TCD enablement parameter can be the second value when the feedforward state is the second value ("do not feed forward"), and/or when the input message does not include a feedforward message. TCD 311 does not feed forward a feedforward message to the processing subsystem. In addition, the second TCD enablement parameter can be the first value when the pass-through state is the first value ("pass-thru"), and/or when the input message includes a pass-through message. TCD 311 can use the second path 316 to pass through the pass-through message to the measurement subsystem 340 using link 343, and can receive one or more response messages from the measurement subsystem 340 using link 342.

In still other cases, a first TCD enablement parameter can be the second value ("false"), the first path 315 is not established through the TCD, and the TCD does not send one or more output messages to the processing subsystem 320 using port 312. The second TCD enablement parameter can be the second value ("false"), the second path 316 is not established through the TCD, and the TCD does not send one or more output messages to the measurement subsystem 340 via port 313. For example, the first TCD enablement parameter can be the second value when the pass-through state is the second value ("do not pass-thru", and/or when the input message does not include a pass-through message. TCD 311 does not use the first path 315 to pass through the pass-through message to the processing subsystem. In addition, the second TCD enablement parameter can be the second value when the feedforward state is the second value ("do not feed forward"), and/or when the input message does not include a feedforward message. TCD 311 does not use the second path 316 to feed forward the feedforward message to the measurement subsystem 340 via port 313.

Alternatively, the first TCD enablement parameter can be the second value when the feedforward state is the second value ("do not feed forward"), and/or when the input message does not include a feedforward message. TCD 311 does not use the first path 315 to feed forward the feedforward message to the processing subsystem. In addition, the second TCD enablement parameter can be the second value when the pass-through state is the second value ("do not pass-thru"), and/or when the input message does not include a pass-through message. TCD 311 does not use the second path 316 to pass through the pass-through message to the measurement subsystem 340.

In FIG. 3, single subsystems are shown, and alternatively, a different number of processing subsystems having any number of controllers associated with them in addition to other types of processing tools and modules may be used. The processing subsystem 320 can include one or more etch tools, deposition tools, ALD tools, measurement tools, ionizations tools, polishing tools, coating tools, developing tools, cleaning tools, exposure tools, and thermal treatment tools.

The processing subsystem 320, the measurement subsystem 340, or the TCD 310 can include GUI components (not shown) and can include memory components (not shown) that can include one or more computer-readable storage media. In addition, the processing subsystem 320, the measurement subsystem 340, or the TCD 310 can exchange information using one or more computer-readable storage media. Operational data, process data, library data, historical data, and/or computer executable code can be stored and/or used.

In addition, before, during, and/or after data collection, an analysis strategy can be executed, and FDC (fault detection and classification), judgment, and/or intervention plans can be executed. When an analysis strategy is executed, wafer data, process data, module data, TCD-related data, RTO-related data, and/or RTPT-related data can be analyzed, and alarm/fault conditions can be identified. In addition, when judgment and/or intervention rules are associated with TCD-related procedures, RTO-related procedures, and/or RTPT-related procedures, they can be executed. For example, after TCD-related data, RTO-related data, and/or RTPT-related data have been created, the data can be analyzed using intervention and/or judgment rule evaluation techniques. Intervention and/or judgment rule evaluation procedures and/or limits can be performed based on historical data, on the customer's experience, or process knowledge, or obtained from a host computer.

As feature sizes decrease below the 65 nm node accurate measurement data becomes more important and more difficult to obtain. RTPT procedures can be used to more accurately etch and measure these ultra-small features. The TCD-related data can be compared with the warning and/or control limits, and when a run-rule is violated, an alarm can be generated, indicating a processing problem.

When an alarm is generated, a controller can perform notification procedures and/or intervention procedures. Notification can be via e-mail or by an e-mail activated pager. An intervention procedure can be used to pause and/or stop a process at the end of the current lot, or after the current wafer. A controller can identify the processing module and/or procedure that caused the alarm to be generated. An intervention procedure can cause a wafer and/or process to proceed using non-updated recipes and/or data.

The processing subsystem 320, the measurement subsystem 340, or the TCD 310 can include FDC procedures, and they can exchange FDC information with each other and/or the MES 380. Rules can be used in FDC procedures to determine how to respond to alarm conditions, error conditions, fault conditions, and/or warning conditions. In addition, the MES 380 can send command and/or override information to the processing system 320, the measurement subsystem 340, or the TCD 310, or any combination thereof. One or more FDC procedures can be running at the same time and can send and/or receive information concerning an alarm/error/fault condition. FDC information can be exchanged via a network, e-mail, or personal communication devices. For example, an alarm/error/fault condition can be established, and a message can be sent to pause the current process or to stop the current process when a limit is reached or exceeded, or when a product requirement is not met, or when a corrective action is required. The FDC procedures can prioritize and/or classify faults, predict system performance, predict preventative maintenance schedules, decrease maintenance downtime, and extend the service life of consumable parts in the system. The interfaces to the RTPT and/or FDC procedures can be web-enabled, can provide a real-time status display, and can be used for real-time intervention.

The processing subsystem 320, the measurement subsystem 340, or the TCD 310 can control multiple processing procedures and/or models that are executed at the same time and are subject to different sets of process constraints. For example, a controller can run in three different modes: simulation mode, test mode, and standard mode. A controller can operate in simulation mode in parallel with the other modes. RTPT procedures can be run in real-time and produce real-time data, and FDC procedures can be run in real-time and produce real-time faults and/or errors. In addition, RTPT procedures can be run in a simulation mode and produce real-time simulation data, and FDC procedures can be run in a simulation mode and produce real-time predicted faults and/or errors.

The processing subsystem 320, the measurement subsystem 340, or the TCD 310 can take various actions in response to an alarm/fault, depending on the nature of the alarm/fault. The actions taken on the alarm/fault can be context-based, and the context can be specified by a rule, a system/process recipe, a module type, module identification number, load port number, cassette number, lot number, control job ID, process job ID, slot number and/or the type of data.

The processing subsystem 320, the measurement subsystem 340, or the TCD 310 can exchange information with each other and/or with the MES 380. The information can include measurement data, process data, historical data, feed-forward data, and/or feedback data. Furthermore, the MES 380 and/or the data transfer system 390 can be used to provide external measurement data, such as external CD SEM (critical dimension scanning electron microscope) information, TEM (transmission electron microscope) information, or FIB (focused ion beam) information. External information can include adjustment factors and timestamp data that can be used to adjust for any offset between the system measurement tools and the external measurement tools. In addition, the TCD can feed forward external measurement data as soon as the data is provided by the MES 380, or another optical metrology tool to the TCD 310.

One or more simulation applications can be used to compute predicted data for the wafer based on the input state, the process characteristics, and a process model. Tuned and/or optimized metrology models can be used to predict and/or calculate the smaller structures and/or features associated with the design nodes below 65 nm. An etch rate model can be used along with a processing time to compute an etch depth, and a deposition rate model can be used along with a processing time to compute a deposition thickness. For example, models can include process chemistry models, chamber models, EM models, SPC charts, PLS models, PCA models, FDC models, and Multivariate Analysis (MVA) models. For example, a TCD, a RTO, and/or a RTPT procedure can operate in a simulation mode, a test mode, and a standard mode.

The MES 380 can create and provide wafer sampling sequences, and the wafer slot selection can be determined using a (PJ Create) function. The R2R control configuration can include, among other variables, feedforward control plan variables, feedback control plan variables, metrology calibration parameters, control limits, and SEMI Standard variable parameters. Metrology data reports can include wafer, site, structure, and composition data, among others, and the tool can report actual settings for the wafer The measurement subsystem 340 can include one or more iODP systems (not shown). For example, ODP techniques can be used to obtain critical dimension (CD) information, structure profile information, or via profile information, and the wavelength ranges for an ODP system can range from less than 200 nm to more than 900 nm.

Recipes can be organized in a tree structure that can comprise recipe sets, classes, and recipes that can be displayed as objects. Recipes can include process recipe data, system recipe data, and IM recipe data. IM recipes can contain pattern recognition information, can be used to identify the sites and/or chips to sample on each wafer, and can be used to determine which ODP recipe to use. ODP recipes can be used to determine which ODP library to use, and to define the measurement metrics to report, such as top CD, bottom CD, side wall angle (SWA), layer thickness, trench width, trench depth, and goodness of fit (GOF) data.

As the physical dimensions of the structures decrease, real-time processing using feedforward data may be required for a large percentage of the wafers to obtain more accurate etching and/or measurement data. In addition, some wafers may be used to verify a new process and/or to assess an existing process. One or more measurement procedures can be performed. When a new process is being developed and/or verified, the process results can be varying, and an assessment or verification procedure can be performed on a larger percentage of the wafers. When an assessment or verification procedure is performed a TCD can be used.

A measurement strategy can be executed and used to establish when and how to use a measurement site. A strategy can be specified by a semiconductor manufacturer based on data stored in a historical database. For example, a semiconductor manufacturer may have historically chosen a number of sites on the wafer when making SEM measurements and would like to correlate the metrology data to the data measured using a SEM tool. In this case, the TCD could be used to feedforward data for those sites. Other manufacturers can use TEM and/or FIB data. In addition, the number of measurement sites used can be reduced as the manufacturer becomes more confident that the process is and will continue to produce high quality devices. Alternatively, other measurement procedures and/or other measurement sites may be used.

When new and/or additional metrology data is required, optical metrology measurements can be made at one or more sites on the wafer. In one embodiment, the feedforward data can include measured data from an un-patterned area adjacent to the patterned structure, measured data from an un-patterned area that is not adjacent to the patterned structure, measured data from a test area of the same wafer, or in an area of a test wafer. In some embodiments, the feedforward data can be used for all of the sites on the wafer, or can be used for the whole lot of wafers, or can be used for a whole process run. For example, previous layer thickness data may be used for calculations until new feedforward data is obtained from the TCD.

Measurement structures and/or features can include periodic gratings, periodic arrays, and/or other periodic structures on a wafer and can be measured at one or more of the measurement sites on a wafer. Measurement structures and/or features on a wafer may be in a resist layer, or in an ARC layer, or in any combination thereof. In addition, the measurement structures and/or features on a wafer may be created using a resist layer, or an ARC layer, or any combination thereof.

A measurement procedure can be time consuming and can affect the throughput of a processing system. During process runs, a manufacturer may wish to minimize the amount of time used to measure a wafer. The measurement procedure can be context driven and different RTPT and/or optimization procedures may be performed based on the context of the wafer. For example, one or more wafers may not be measured, tuned, and/or optimized, and procedures may be performed using a subset of measurement sites included in a measurement plan.

During a development portion of the semiconductor process, historical data can be created and stored for later use. The historical data can include measured data at a number of measurement sites. Before, during, and/or after a procedure is performed, prediction data can be created and/or modified. The new prediction data can be fed forward by a TCD to update the calculations, models, and/or results. Before, during, and/or after a procedure is performed, confidence data can be created and/or modified. The new confidence data can be fed forward by a TCD to update the calculations, models, and/or results. The confidence data can include confidence values for the measured data, the predicted data, the modeling data, and/or the process data.

The historical data can include GOF data, thermal data, thickness data, via-related data, CD data, CD profile data, material related data, trench-related data, sidewall angle data, differential width data, or any combination thereof. The measurement data can also include site result data, site number data, CD measurement flag data, number of measurement sites data, coordinate X data, and coordinate Y data, among others.

RTPT procedures can be used by an etching subsystem to adjust etching recipes and/or models in real-time to etch three-dimensional structures, such as dual-damascene structures, contacts, vias, and gates. In addition, RTPT procedures can be used by measurement subsystems to adjust process and/or measurement recipes and/or models in real-time to measure three-dimensional structures, such as contacts, vias, and gates. The three-dimensional structures can increase the sensitivity of thickness variations and require structure modeling and/or measurements in multiple directions. Measurement subsystems can cause through-put problems and higher measurement throughput can be obtained by adjusting the sampling locations, and structures dynamically.

In a semiconductor processing system, multiple processing and/or measurement tools can be present and tool matching can be a critical issue. In some cases, data from integrated metrology tools must be matched with data from external and/or reference metrology tools. RTPT procedures can be used for metrology data matching between tools and can be used to create the calibration adjustments needed by a measurement subsystem. These adjustments can be made as R2R calculations, and can be reported to the host.

RTPT procedures can update an etching or measurement recipe, profile, and/or model using data for different thickness, different temperatures, different sites, different wafers, different tools, and/or different processes. The data can include average values, limit values, tolerance values, within-wafer variation values, wafer-to-wafer variation values, and/or lot-to-lot variation values. For example, the data can include a wafer thickness variation from center to edge after an etching process, after a deposition process, development process, or a thermal process.

In addition, variations in etch EPD times can cause wafer thickness or temperature variations that can be fed forward to a measurement subsystem. The measurement subsystem can use X&Y measurement maps for dynamic measurements. In some instances, a gate etch process can damage the high K material and nitride layer causing a change in the wafer thickness or temperature and film optical properties.

RTPT procedures can use single or multiple tuning variables. When multiple variables are used a classification system can be used to establish which tuning variable should be calculated first.

TABLE 1

| Site # | External (μm) X | External (μm) Y | Internal (μm) X | Internal (μm) Y |
|---|---|---|---|---|
| 1 | −2650 | −41550 | 26093 | 131721 |
| 2 | −2650 | 2130 | −105484 | 66149 |
| 3 | −68450 | 2130 | −39693 | 88017 |
| 4 | −35550 | −107070 | 59023 | 66212 |
| 5 | 63150 | −85230 | 124821 | 66235 |
| 6 | 63150 | 67650 | 59045 | 687 |
| 7 | 30250 | 133170 | −6759 | 668 |
| 8 | −85205 | 13160 | −72561 | 642 |
| 9 | −68450 | 13160 | −138341 | −43014 |
| 10 | −52855 | 13160 | −6745 | −43014 |
| 11 | −52855 | −7920 | 91956 | −42986 |
| 12 | −68450 | −7920 | 59069 | −86675 |
| 13 | −85205 | −7920 | −39625 | −108545 |

Table 1 shows the X&Y coordinates for 13 exemplary measurement sites used by an external metrology tool (second and third column), and the X&Y coordinates for 13 measurement sites used by an internal metrology tool (fourth and fifth column). In some examples, the RTPT procedures can use the real-time wafer thickness, temperature and/or n&k data that is fed forward after a process as a tuning variable. Wafer thickness differences can occur when measurements are made using internal tools and external tools, and the differences can change over time. RTPT procedures can use the data from an internal and/or external metrology tool, and can be used to relate the data from one tool to another tool.

For example, RTPT procedures may be used to tune and/or optimize downloaded metrology information or default data in an iODP application, to set or fix ODP model parameters such as wafer thickness or temperature, material properties, and/or optical properties that change with thickness and/or time, to tune and/or optimize recipes, profiles, and/or models with minimal impact to the host software, to extend the current variable parameter adjust message to include a list of parameter names and values by site and by wafer, and use an open-ended list to allow for flexibility of adding new parameters.

During RTPT procedures, calculated data and/or predicted data can be fed forward to narrow search ranges, to increase the accuracy of processes and/or measurements, and to reduce process and/or measurement times.

RTPT procedures can be used with systems, subsystems, tools, and/or sensors. RTPT parameters can be structured as system level objects, tool level objects, lot level objects, wafer level objects, site level objects, optimization objects, and/or tuning objects.

When TCDs are created, one or more message types can be used, such as Connect messages, Return messages, setMeasurementParameters messages. onTuningStatusChangeRequest Event messages, tuningStatusChanged messages, SECS-GEM messages, and XML messages.

The TCD can support a connect message that can be used to initiate communications between a server interface and a client. The TCD can support a Return message to the primary message. The primary message can be initiated by the client and the Return made by the server. For example, if the server does not recognize the client version number or the client's version is incompatible with server, the version can be deemed incompatible. If an incompatible version is provided, an error will be returned in the HResult.

The TCD can support a setMeasurementParameters message that can be used to allow the client to send Tuning parameters to the controller at any point in time. The TCD can support a Return message to the primary message. The primary message shall be initiated by the client and the Return made by the server. The setMeasurementParameters message can be used to allow the client to send tuning parameter values for a particular wafer that may be used later for grating measurements on that wafer. For example, the message can contain a list of the tuning parameter values for multiple sites in the wafer. Each site can be identified by the site co-ordinates.

The TCD can support a message and/or event sent from a controller to a TCD. The TCD can support an on TuningStatusChangeRequest event that can be sent by the controller. When the tuningEnabledStatus parameter is false, the tuning mechanism can be disabled. When the tuningEnabledStatus parameter is true, the tuning mechanism can be enabled.

The TCD can support a message and/or event sent from TCD to an iODP application. For example, the TCD can support a tuningStatusChanged message that can be called by a TCD procedure, and this message can be sent whenever the tuning mechanism status in the TCD is changed.

The TCD can support XML translations, and SECS-GEM—XML Mapping. For example, an ODP parameter extracted out of the Host SECS Message can be converted 'as is' into the correct XML representation. The XML interface may have its own exception handling.

The TCD can support process job and control job creation. Multiple jobs can be executed in parallel, and a job can have multiple states, such as "queued", "selected", and "executing".

For some SECS messages between the host and the tool, standard SECS exception handling and timeouts can apply. The normal case is that both systems sent its reply message in time to the TCD. Possible exceptions are the following:

The metrology tool and/or controller are responding late.
The metrology tool and/or controller are not responding at all.
The metrology subsystem and/or controller are responding late.
The metrology subsystem and/or controller are not responding at all.

When messages do not arrive at the correct time from the metrology tool and/or controller, a TCD procedure can assign a unique error code, such as "No Reply from metrology tool" or "No Reply from metrology controller". When a tool is not replying, the TCD can be programmed not to take any action, and allow the host to perform the recovery operation. Alternatively, the TCD may send a return code (non-response) message to the host, and allow the host to perform the recovery operation.

The TCD can support multiple measurement sites, multiple layers, and X & Y values for multiple sites. For example, a TCD can pass film thickness data for three layers from a factory host to the metrology tool for pre and post DTMO (deep trench mask open) measurements.

In various embodiments, windows sockets can be used to send data. During startup, a Create Socket procedure can be performed to create a socket object; a Connect Socket procedure can be performed to connect to the socket using the created socket object; and a XML Logical Connect procedure can be performed to send the XML connect message.

A Send XML Tuning Message Data procedure can be performed to send the XML tuning message, [e.g. send (sock, . . . , TuningMessage)]. An XML Receive Acknowledgment procedure can be performed to receive the acknowledgement from a controller [e.g. bytesRcvd=recv(sock, . . . , recdata)].

The TCD can support many unique structures that can be defined in SML or XML, can support substantially large structures, can support nested recursive structures, can enable automatic translation from SML to XML and XML back to SML, and can support a large number of parameters. The parameters can be related to wafer state information and can include passing location information, measurement information, design information, chip layout information, library limits, and ranges for searching. A measurement subsystem can have one or more connection ports that can be used to allow the host to communicate directly or through a TCD using XML or SML.

An XML message can be unique to the device or a SEMI standard such as the PCS standard that enables APC applications to communicate with each other can be used to transform standard SML to XML/PCS messages. The TCD procedures can provide an automatic translation from SML to XML and XML back to SML for reply messages. Alternatively, other combinations of SML and XML may be included.

Additional communication protocols can include an Ethernet based message structure such as SML or XML and hardware based message structures such as RS232, RS422 and Analog signal.

The TCD software and hardware can be used to provide a substantially transparent addition of a device to a process tool or measurement tool—enabling the factory to adjust the device recipe settings. The device can be a sensor, measurement device, or an analysis device. The parsing of the variable parameter message—such as a S6F11 message is transparent to the tool. The feedforward information targeted for the metrology tool is removed, and the message can be reconstructed to be compatible to the target tool.

Multiple TCDs can be cascaded together, and this can allow one TCD to be used for parsing information being downloaded to the tool while another TCD is used to merge data for reporting to the host from multiple devices.

The TCD can provide and manage exception handling with messages that are being split or parsed for multiple devices. The confirmation replies from multiple devices can be consolidated. For example, one success message can be sent if all are successful, and one failure message can be sent if any fails. In other cases, when multiple devices have a failure, a return error can be sent for the device with the highest priority. Alternatively, a report with multiple failures may include merged the error text and priority information from all failed devices into one error text string.

One or more TCD procedures can be used to enable two way communications for downloading parameters or recipes, for uploading data or recipes, and for handshaking. Host can query the tools, controllers, and/or TCD procedures for current status and configuration. TCD procedures can be used to communicate with multiple devices on the tool by separating the unique parameters for each device and by distributing the information to each device. For example, parameters can be sent to the controllers, processing tools, metrology tools, OES tools, RF sensors, endpoint detectors, temperature sensors, and depth sensors.

One or more TCD procedures can be used to split downloaded message content one to many; can be used to route downloaded feedforward messages and recipe messages to different devices; can be used with multiple messages by sending one to many and merging many back to one; can be used to create a new message or event from any device and insert this message into the common data steam back to the host.

In addition, a TCD procedure can be part of a host procedure, an additional hardware adapter between a host computer and a tool computer, part of the tool host interface, or part of one of the devices added to the tool. The TCD can be physical or virtual—part of software module and routing the messages to different devices on the common Ethernet network.

Figure 4:
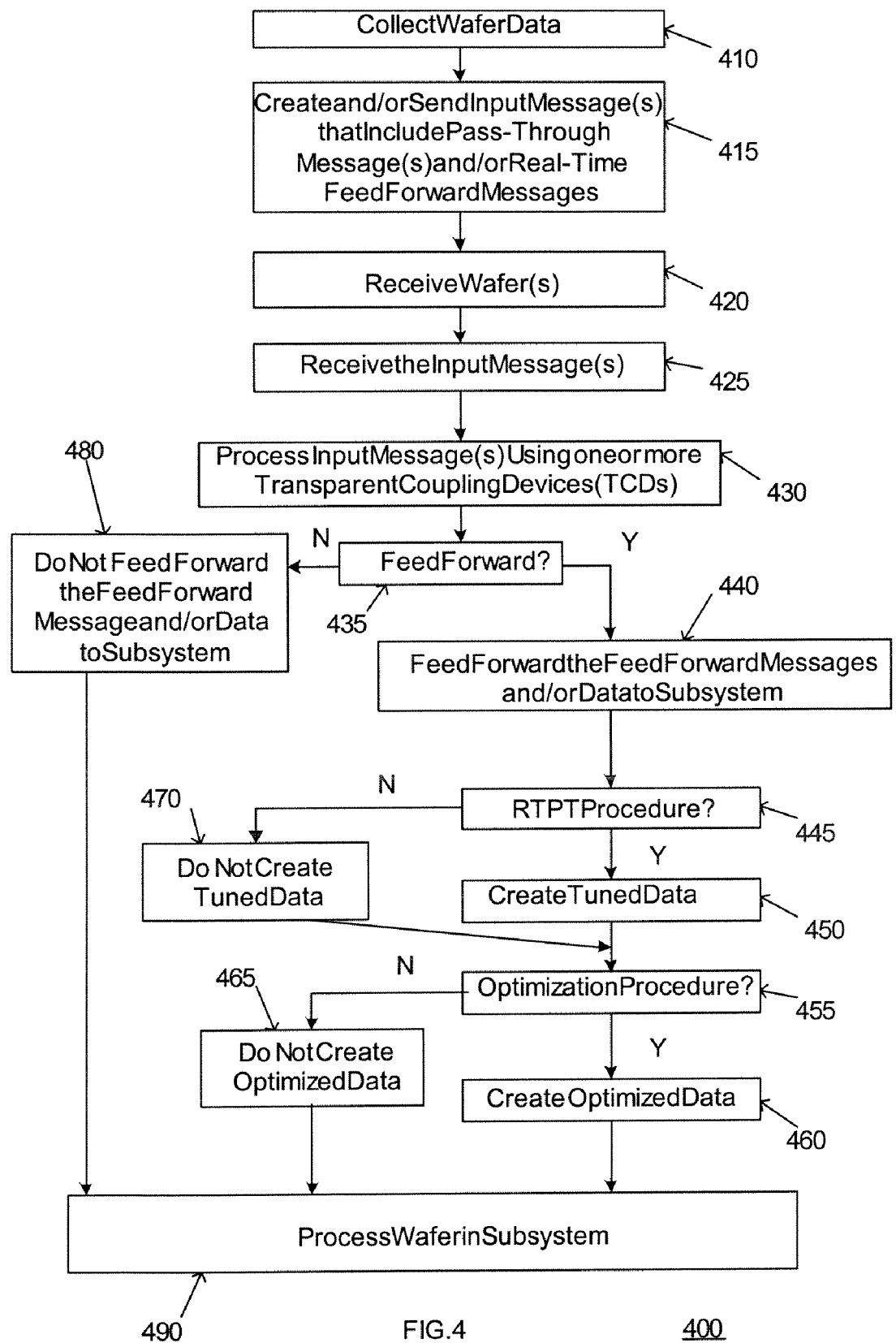
FIG. 4 illustrates an exemplary flow diagram of a procedure for processing a wafer in accordance with embodiments of the invention.

FIG. 4 illustrates an exemplary flow diagram of a procedure for processing a wafer in accordance with embodiments of the invention. In the illustrated embodiment, an exemplary procedure 400 is shown for using a Transparent Coupling Device (TCD) to process a wafer. Alternatively, other procedures and subsystems may be used.

In 410, wafer data such as wafer thickness and/or temperature can be collected. Data collection procedures can be performed before and/or while wafers are being etched by an etching subsystem processed by a deposition subsystem, measuring system or any other system. Data can be collected using a processing subsystem, a (MES), and/or host system. The collected data can include wafer data relating to a characteristic of the wafer or process data relating to a process associated with the wafer. The collected data can be real-time data from one or more processing tools and one or more metrology tools, for example. Data can also be collected using a database and/or library coupled to one or more processing tools and/or one or more metrology tools. In one example, data collected in step 410 includes layer or film thickness data collected from an etch subsystem. The thickness data may be thickness of an etched film that is calculated in the etch system based on etch rate, etch time, end point detection or other raw data available from the etch process. Alternatively, the collected data may be the raw etch data that can be sent to other subsystems for processing.

In 415, one or more input messages can be created and/or sent by a host (MES), subsystem, or system controller based on the collected data. The input message can include one or more pass-through messages and/or one or more real-time feedforward messages. A host (MES) system and/or a subsystem can process the collected data to create the input message, and can send the input message to a measurement subsystem and/or a processing subsystem. An input message may also be created, modified, and/or sent by a subsystem and/or system controller. In a preferred embodiment data collection step 410 is continuously performed for all subsystems and the collected data is continuously processed to create input messages that are sent to any or all subsystems to provide the most current information available (real-time data) to facilitate efficient and accurate performance of processing in the subsystem.

In 420, one or more wafers can be received in a subsystem. Wafer data relating to the wafer may be received at the subsystem prior to or after receipt of the wafer. For example, a wafer lot can be received and a processing sequence can be established, a current wafer can be identified and can be sent to the etching subsystem, and a wafer state can be established for the current wafer. The wafer data can include historical and/or real-time wafer thickness or wafer temperature data. In one embodiment, the wafers are received at a measurement subsystem such as that described herein.

In 425, a TCD in or associated with the subsystem that received the current wafer can receive one or more input messages created and sent in step 415. Continuing with the example above, the input message is received by a TCD associated with the measurement subsystem. An input message can include a pass-through message, or a real-time feedforward message, or any combination thereof. The pass-through message can include set-up data, configuration data, historical data, input data, output data, priority data, delay data, fault data, response data, error data, feedforward data, feedback data, pass-through data, internal data, external data, tuning and/or tuned data, optimization and/or optimized data, status data, timing data, process results data, and/or measured data. The real-time feedforward message can include real-time process data, measured data or wafer data such as real-time temperature data, thickness data, n&k data, and/or uniformity data.

In 430, the TCD associated with the subsystem that received the wafer and input message can process one or more input messages and can obtain real-time wafer data such as wafer temperature and/or thickness data from the real-time feedforward message when at least one input message includes a real-time feedforward message. For example, the TCD can process the one or more input messages in real time into one or more pass-through messages and one or more real-time feedforward messages. The TCD can parse the real-time feedforward message to obtain the real-time wafer temperature and/or thickness data. The TCD can examine the input message to determine when the input message includes the real-time feedforward message, and/or the TCD can determine how to extract the real-time feedforward message. Continuing with the example given above, in step 430 the TCD associated with the measurement subsystem can receive an input message and process the message to obtain the thickness data collected from the etch subsystem and provided as part of a feedforward message.

In addition, one or more TCDs associated with the subsystem that received the wafer and input message can process the one or more input messages and can obtain real-time and/or historical data from the pass-through message when at least one input message includes a pass-through message. Where the subsystem is the measurement subsystem, the pass-through data may include a measurement recipe. In some instances, real-time data associated with a current wafer being processed by a particular subsystem will be included in a pass-through message. For example, delayed data from a previous process and/or another subsystem may be used as real-time pass-through data. The TCD can parse the pass-through message to obtain the real-time data and/or historical data. The TCD can examine the input message to determine when the input message includes the real-time and/or historical data, and/or the TCD can determine how to extract the real-time and/or historical data. For example, when the pass-through state is the first value "true", the pass-through the messages, the real-time data, and/or the historical data can be passed through, and when the pass-through state is a second value "false", the pass-through messages, the real-time data, and/or the historical data may not be passed through.

In 435, a query can be performed to determine when to feed forward the feedforward message and/or data to the subsystem associated with the TCD. Continuing with the example given above, the TCD associated with the measurement subsystem can determine whether the feedforward message/data including the thickness data from the etch tool can be sent to the measurement subsystem. The TCD can use the feedforward state value to determine when to feed forward the feedforward message and/or data present in the input message. When the feedforward state is the first value "true", procedure 400 can branch to 440, and the feedforward messages and/or data can be fed forward. When the feedforward state is a second value "false", procedure 400 can branch to 480, and the feedforward messages and/or data are not fed forward to the subsystem such as the measurement subsystem, as will be further described below.

In 440, the feedforward messages and/or data can be fed forward to the intended subsystem such as the measurement subsystem. When the feedforward state is the first value "true", the feedforward messages and/or data can be fed forward, and when the feedforward state is a second value "false", the feedforward messages and/or data are not fed forward. In addition, the feedforward messages and/or data can be fed forward when the input message includes feedforward messages and/or data, and the feedforward data and/or messages are not fed forward when the input message does not include feedforward messages and/or data. For example, real-time wafer thickness, temperature, and/or n&k data from the etch subsystem can be fed forward to the measurement subsystem when the feedforward state is the first value "true" (and there is a feedforward message/data to forward), and the real-time wafer thickness, temperature and/or n&k data is not fed forward when the feedforward state is the second value "false.

In some embodiments, the feedforward state can be determined using timing data related to a process performed in the subsystem that the feedforward message/data will be sent to. In the measurement subsystem example, the feedforward state can be the first value when the feedforward message and/or data can be fed forward before the current wafer is measured, and the feedforward state can be the second value when the feedforward message and/or data cannot be fed forward before the current wafer is measured. In addition, the feed-forward state can be the first value when the measurement procedure and/or calculation is delayed until the feedforward message and/or data is received, and the feed-forward state can be the second value when the measurement procedure and/or calculation cannot be delayed.

In 445, the feedforward messages and/or data are not fed forward when the feedforward state is a second value "false", or when the input message does not include a feedforward message/data. Where the feedforward data is intended for the measurement subsystem, for example, the feedforward state can be the second value when the feedforward message and/or data cannot be fed forward before the current wafer is measured. Where feedforward data is not sent to the intended subsystem, the subsystem (or a processor related thereto) cannot create a tuned or optimization procedure for use in the subsystem. Thus, the process 400 branches from 445 to 490, where the wafer is processed in the subsystem without tuned or optimized procedures.

Where feedforward message/data is obtained from the input message and fed forward to the intended subsystem, then the feedforward data can be used to tune or optimize a process performed in the subsystem as shown in steps 450-475 of FIG. 4, described below. For example, thickness data from the etch tool can be used to tune or optimize a measurement process in the measurement subsystem. For example, the tuning and optimizing procedure can be performed in a processor of the TCD and sent to the measurement subsystem, performed in an RTO and then sent to the measurement subsystem, or performed in the measurement subsystem itself based on feedforward messages/data received in the measurement subsystem.

In 450, a query can be performed to determine when to perform a RTPT procedure using the feedforward message and/or data. When a RTPT state is the first value "true", procedure 400 can branch to 455, and when the RTPT state is a second value "false", procedure 400 can branch to 460. In one example, a controller in the measurement subsystem can use a RTPT state value to determine when to perform a RTPT procedure using the feedforward message and/or data present in the input message. When a RTPT state is the first value "true", one or more RTPT procedures can be performed, and when the RTPT state is a second value "false", a RTPT procedure is not performed, In 455, tuned data can be created using one or more RTPT procedures. One or more RTPT procedures can be performed when the input message includes feedforward messages and/or tuning data. Continuing with the etch and measurement example above, thickness data from the etch subsystem can be used in an RTPT procedure to create tuned data such as a tuned measurement procedure that can be used to improve measurements in the measurement subsystem. As another example, real-time wafer thickness, temperature and/or n&k data obtained from a previous deposition process can be fed forward and can be used as tuning parameter data in one or more RTPT procedures for an etch process. In some embodiments, a tuned etching recipe, a tuned etching profile, or a tuned etching model, or any combination thereof can be created using the RTPT procedures that use the real-time feedforward data (e.g., wafer thickness data) as tuning data when feedforward data is available before the wafer is etched. The tuned etching recipe, the tuned etching profile, or the tuned etching model, or any combination thereof can be created when the RTPT state is the first value. The tuned etching recipe, the tuned etching profile, or the tuned etching model, or any combination thereof is not created when the RTPT state is the second value. In some examples, an un-tuned etching recipe, an un-tuned etching profile, or an un-tuned etching model, or any combination thereof can be created when the RTPT state is the second value. Tuned etching recipe data, tuned etching profile data, or tuned etching model data, or any combination thereof can be sent to the etching subsystem when it is created elsewhere.

The MES can send pass-through messages and/or data to one or more controllers in the measurement subsystem when a wafer lot begins. The pass-through messages and/or data can be passed through to the measurement subsystem using one or more TCDs. The wafers and the associated wafer data can be identified and/or stored using lotID, SlotID, waferID, siteID, toolID, chamberID, or PJ, any combination thereof. For example, a TCD associated with a PAS computer and/or server may be used to receive and/or process pass-through messages and/or data.

The MES can send feed-forward messages and/or data to a controller in the measurement subsystem when a wafer lot begins. The feed-forward messages and/or data can be fed forward in real time to the measurement subsystem using one or more TCDs. The feed-forward and/or pass-through messages can be identified and/or stored using lotID, SlotID, waferID, siteID, toolID, chamberID, or PJ, any combination thereof. For example, a TCD associated with a PAS computer and/or server may be used to receive and/or process feed-forward messages and/or data.

Real-time wafer temperature or thickness data can be fed forward to one or more controllers associated with the measurement subsystem. RTPT procedures can be performed by the metrology tool and/or by one or more controllers associated with the metrology tool using the wafer temperature or thickness and/or wafer temperature or thickness uniformity as the real-time tuning parameters. In addition, other temperature or thickness data can be used.

In some examples, the real-time wafer temperature or thickness can be fed forward to a controller associated with the metrology tool and can be used to determine a wafer radius and/or curvature during alignment, positioning, and/or measuring steps. For example, wafer temperature or thickness data can be updated for each measurement site on the wafer and can be used to position the optical beam at each site at the actual time of measurement. In this manner, the exact wafer state is known at time the optical spectrum is measured.

A wafer temperature or thickness model can be used to determine the actual temperature or thickness at the actual time of measurement. The wafer temperature or thickness model can be used to predict the real-time wafer temperature or thickness as a function of time and storage location. The model can also be dependent upon the location of heating and/or cooling devices. In addition, a wafer curvature model can also be updated and can be used to position the optical beam at each site at the actual time of measurement.

In other examples, the real-time wafer temperature and/or thickness can be used to calculate and/or predict the physical properties of the mask layers. As feature sizes decrease, the thickness differences or thermal expansion and/or contraction in a mask (photoresist) layer can change the feature profiles and can affect the accuracy of the optical measurements.

In still other examples, a temperature control elements can be located with the metrology tool and can be used to control the wafer temperature during optical measurements. For example, temperature control can be used to minimize the thickness variations caused by the thermal expansion and/or contraction in a mask (photoresist) layer or enhance the sensitivity at lower wavelengths.

When the wafer is transferred into the metrology tool, a start event and/or one or more messages can be received and/or processed by one or more controllers associated with the measurement subsystem. One or more recipe-related procedures can be performed to create an updated measurement recipe; one or more profile-related procedures can be performed to create updated measurement profile data; and one or more model-related procedures can be performed to create updated measurement modeling data. RTPT procedures can be used and can require that a number of variables be defined before the RTPT procedures are performed, and the RTPT variables can be determined using historical data from a database, real-time processing data, pass-through messages and/or feed-forward messages.

When the wafer is transferred into the metrology tool, an alignment procedure can be performed, and the real-time wafer temperature data can be used to align the wafer. For example, wafer temperature or thickness data can be used to predict the size and/or curvature or presence of an edge bead that can affect the alignment.

When the wafer is measured by the metrology tool, optical data can be generated. As the optical data is generated by the metrology tool, the optical data can be fed forward to one or more controllers for analysis. The optical data can include diffraction signals and/or spectra. Alternatively, the optical data may include other data. An optical data analysis procedure can require that a number of variables be defined before the procedure is performed. These variables can be determined using historical data from a database, pass-through messages or data, and/or real-time data from one or more feed-forward messages. For example, a PAS computer and/or server may be used to receive and/or analyze the optical data.

In additional examples, the real-time wafer temperature or thickness can be fed forward to a controller associated with the analysis of the optical data from the metrology tool and can be used to determine a profile library and/or a specific profile space in a profile library. One of the library parameters used to create and/or enhance a profile library can be real-time wafer temperature or thickness. For example, profile shapes and their associated simulation signals can be dependent upon wafer temperature or thickness. The wafer temperature or thickness data can be updated for each measurement site on the wafer in real-time and can be used to analyze the optical data from each site at the actual time of measurement. In addition, the real-time wafer temperature or thickness can be fed forward to a controller associated with the analysis of the optical data from the metrology tool and can be used to determine the optical properties for each site on the wafer. For example, n and/or k values can be calculated using the real-time wafer temperature or thickness.

When other RTPT procedures are performed, the real-time wafer thickness can be used to determine the position of a source and/or sensor in a measurement chamber. For example, the source and/or sensor may be position-sensitive. In addition, the real-time wafer temperature data can be used to determine the amount of energy radiated by the wafer in a measurement chamber. For example, the optical metrology tool may be temperature-sensitive.

When the optical data is analyzed, historical and/or real-time data can be used in library-based techniques, regression-based techniques, and/or machine learning techniques. For example, a diffraction signal can be compared to one or more simulation signals in a library and the real-time wafer temperature or thickness can be used to focus a search in the library or provide a starting point.

In other RTPT procedures, the real-time wafer temperature or thickness data can be used to determine a contaminant level, a contamination probability, and/or an out-gassing rate.

In addition, the real-time wafer temperature or thickness data can be used to determine when a cleaning procedure is required for the measurement chamber. A contamination model can be used to predict signal degradation as a measurement chamber becomes contaminated.

In some embodiments, wafer temperature or thickness uniformity data can be used to provide real-time wafer temperature or thickness data. For example, a wafer temperature or thickness map can be established using the wafer temperature or thickness uniformity data and can be used to determine a real-time wafer temperature or thickness for the measurement sites on the wafer.

Limits can be established for the real-time wafer temperature or thickness and can be used to establish warning, error, and/or fault conditions.

In some embodiments, the RTPT state can be determined using timing data. Where the RTPT result will be sent to the measurement subsystem, for example, the RTPT state can be the first value when the RTPT procedure can be performed before the current wafer is measured, and the RTPT state can be the second value when the RTPT procedure cannot be performed before the current wafer is measured.

In 460, tuned processing data is not created. For example, un-tuned processing data can be created using one or more un-tuned procedures. One or more un-tuned procedures can be performed when the input message does not include feed-forward messages and/or tuning data. In the measurement example developed above, an un-tuned measurement recipe, an un-tuned measurement profile, or a un-tuned measurement model, or any combination thereof can be created when the RTPT state is the second value. As another example, un-tuned etching recipe data, un-tuned etching profile data, or un-tuned etching model data, or any combination thereof can be created and/or stored when the RPTP state is the second value. The un-tuned etching recipe data, the un-tuned etching profile data, or the un-tuned etching model data, or any combination thereof can be sent to the etching subsystem if it is created elsewhere. In one embodiment, rather than creating an un-tuned procedure, step 460 may simply allow the subsystem to perform a process using a process recipe obtained from a pass through message, without any tuning thereof.

If the RTPT procedure is not performed, then the procedure 400 continues to step 460 where it is determined whether to optimize the procedure based on the feedforward message/data. This allows the optimization procedure to be performed when feedforward data is present, but the RTPT procedure is not performed. Thus, when feedforward data is present, one or both of an RTPT procedure and an optimization procedure can be performed based on such data.

In 470, a query can be performed to determine when to perform an optimization procedure using the feedforward message and/or data. When the optimization state is the first value "true", procedure 400 can branch to 475, and when the RTPT state is a second value "false", procedure 400 can branch to 480. A controller in the subsystem such as the measurement subsystem can use the optimization state value to determine when to perform an optimization procedure using the feedforward message and/or optimization data present in the input message. When the optimization state is the first value "true", one or more optimization procedures can be performed, and when the optimization state is a second value "false", an optimization procedure is not performed.

In 470, optimized data can be created using one or more optimization procedures. One or more optimization procedures can be performed when the input message includes feedforward messages and/or optimization data, and an optimization procedure may not be performed when the input message does not include feedforward messages and/or optimization data. For example, real-time wafer thickness, temperature and/or n&k data can be fed forward and can be used as tuning parameter data in one or more optimization procedures. When the feedforward state is the first value "true", the real time wafer thickness, temperature and/or n&k data is fed forward to the intended subsystem, and the real-time wafer thickness, temperature and/or n&k data is not fed forward when the feedforward state is the second value "false.

Continuing with the etch and measurement example above, thickness data from the etch subsystem can be used in an optimization procedure to create optimized data such as an optimized measurement procedure that can be used to improve measurements in the measurement subsystem. As another example, an optimized etching recipe, an optimized etching profile, or an optimized etching model, or any combination thereof can be created using the optimization procedures that use the real-time feedforward data (wafer thickness data from a previous deposition process, for example) as tuning data when feedforward data is available before the wafer is etched. The optimized etching recipe, the optimized etching profile, or the optimized etching model, or any combination thereof can be created when the optimization state is the first value. The optimized etching recipe, the optimized etching profile, or the optimized etching model, or any combination thereof is not created when the optimization state is the second value. In addition, the optimized etching recipe, the optimized etching profile, or the optimized etching model, or any combination thereof is not created when the optimization state is the second value.

In some embodiments, the optimization state can be determined using timing data. Where the RTPT result will be sent to the measurement subsystem, for example, the optimization state can be the first value when the optimization procedure can be performed before the current wafer is measured, and the optimization state can be the second value when the optimization procedure cannot be performed before the current wafer is measured. An optimized etching recipe data, an optimized etching profile data, or an optimized etching model data, or any combination thereof can be sent to the etching subsystem when it is created elsewhere.

In 480, optimized data is not created. For example, non-optimized data can be created using one or more non-optimized procedures. One or more non-optimized procedures can be performed when the input message does not include feedforward messages and/or optimization data. In the measurement example developed above, non-optimized measurement recipe, a non-optimized measurement profile, or a non-optimized measurement model, or any combination thereof can be created when the optimization state is the second value. As another example, a non-optimized etching recipe, a non-optimized etching profile, or a non-optimized etching model, or any combination thereof can be created when the optimization state is the second value. A non-optimized etching recipe data, a non-optimized etching profile data, or a non-optimized etching model data, or any combination thereof can be sent to the etching subsystem when it is created elsewhere. In one embodiment, rather than creating a non-optimized procedure, step 465 may simply allow the subsystem to perform a process using a process recipe obtained from a pass through message, without any optimization thereof.

In 490, the current wafer can be processed by the subsystem that received the wafer and the input message, using up-dated data or non-updated data. For example, updated data can include feed-forward data, tuned data, or optimized data, or any combination thereof, and non-updated data can include historical data, un-tuned data, or non-optimized data, or any combination thereof. When the wafer is processed in the subsystem using the updated, tuned, and/or optimized data, the processed wafer and the associated processing data can be identified accordingly by changing the wafer state for the wafer. When the wafer is processed in the subsystem using the non-updated, un-tuned, and/or non-optimized data, the processed wafer and the associated processing data can be identified accordingly by changing the wafer state for the wafer.

Continuing with the measurement example above, the measurement subsystem can perform a measurement of the wafer using an optimized and/or tuned measurement process that was created based on the thickness or temperature data collected from a etch subsystem. Alternatively, the etching subsystem can perform an etching process based on thickness or temperature data collected from a deposition subsystem. In a preferred embodiment, an etching process can be performed using updated data including improved measurement data provided from an optimized or tuned measurement process as described above.

Further, when a wafer is processed using updated data, the wafer and/or data associated therewith can be identified as updated. For example, when the wafer is etched in the etching subsystem using the updated recipe data, the etched wafer can be identified as an updated wafer by changing the wafer state for the wafer; and the etching (process result) data associated with the updated wafer can be identified and/or stored as updated process result (etching) data. For example, the updated etching (process result) data may include the updated recipe data and/or EPD data. When the wafer is etched in the etching subsystem using the non-updated data, the etched wafer can be identified as a non-updated wafer by changing the wafer state for the wafer; and the etching data associated with the non-updated wafer can be identified and/or stored as non-updated etching data. When the wafer is etched in the etching subsystem using the tuned data, the etched wafer can be identified as a tuned wafer by changing the wafer state for the wafer; and the etching data associated with the tuned wafer can be identified and/or stored as tuned etching data. When the wafer is etched in the etching subsystem using the un-tuned data, the etched wafer can be identified as an un-tuned wafer by changing the wafer state for the wafer; and the etching data associated with the un-tuned wafer can be identified and/or stored as un-tuned etching data. When the wafer is etched in the etching subsystem using the optimized data, the etched wafer can be identified as an optimized wafer by changing the wafer state for the wafer; and the etching data associated with the optimized wafer can be identified and/or stored as optimized etching data. When the wafer is etched in the etching subsystem using the non-optimized data, the etched wafer can be identified as a non-optimized wafer by changing the wafer state for the wafer; and the etching data associated with the non-optimized wafer can be identified and/or stored as non-optimized etching data.

The etching or measured data can also be identified as real-time feedforward data, real-time tuning data, and/or real-time optimization data for subsequent processes. Some parts of the etching or measurement data can be formatted and sent as feedforward messages and/or data, and other parts of the etching data can be formatted and sent as pass-through messages and/or data.

In addition, profile data for the etched or measured features and/or structures of the current wafer and/or lot can be created, enhanced, and/or modified in the etching or measurement subsystems respectively. When updated data is used, a new profile shape and associated profile parameters can be identified and stored as updated data elements. When tuned data is used, the profile shape and associated profile parameters can be identified and stored as tuned data elements. When optimized data is used, the profile shape and associated profile parameters can be identified and stored as optimized data elements. When non-updated data is used, the profile shape and associated profile parameters can be identified and stored as non-updated data elements. When un-tuned data is used, the profile shape and associated profile parameters can be identified and stored as un-tuned data elements. When non-optimized data is used, the profile shape and associated profile parameters can be identified and stored as non-optimized data elements.

Furthermore, modeling data for the current wafer and/or lot can be created, enhanced, and/or modified in the etching or measurement subsystem. When updated data is used, a new etching or measurement model can be identified and stored as updated modeling data. When tuned data is used, a new etching or measurement model can be identified and stored as tuned modeling data. When optimized data is used, a new etching or measurement model can be identified and stored as optimized modeling data. When non-updated data is used, a new etching or measurement model can be identified and stored as non-updated modeling data. When un-tuned data is used, a new etching or measurement model can be identified and stored as un-tuned modeling data. When non-optimized data is used, a new etching or measurement model can be identified and stored as non-optimized modeling data.

When a simulation is performed using updated, tuned, or optimized data, the simulation model and/or simulation data can be identified and/or stored accordingly.

A tuning procedure can be performed in real-time to create, modify, and/or use tuned etching or measurement recipe data, tuned etching or measurement profile data, or tuned etching or measurement model data, or any combination thereof. During a tuning procedure one or more RTPT procedures can be performed. An optimization procedure can be performed in real-time to create, modify, and/or use optimized etching or measurement recipe data, optimized etching or measurement profile data, or optimized etching or measurement model data, or any combination thereof. During an optimization procedure one or more RTPT procedures can be performed.

When an etch-related RTPT procedure is performed, for example, the real-time wafer thickness, temperature and/or n&k data and/or real-time wafer temperature data can be used to determine an etching chemistry, or an etching time, a processing gas ratio, an expected endpoint time, heater power, and/or RF power required.

When an RTPT procedure is performed, the real-time wafer thickness data, n&k data and/or real-time wafer temperature can be used to determine a wafer radius for an alignment procedure and/or a measurement procedure. For example, edge cleanliness can affect the radius. In addition, as dimensions get smaller real-time wafer temperature can have a greater impact during aligning, measuring, and/or processing. The real-time wafer thickness data, n&k data and/or real-time wafer temperature data can also be used to determine wafer curvature. Furthermore, the real-time wafer thickness data, n&k data and/or real-time wafer temperature can be used to determine the actual wafer thickness when the aligning, measuring, and/or processing occur.

In other RTPT procedures, the real-time wafer thickness data, n&k data and/or real-time wafer temperature can be used to determine a contaminant level, a contamination probability, and/or an out-gassing rate.

When other RTPT procedures are performed, the real-time wafer thickness data, n&k data and/or real-time wafer temperature can be used to determine a nozzle position during a deposition procedure, and/or a probe position during an alignment and/or measurement procedure. In addition, the real-time wafer thickness data, n&k data and/or real-time wafer temperature can be used to determine the amount of energy radiated by the wafer in an alignment and/or measurement chamber. For example, the optical system, nozzle, and/or probe used may be position-sensitive and/or temperature-sensitive.

In some RTPT procedures, the real-time wafer thickness data, n&k data and/or real-time wafer temperature can be used to determine the optical properties for the wafer and/or used to determine a calibration factor for the optical properties.

In some other RTPT procedures, the real-time wafer thickness data, n&k data and/or real-time wafer temperature can be used to determine the characteristics of a mask and/or photoresist layer. For example, wafer thickness may affect CDs and/or sidewall angles. The real-time wafer thickness data, n&k data and/or real-time wafer temperature can be altered by a thermal, an etching, ashing, and/or cleaning process.

In some additional RTPT procedures, the real-time wafer thickness data, n&k data and/or real-time wafer temperature can be used to determine the correct location for a measurement site on the wafer. In addition, the real-time wafer thickness, temperature and/or n&k data can be used to determine the actual wafer thickness when the measurement occurs. For example, cooling rates and/or delay times may be used. Delay times and/or cooling rates can be dependent on the process sequence being used.

A RTO or a controller can create real-time wafer thickness data, real time n&k data, real-time wafer temperature data, real-time tuning data, and/or real-time optimization data using the real-time feedforward message when the input message includes a real-time feedforward message. The real-time message can include feedforward data, set-up data, configuration data, historical data, input data, output data, priority data, delay data, fault data, response data, error data, feedback data, pass-through data, internal data, external data, tuning and/or tuned data, optimization and/or optimized data, status data, timing data, process results data, and/or measured data.

A RTO or a controller can feed forward real-time wafer thickness data, n&k data, real-time wafer temperature data, real-time tuning data, and/or real-time optimization data when the feedforward state is the first value, and does not feed forward the real-time wafer thickness data, n&k data, real-time tuning data, and/or real-time optimization data when the feedforward state is a second value. For example, one or more TCDs associated with the RTO may be used to feed forward the real-time wafer thickness data, real-time tuning data, and/or real-time optimization data to the measurement subsystem and/or other subsystems.

The procedure can also include collecting data using a MES, a RTO, a TCD, or a controller, the collected data including historical and real-time wafer layer data; creating real-time wafer thickness, temperature and/or n&k data; creating a formatted message comprising the real-time wafer thickness, temperature and/or n&k data; and sending the formatted message using a RTO, a TCD, or a controller.

The procedure can also include collecting data using a MES, the collected data including historical and real-time wafer temperature data; creating real-time wafer temperature data, wherein the MES processes the collected data to create the real-time wafer temperature data; creating a formatted message comprising the real-time wafer temperature data; and sending the formatted message using the MES.

The TCD can be coupled to another TCD, an external processing tool, or an external measurement tool, or any combination thereof. In addition, the TCD can be coupled to a plurality of subsystems, and the TCD can process the formatted message to create separate messages for one or more of the subsystems.

The TCD can process, separate, and/or combine error messages from one or more of the subsystems to create one or more error messages.

The feedforward data can comprises wafer state information, location information, measurement information, vendor information, design information, chip layout information, library information, tool information, or searching information, or any combination thereof.

In still other embodiments, the method of processing a wafer can include receiving a plurality of wafers and wafer data. A current wafer can be identified, a wafer state can be established for each wafer, and the wafer data can include real-time wafer data. An input message can be received by a controller, and the input message can include the pass-through message, or a real-time feedforward message, or any combination thereof. The procedure can include sending the current wafer to an internal etching tool when the sequencing state is the first value, and sending the wafer to an external etching tool when the sequencing state is a second value. Other wafers in a wafer lot can be sent to other subsystems or other integrated metrology (IM) tools. The feed-forward messages and/or pass-through messages can be sent to the correct tool when the input message includes feed-forward messages and/or pass-through messages. One or more TCDs can receive, process, modify, and/or send feed-forward messages and/or pass-through messages.

Figure 5:
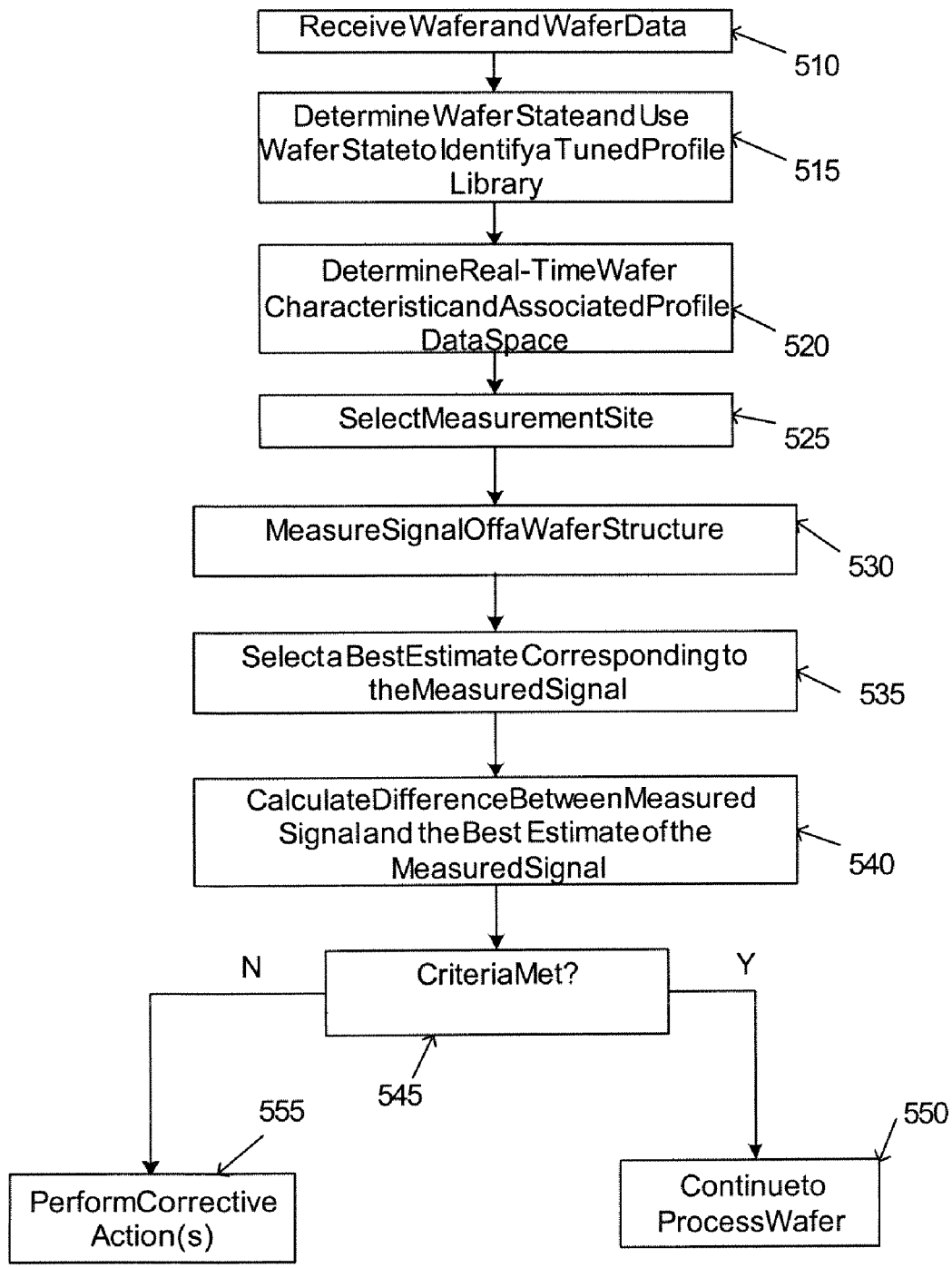
FIG. 5 illustrates an exemplary flow diagram of a procedure for using a wafer characteristic-dependent profile library that was created using real-time wafer characteristic.

FIG. 5 illustrates an exemplary flow diagram of a procedure for using a characteristic-dependent profile library that was created using real-time wafer characteristic data. FIG. 5 is described with respect to a wafer temperature-dependent profile library; however, the library may be a wafer thickness-dependent profile library, a wafer n&k-dependent profile library or a dependent profile library created using any type of wafer characteristic data. For example, in FIG. 5, wafer temperature data can be replaced with wafer thickness data, and a wafer temperature dependent profile library can be replaced with a wafer thickness depent profile library. In the illustrated embodiment, a procedure 500 for identifying a structure on a wafer using a measured signal and a tuned (temperature-dependent) library is shown. In some examples, the structure can be identified using a tuned (temperature-dependent) profile shape, a tuned (temperature-dependent) profile signal (diffraction signal), or one or more tuned (temperature-dependent) profile parameters, or any combination thereof. In other examples, a tuned (temperature-dependent) profile spectrum (diffraction spectrum) may be used. One or more tasks associated with or included in procedure 500 can be performed in real-time to maximize throughput.

In 510, one or more wafers, wafer data, and one or more input messages can be received in a measurement device. The wafer can comprise a plurality of dies and a number of measurement sites. The wafer data can comprise wafer state data, for example. In some embodiments, at least one input message can comprise feed-forward tuning data. In addition, the input messages can include tuned measurement recipe data, tuned measurement profile data, or tuned measurement modeling data, or any combination thereof. In other embodiments, at least one input message can comprise feed-forward optimization data. In addition, the input messages can include measurement recipe data, optimized measurement profile data, or optimized measurement modeling data, wafer characteristic data or any combination thereof.

The wafer can comprise a first patterned mask (photoresist) layer on top of at least one other layer. In addition, at least one measurement site can have a structure therein that can be a reference structure having a periodic measurement structure, or a periodic device structure.

In 515, a wafer state can be determined for the wafer. In some embodiments, a temperature-dependent profile library (or any other characteristic-dependent profile library) can be identified using the wafer state, and a portion of the temperature dependent profile library can be dependent upon wafer thermal data.

In 520, a first wafer-characteristic-dependent profile such as a wafer-temperature-dependent profile data space can be established in the temperature-dependent profile library using the real-time wafer temperature. The first wafer-temperature-dependent profile data space can comprise wafer-temperature-dependent profile signal data and associated wafer-temperature-dependent profile structure data based on the real-time wafer temperature, and can include data points having accuracy limits based on real-time wafer temperature data. In addition, uniformity data such as wafer temperature uniformity data can be used.

In 525, a measurement site can be selected. and the measurement site can include a structure such as a reference structure, and the reference structure can have known and/or unknown shapes associated with it. The measurement site is preferably selected using the real-time wafer temperature because the real-time wafer temperature can affect the wafer curvature, which can affect the alignment of the wafer and the position of the optical beam. Alternatively, the measurement site can be selected without regard to temperature.

In 530, a signal can be measured off the wafer structure by an enhanced metrology tool such as the measurement subsystem. In some embodiments, an updated recipe can be established using the real-time wafer temperature. In other embodiments, the enhanced metrology tool can use the tuned measurement recipe data, the tuned measurement profile data, or the tuned measurement modeling data, or any combination thereof to establish the updated recipe. The measurement can generate an updated measurement signal that is dependent upon the real-time wafer temperature (or any other wafer characteristic) and/or uniformity. For example, the enhanced metrology tool can generate one or more temperature-dependent diffraction signals from one or more sites having one or more periodic and/or non-periodic structures therein. Alternatively, diffraction spectrums or other signals may be generated. In an alternate embodiment, the measurement recipe is not established using the real time wafer temperature (or any other characteristic data), but rather a diffraction signal is obtained form the measurement site and the real time wafer temperature data is used to select a best estimate signal from the wafer temperature-dependent-profile library, for example.

In 535, a best estimate signal for the measurement signal can be selected. The best estimate signal can be a data point of the first wafer-temperature-dependent profile data space with a temperature-dependent profile signal substantially close to the updated measurement signal, the best estimate signal can have a best estimate profile structure and/or best estimate profile parameters associated therewith. In some embodiments, an optimization technique can be performed to select the best estimate signal, and the optimization technique can include local and/or global procedures.

For example, temperature-dependent profile signals can be wider bandwidth signals and have values at wavelengths less than 400 nm. The first wafer-temperature-dependent profile data space can have data points with more accurate limits because they have been refined using the real-time wafer temperature data. The first wafer-temperature-dependent profile data space data points can represent more accurate profile shapes, more accurate profile parameters, and their associated more accurate profile signals. In addition, the best estimate signal can be a data point in the first wafer-temperature-dependent profile data space with a profile signal closest to the updated measurement signal. The updated measurement signal and/or the profile signal can be characterized by an enhanced set of wavelengths, can contain more accurate data, and can be used for the smaller features associated with the 65 nm node and below.

In 540, a difference can be calculated between the measurement signal and the best estimate signal. For example, differences can be calculated between the intensity signals, transmission signals, reflected signals, diffraction signals, or diffraction spectra, or any combination thereof.

In 545, the difference can be compared to matching criteria, creation criteria, or a product requirement, or any combination thereof. Procedure 500 can branch to 550 when a criteria and/or a product requirement is met, and procedure 500 can branch to 555 when a criteria and/or product requirement is not met. Product requirements can be context based and can include matching criteria, creation criteria, refinement criteria, enhancement criteria, and/or optimization criteria.

In 550, wafer processing can continue. When matching criteria is used, the reference structure can be identified as a member of the temperature-dependent profile library, and the wafer can be identified as an updated wafer if the matching criteria are met. The reference structure can be identified using existing temperature-dependent profile library data.

In 555, one or more corrective actions can be performed. The process of applying a first corrective action can include creation criteria that can be used to create new library members.

In some examples, the difference can be compared to a matching criteria. Where the matching criteria is met, the reference structure can be identified as a member of the temperature-dependent profile library, and the wafer can be identified as an updated wafer. If the matching criteria is not met, additional corrective actions can be applied. In addition, the difference can be compared to a first temperature-dependent profile library creation criteria. Where the creation criteria is met, the reference structure can be identified as a wafer temperature-dependent structure using the best estimate profile structure and/or best estimate profile parameters associated with the best estimate signal, and the best estimate signal, the best estimate profile structure, and/or best estimate profile parameters associated with the best estimate signal can be stored in the temperature-dependent profile library. If the first temperature-dependent profile library creation criteria is not met, additional corrective actions can be applied.

In addition, applying a corrective action can include selecting a new best estimate signal for the updated measurement signal. The new best estimate signal can be a new data point of the first wafer-temperature-dependent profile data space with a new temperature-dependent profile signal substantially close to the updated measurement signal. A new difference can be calculated between the updated measurement signal and the new best estimate signal, and the new difference can be compared to a new matching criteria. The reference structure can be identified as a member of the temperature-dependent profile library, and the wafer can be identified as an updated wafer if the new matching criteria are met. Additional corrective actions may be applied if the new matching criteria are not met. In addition, the new difference can be compared to a new temperature-dependent library creation criteria. The reference structure can be identified and/or stored as an updated structure using the new temperature-dependent profile structure data associated with the new best estimate signal if the new tuned profile library creation criteria are met. Additional corrective actions may be applied if the new tuned profile library creation criteria are not met.

When a new best estimate signal is selected, a RTPT procedure, a tuning procedure, a refinement procedure, an enhancement procedure, or an optimization procedure, or any combination thereof may be used.

When creating, refining, and/or enhancing a temperature-dependent profile library, the new difference can be compared to new temperature-dependent library creation criteria. The reference structure can be identified as an updated structure using the new temperature-dependent profile structure data associated with the new best estimate signal, and the reference structure can be stored as an updated structure if the new tuned profile library creation criteria are met. Additional corrective actions may be applied if the new tuned profile library creation criteria are not met. For example, the temperature-dependent library creation criteria can include temperature data, wafer data, wafer state data, rules data, size data, resolution data, wavelength data, process data, fabrication data, and/or structure data.

In other examples, a new updated measurement recipe can be established using the real-time wafer temperature. A new signal can be measured off the reference structure using the new updated measurement recipe, and the measurement can generate a new updated measurement signal that is dependent upon new real-time wafer temperature. A new best estimate signal can be selected for the new updated measurement signal, and the new best estimate signal can be a new data point of the first wafer-temperature-dependent profile data space with a new temperature-dependent profile signal substantially close to the new updated measurement signal. The new best estimate signal can have a new best estimate profile structure and/or new best estimate profile parameters associated therewith. A new difference can be calculated between the new updated measurement signal and the new best estimate signal, and the new difference can be compared to a new matching criteria. The reference structure can be identified as a member of the temperature-dependent profile library, and the wafer can be identified as an updated wafer if the new matching criteria is met, and/or additional corrective actions can be applied if the new matching criteria is not met. In addition, the new difference can be compared to a new temperature-dependent profile library creation criteria, and either the reference structure can be identified as a wafer temperature-dependent structure using the new best estimate profile structure and/or new best estimate profile parameters associated with the new best estimate signal, and the new best estimate signal, the new best estimate profile structure, and/or the new best estimate profile parameters associated with the new best estimate signal can be stored in the temperature-dependent profile library if the new temperature-dependent profile library creation criteria is met, and/or additional corrective actions can be applied if the new temperature-dependent profile library creation criteria is not met.

In still other examples, a new measurement site can be selected using the real-time wafer temperature, and the new measurement site can include a new reference structure. A new signal can be measured off the new reference structure using the old or a new updated measurement recipe, and the measurement can generate a new updated measurement signal that is dependent upon new real-time wafer temperature.

A new best estimate signal can be selected for the new updated measurement signal, and the new best estimate signal can be a new data point of the first wafer-temperature-dependent profile data space with a new temperature-dependent profile signal substantially close to the new updated measurement signal. The new best estimate signal can have a new best estimate profile structure and/or new best estimate profile parameters associated therewith. A new difference can be calculated between the new updated measurement signal and the new best estimate signal, and the new difference can be compared to a new matching criteria. The new reference structure can be identified as a member of the temperature-dependent profile library, and the wafer can be identified as an updated wafer if the new matching criteria is met, and/or additional corrective actions can be applied if the new matching criteria is not met. In addition, the new difference can be compared to a new temperature-dependent profile library creation criteria, and either the new reference structure can be identified as a wafer temperature-dependent structure using the new best estimate profile structure and/or new best estimate profile parameters associated with the new best estimate signal, and the new best estimate signal, the new best estimate profile structure, and/or the new best estimate profile parameters associated with the new best estimate signal can be stored in the temperature-dependent profile library if the new temperature-dependent profile library creation criteria is met, and/or additional corrective actions can be applied if the new temperature-dependent profile library creation criteria is not met.

In additional examples, a new wafer-temperature-dependent profile data space can be established proximate the first wafer-temperature-dependent profile data space in the temperature-dependent profile library using the real-time wafer temperature. Alternatively, the new wafer-temperature-dependent profile data space can be established anywhere in the temperature-dependent profile library using the real-time wafer temperature. The new wafer-temperature-dependent profile data space can include new wafer-temperature-dependent profile signal data and associated new wafer-temperature-dependent profile structure data based on real-time wafer temperature, and can include new data points having accuracy limits based on real-time wafer temperature data. A new best estimate signal can be selected for the updated measurement signal, and the new best estimate signal can be a new data point of the new wafer-temperature-dependent profile data space with a new temperature-dependent profile signal substantially close to the updated measurement signal. The new best estimate signal can have a new best estimate profile structure and/or new best estimate profile parameters associated therewith. A new difference can be calculated between the updated measurement signal and the new best estimate signal, and the new difference can be compared to a new matching criteria. The reference structure can be identified as a member of the temperature-dependent profile library, and the wafer can be identified as an updated wafer if the new matching criteria is met, and/or additional corrective actions can be applied if the new matching criteria is not met. In addition, the new difference can be compared to a new temperature-dependent profile library creation criteria, and either the reference structure can be identified as a wafer temperature-dependent structure using the new best estimate profile structure and/or new best estimate profile parameters associated with the new best estimate signal, and the new best estimate signal, the new best estimate profile structure, and/or the new best estimate profile parameters associated with the new best estimate signal can be stored in the temperature-dependent profile library if the new temperature-dependent profile library creation criteria is met, and/or additional corrective actions can be applied if the new temperature-dependent profile library creation criteria is not met.

In other additional examples, a new wafer temperature can be determined, and a new wafer-temperature-dependent profile data space can be established in the temperature-dependent profile library using the new real-time wafer temperature. Alternatively, new wafer temperature uniformity data can be established using the new real-time wafer temperature. The new wafer-temperature-dependent profile data space can include new wafer-temperature-dependent profile signal data and associated new wafer-temperature-dependent profile structure data based on the new real-time wafer temperature, and can include new data points having accuracy limits based on the new real-time wafer temperature data. A new best estimate signal can be selected for the updated measurement signal, and the new best estimate signal can be a new data point of the new wafer-temperature-dependent profile data space with a new temperature-dependent profile signal substantially close to the updated measurement signal. The new best estimate signal can have a new best estimate profile structure and/or new best estimate profile parameters associated therewith. A new difference can be calculated between the updated measurement signal and the new best estimate signal, and the new difference can be compared to a new matching criteria. The reference structure can be identified as a member of the temperature-dependent profile library, and the wafer can be identified as an updated wafer if the new matching criteria is met, and/or additional corrective actions can be applied if the new matching criteria is not met. In addition, the new difference can be compared to a new temperature-dependent profile library creation criteria, and either the reference structure can be identified as a wafer temperature-dependent structure using the new best estimate profile structure and/or new best estimate profile parameters associated with the new best estimate signal, and the new best estimate signal, the new best estimate profile structure, and/or the new best estimate profile parameters associated with the new best estimate signal can be stored in the temperature-dependent profile library if the new temperature-dependent profile library creation criteria is met, and/or additional corrective actions can be applied if the new temperature-dependent profile library creation criteria is not met.

In still other examples, a best estimate structure can be established to determine an estimate of the updated measurement signal. The best estimate structure can be a data point of a temperature-dependent profile data space with a temperature-dependent profile shape substantially close to the reference structure, wherein the best estimate structure includes a temperature-dependent height, width, thickness, depth, volume, area, dielectric property, critical dimension, spacing, period, position, or line width, or any combination thereof. A signal can be simulated off a hypothetical structure corresponding to the best estimate structure. A second difference can be calculated between the updated measurement signal and the simulated signal. The second difference can be compared to second matching criteria. The reference structure can be identified as a member of the temperature-dependent profile library, and the wafer can be identified as an updated wafer if the second matching criteria is met, and/or additional corrective actions can be applied if the second matching criteria is not met. In addition, the second difference can be compared to a second temperature-dependent profile library creation criteria, and either the reference structure can be identified as a wafer temperature-dependent structure using the new best estimate profile structure and/or new best estimate profile parameters associated with the new best estimate signal, and the new best estimate signal, the new best estimate profile structure, and/or the new best estimate profile parameters associated with the new best estimate signal can be stored in the temperature-dependent profile library if the second temperature-dependent profile library creation criteria is met, and/or additional corrective actions can be applied if the second temperature-dependent profile library creation criteria is not met.

When differences are calculated between best estimate signals and measured signals new and/or previously-used real time wafer temperatures, new and/or previously-used measurement sites, new and/or previously-used reference structures, new and/or previously-used profile data spaces, different wavelengths, or historical data, or any combination thereof can be used.

When an updated measurement recipe is established, the real-time wafer temperature data, delay time data, and/or wafer temperature uniformity data can be used to determine a wafer radius for aligning the wafer and/or for aligning an optical beam, can be used to determine a wafer curvature for the wafer, can be used to determine a contaminant level, a contamination probability, and/or an out-gassing rate for the wafer, can be used to determine an actual wafer temperature for the wafer when the wafer is measured, can be used to determine optical properties for the wafer, can be used to determine calibration factors for optical properties for the wafer, can be used to determine properties of a photoresist layer, or can be used to determine a correct location for a measurement site on the wafer, or any combination thereof.

When matching criteria are used, the matching criteria can include rules data, goodness of fit data, real-time wafer temperature data, wavelength data, threshold data, limit data, measured data, process data, or historical data, or any combination thereof. For example, rules data can include creation rules, intervention rules, processing sequence rules, delay time rules, or update rules.

Accuracy values can be determined for the best estimate signal, the accuracy value can be compared to accuracy limits, and a refinement procedure can be performed if the accuracy value does not meet the accuracy limits. Alternatively, other procedures can be performed, other sites can be used, or other wafers can be used.

The updated measurement signal can include wafer-temperature-dependent intensity signals, wafer-temperature-dependent transmission signals, wafer-temperature-dependent reflection signals, wafer-temperature-dependent diffraction signals, or temperature-dependent diffraction spectra, or any combination thereof. Alternatively, updated measurement signal can depend upon the wafer temperature uniformity data and/or other data.

In some embodiments, the updated measurement recipe using a first real-time parameter tuning RTPT procedure that uses the real-time wafer temperature as tuning data. For example, temperature dependent data in an existing measurement recipe can be updated using real-time wafer temperature data. In addition, a completion time and/or execution time can determined for the first RTPT procedure. The completion time and/or execution time to a measurement and/or processing start time to determine if there is enough time to establish the updated recipe. The wafer can be measured and/or processed using the updated measurement recipe if the completion time and/or execution time are less than the processing start time, or the wafer can be measured using a non-updated measurement recipe if the completion time and/or execution time are not less than the processing start time.

One or more TCDs and one or more RTPTs can be used to create the real time wafer temperature data. For example, the real-time wafer temperature data can be created when an input message includes a real-time feedforward message that includes real-time wafer temperature data.

In one example, real-time wafer-temperature-dependent measurement recipe data, real-time wafer-temperature-dependent measurement profile data, or real-time wafer-temperature-dependent measurement model data, or any combination thereof can be created using RTPT procedures that use the real-time wafer temperature data as tuning data when a RTPT state is a first value, or when the input message includes a real-time feedforward message; and the updated measurement recipe can be established using the real-time wafer-temperature-dependent measurement recipe data, the real-time wafer-temperature-dependent measurement profile data, or the real-time wafer-temperature-dependent measurement model data, or any combination thereof.

In another example, real-time tuned measurement recipe data, real-time tuned measurement profile data, or real-time tuned measurement model data, or any combination thereof can be created using RTPT procedures that use the real-time wafer temperature data as tuning data when a RTPT state is a first value, or when the input message includes a real-time feedforward message; and the updated measurement recipe can be established using the real-time tuned measurement recipe data, the real-time tuned measurement profile data, or the real-time tuned measurement model data, or any combination thereof.

In still another example, real-time optimized measurement recipe data, real-time optimized measurement profile data, or real-time optimized measurement model data, or any combination thereof can be created using RTPT procedures that use the real-time wafer temperature data as optimization data when a RTPT state is a first value, or when the input message includes a real-time feedforward message; and the updated measurement recipe can be established using the real-time optimized measurement recipe data, the real-time optimized measurement profile data, or the real-time optimized measurement model data, or any combination thereof.

The real-time wafer temperature data can be feed-forward when the feedforward state is a first value, and the real-time wafer temperature data is not feed-forward when the feedforward state is a second value. The feedforward state is the first value when the real-time wafer temperature data can be fed-forward before an update process is performed for the wafer, and the feedforward state is the second value when the real-time wafer temperature data cannot be fed forward before the update process is performed for the wafer.

In some cases, a procedure can be stopped if creation criteria are met or creation criteria are not met.

When creating and/or refining a temperature-dependent profile library a temperature-dependent adjustment matrix can be calculated. A temperature-dependent adjustment matrix can include an adjustment value for at least one temperature-dependent profile signal, and each adjustment value can be determined using a diffraction signal associated with a profile of a non-temperature-dependent profile library, or a diffraction signal associated with a profile of the temperature-dependent profile library, or a combination thereof. A new temperature-dependent profile signal can be created by using the temperature-dependent adjustment matrix and the diffraction signals associated with the non-temperature-dependent profile library, the diffraction signals associated with the temperature-dependent profile library, or diffraction signals associated with a data point outside the libraries.

When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

In some cases, best estimate signals can be determined by minimizing a total cost function.

Processing sequences can change with time. When a process sequence is being developed, the through-put can be less than desired because the confidence values are lower and the risk factors are higher for new processes and additional measurement steps are required to raise the confidence values and lower the risk factors. When wafers are measured using separate and/or external measurement tools, additional time is required.

Before, during, and/or after the each process step in the processing sequence, real-time data can be created, processed, received, and/or sent, and the real-time data can include real-time measured, tuned, and/or optimized data. When real-time data is created, the real-time data and the creation time can be stored and can be examined to determine when the real-time data can be used. When real-time data is processed, the real-time data and the time stamp can be examined to determine what part of the real-time data can be used and how it can be used. When real-time data is received, the real-time data and the reception time can be stored and can be examined to determine when the real-time data can be used. Received messages can include time stamped data. When real-time data is sent, the real-time data and the transmission time can be stored and can be examined to determine when the real-time data can be used. Sent messages can include time stamped data. For example, the real-time data can be received and/or sent as real-time feedforward, pass-through, RTPT, and/or optimization data. Alternatively, other data may be created, received, and/or sent. Intervention and/or judgment rules may be established and used to determine when and how to process the real-time data, and the intervention and/or judgment rules can be process, device, product, and/or device dependent.

When new real-time data is established for the current wafer by a procedure associated with a deposition tool, and when the new real-time data from the deposition process can be fed forward to an exposure tool before the current wafer is exposed a more accurate exposure process can be performed on the current wafer. For example, layer thickness and thickness uniformity data can be fed forward from the deposition tool to an exposure tool. When the new real-time data from the deposition process cannot be fed forward to the exposure tool before the current wafer is exposed, a less accurate exposure process may be performed on the current wafer because the newest real-time data is not being used.

When new real-time data is established for the current wafer by a procedure associated with an exposure tool, and when the real-time data from the exposure process can be fed forward to a developing tool before the current wafer is developed, a more accurate developing process can be performed on the current wafer. For example, exposure times, exposure doses, and/or uniformity data can be fed forward from an exposure tool to a developing tool. When the real-time optimization data from the exposure process cannot be fed forward to a developing tool before the current wafer is developed, a less accurate developing process may be performed on the current wafer because the newest real-time data is not being used.

When new real-time data is established for the current wafer by a procedure associated with a developing tool, and when the new real-time data from the developing process can be fed forward to an etching tool before the current wafer is etched, a more accurate etching process can be performed on the current wafer. For example, thermal processing times and temperatures can be fed forward from a developing tool to an etching tool. When the new real-time data from a developing process cannot be fed forward to an etching tool before the current wafer is etched, a less accurate etching process may be performed on the current wafer because newest real-time data is not being used.

When new real-time data is established for the current wafer by a procedure associated with an etching tool, and when the new real-time data from the etching process can be fed forward to a measurement tool before the current wafer is measured a more accurate measurement process can be performed on the current wafer. For example, etching rates and etching times can be fed forward from an etching tool to tune a recipe, a profile estimate, or a model, or a combination thereof in a measurement tool. When the new real-time data from an etching process cannot be fed forward to a measurement tool before the current wafer is measured, a less accurate measurement process may be performed on the current wafer because the newest real-time data is not being used.

During process development, stable processes are first developed and then the stable processes can be tuned and/or optimized. RTPT procedures can be used during process stabilization, process enhancement, and process optimization.

During a process stabilization sequence, one or more additional measurement steps can be used to raise confidence values and/or decrease risk factors before a process optimization sequence is established. Delay times can be used to wait for tuning and/or optimization data before performing a process, and delay times can be used to wait for tuned and/or optimized data before performing a process. A measurement step can be performed before the etching process is performed to obtain data for a patterned mask layer that can be used to compare with the patterned material layer. In addition, measurements can be made after a deposition process, and these measurements can provide thickness data, uniformity data, and/or optical properties data that can be fed forward as real-time data.

In some embodiments, a wafer can be processed more accurately using real-time temperature data that can be fed forward in real time whenever it is created and/or whenever it is needed. One or more RTOs can be used to receive wafer data. A wafer state can be established for the wafer, and the wafer data can include historical and/or real-time wafer temperature data. One or more RTOs can be used to receive, send, create, process, and/or modify messages. For example, an RTO can receive an input message that can include a pass-through message, or a real-time feedforward message, or any combination thereof.

One or more RTOs can create, modify, and/or use tuned and/or optimized data. An RTO can use the real-time feedforward message when the input message includes a real-time feedforward message, and an RTO can use the pass-through message when the input message includes a pass-through message.

An RTO can use a TCD to send the pass-through message to the internal measurement subsystem and/or IM tool, when the input message includes the pass-through message or when the pass-through state is the first value, and the sequencing state is the first value, and not sending the pass-through message to the internal measurement subsystem when the input message does not include the pass-through message.

An RTO can use a TCD to send RTPT and/or optimization data to the internal measurement subsystem (IM tool) when the feedforward state is the first value, and the sequencing state is the first value, and not sending the optimized data to the internal measurement subsystem when the feedforward state is the second value, and/or the sequencing state is a second value.

An RTO can create, modify, send, receive, and/or use an optimized measurement recipe, an optimized measurement profile, or an optimized measurement model, or any combination thereof. An RTO can create, modify, send, receive, and/or use a tuned measurement recipe, a tuned measurement profile, or a tuned measurement model, or any combination thereof. An RTO can store, identify, modify, send, receive, and/or use measured data. Messages can be processed, sent, and/or received using one or more TCDs.

In some fabrication environments, integrated metrology tools can provide measurement data that was previously unavailable; can provide measurement data faster; can provide a more complete understanding of a process, can replace destructive methods; can provide more accurate checking of chamber performance, can provide a faster sampling rate, can improve within-wafer uniformity, can reduce the number of wafers at risk, and can provide shorter reaction times to process and/or tool excursions.

Thus, wafer characteristic data can be used to facilitate and enhance a conventional ODP measurement process. As discussed above, the conventional ODP measurement process includes detecting a measured diffraction signal from the wafer surface, and matching the measured diffraction signal with a simulated diffraction signal in order to obtain a hypothetical profile associated with the simulated diffraction signal. Matching of the measured diffraction signal with the simulated diffraction signal may be done by searching a library of previously created simulated diffraction signals, each associated with a hypothetical profile. According to an embodiment of the present invention, the library is created using wafer characteristic data such as wafer temperature, thickness and n&k data, for example, as a profile parameter stored in association with the simulated diffraction signals and hypothetical profiles. Real time values for the wafer characteristic data may then be obtained during processing of a particular wafer and used to enhance the ODP measurement process.

Specifically, the real time wafer characteristic data can be used to update a measurement recipe or select a measurement site for the wafer prior to detecting the measured diffraction signal. Once the measured diffraction signal is detected, the real time wafer characteristic data may be used to modify the measured diffraction signal (to compensate for temperature affects, for example) so that a subsequently matched simulated signal can be more accurate. Still further, the real time wafer characteristic data can be used to select a library space to search for the matching simulated diffraction signal, thereby narrowing the library search space and reducing search time.

Once a simulated diffraction signal is matched and selected, a difference between the simulated and measured signal can be calculated. Where the difference is less than a predetermined threshold value, the profile associated with the diffraction signal is presumed to be an accurate representation of the measured structure, and further processing can be performed based on the measured structure. Where the difference is larger than the predetermined threshold value, however, correction action can be performed. The corrective action can include at least one of taking a new measurements of the same site, taking a new measurement of a different site, taking a new measurement using a new measurement recipe, selecting a new profile data space, or obtaining new wafer characteristic data either externally or in the measurement subsystem itself.

In one embodiment, the corrective action includes selecting another simulated diffraction signal from the library and calculating a new difference between the measured diffraction signal and the new simulated diffraction signal. This process is repeated until the closest matching simulated diffraction signal in the library is obtained. In one embodiment, where the closest match in the library remains far from the measured diffraction signal (i.e. does not meet a predetermined criteria), the library can be updated. For example, a regression based technique can be used to generate a new simulated diffraction signal corresponding to the measured signal based on profile parameters. The real time wafer characteristic data may be used to reduce the number of iterations in the regression technique. Further, the new simulated diffraction signal can be added to the library and made available for future measurements.

Figure 6:
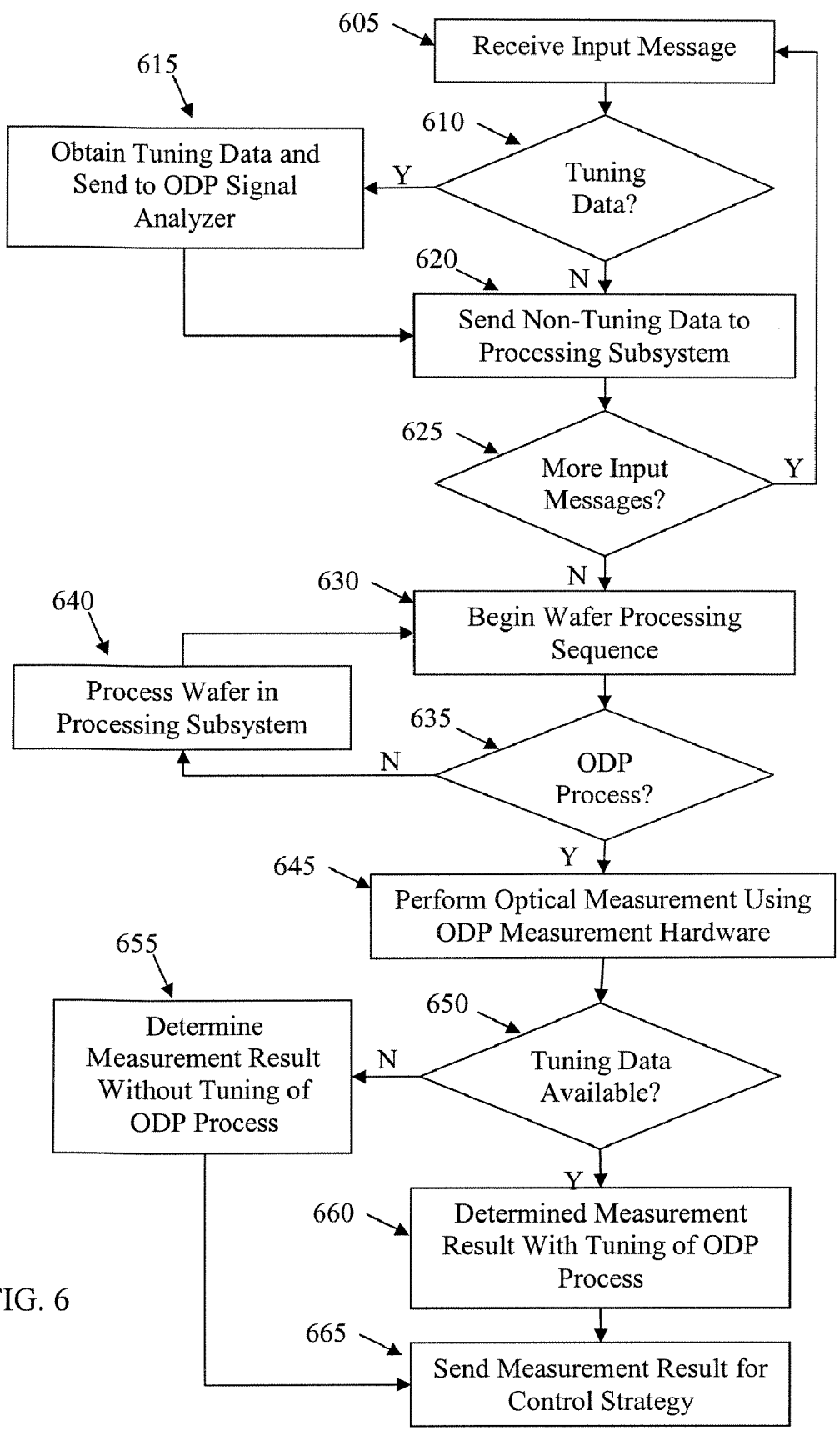
FIG. 6 is a flow chart showing a method for determining a tuned ODP measurement result based on tuning data in accordance with one embodiment of the present invention.

FIG. 6 is a flow chart showing a method for determining a tuned ODP measurement result based on tuning data in accordance with one embodiment of the present invention. The process of FIG. 6 is performed by a wafer processing system including a processing subsystem, an ODP subsystem and a TCD. The processing subsystem may be implemented as an etch subsystem a lithography subsystem or any of the wafer processing subsystems described with respect to FIGS. 1-5 above. Similarly, the ODP measurement subsystem may be implemented as any of the ODP measurement subsystems described with respect to FIGS. 1-5 above. Thus, the ODP subsystem includes measurement hardware (such as a light source and detector) for obtaining a diffraction signal from the wafer, and a signal analyzer (such as the PAS described above) for determining a measurement result from the diffraction signal. The TCD may be external to the processing and ODP subsystems as shown in FIG. 3, or the TCD can be integral with the processing subsystem and/or the ODP subsystem.

In step 605 the TCD receives an input message. The input message may include tuning data and/or non-tuning data. The tuning data can be generated based on various information collected by a processor (such as the host computer) from any subsystem of a wafer processing system. In the embodiment of FIG. 6, tuning data is any data that can be used to modify or "tune" an ODP measurement process that was previously established for a wafer or lot, and non-tuning data is data that cannot be used to modify or tune the ODP measurement process. Tuning data can include feedforward data as described herein, and non-tuning data may include pass-through data as described herein. In the embodiment of FIG. 6, the tuning data is sent to the ODP signal analyzer for use in tuning the ODP measurement process, while non-tuning data is sent to the processing subsystem for use in a process performed by the processing subsystem and/or a measurement performed by the ODP measurement hardware.

In step 610, the TCD determines whether the input message includes tuning data. For example, a controller of the TCD may search or parse the input message for tuning data that can be used to tune the ODP measurement process. Where the TCD determines in step 610 that the input message includes tuning data, the process proceeds to step 615 where the tuning data is obtained from the input message and sent to the ODP signal analyzer. For example, a controller of the TCD may be used to extract the tuning data from the input message, and send the tuning data to the ODP signal analyzer. In one embodiment, the tuning data is sent directly to the ODP signal analyzer, however, other routing may be used. The tuning data is stored in the ODP signal analyzer until it is needed to tune an ODP measurement process, as will be discussed further below.

The tuning data obtained in 615 can be wafer characteristic data such as layer thickness, wafer temperature, wafer layer porosity, reflectivity, refractivity, n & k values and/or any other characteristic of the wafer that can affect optical measurement of the wafer. As would be understood by one of ordinary skill in the art, the n&k value of a film indicates a reflectivity/refractivity property of a film based on known characteristics such as material composition, doping, porosity etc. Wafer characteristic data can be directly measured during a previous process, or determined based on raw process data collected during the previous process. For example, the tuning data can be a deposited film thickness measured by an integrated metrology tool on a CVD subsystem or determined based on a deposition rate and time recorded by the CVD subsystem. In one embodiment, the tuning data obtained in step 615 is raw process data used by the processing and/or ODP subsystem to calculate wafer characteristic data, that in turn is used to tune an ODP measurement process. The tuning data can also be non-characteristic data that can be used to modify the measurement result in some way. For example, the tuning data can be instructions generated by a host for offsetting a measurement result obtained during the ODP process. Alternatively, the tuning data can be a new recipe generated by the host and sent to the ODP subsystem to replace an existing measurement recipe.

In step 620, non-tuning data is sent to the processing subsystem. As noted above, in the embodiment of FIG. 6, non-tuning data is data that cannot be used to tune an ODP measurement process. For example, non-tuning data can include measurement setup data, processing setup data, initial measurement recipes, processing recipes, wafer identification data, or other data that can be used by the ODP measurement hardware to obtain a diffraction signal from a wafer and/or by the processing subsystem to perform a process on a wafer.

The non-tuning data sent to the processing subsystem in step 620 can be data remaining after tuning data is extracted in step 615. That is, where an input message includes both tuning data and non-tuning data, the tuning data is extracted and sent to the ODP signal analyzer in step 615, and the remaining non-tuning data is sent to the processing subsystem in step 620. Further, in the embodiment of FIG. 6, if the input message does not include tuning data (for tuning the ODP measurement process), then the input message includes only non-tuning data. Thus, where step 610 determines that tuning data is not included in the input message, then the process continues to step 620 where the non-tuning data is sent to the processing subsystem. In this regard, the input message containing only non-tuning data is preferably sent to the processing subsystem "as is" without modification by the TCD.

In one embodiment, where the TCD receives an input message including both tuning and non-tuning data, the TCD can first obtain and send the tuning data to the ODP signal analyzer as described in step 615. The TCD will then wait for the ODP signal analyzer to send a verification reply to the TCD indicating that the tuning data was received and did not generate any errors in the ODP subsystem. If such a verification is received, the TCD will then send the non-tuning data to the processing tool, but if the verification signal is not received due to an error, the non-tuning data will not be sent to the processing tool until the error is cleared. In an alternative embodiment, the TCD will send the tuning data to the ODP signal analyzer and also send the non-tuning data to the processing tool, and the ODP signal analyzer and processing tool will independently deal with exceptions for the respective data In step 625, the TCD determines whether more input messages exist to be processed by the TCD. In one embodiment, input messages for an entire lot of wafers are sent from a host to the TCD, and the TCD processes all messages for the lot to obtain tuning and non-tuning data for all wafers in the lot. All tuning data for the lot is sent to the signal analyzer of the ODP subsystem where it is stored for later use in tuning a measurement result, and all non-tuning data for the lot is sent to the processing subsystem to control processing and measurement for the lot. Alternatively, input messages can be sent from the host or any subsystem to the TCD on a wafer to wafer basis. Where additional input messages exist, the process returns to step 605, where the additional messages are processed by the TCD. Where no additional input messages exist, the process continues to step 630 where a wafer processing sequence is started. Thus, steps 605-625 provide a setup sequence whereby data is obtained from an input message(s) and routed to the processing subsystem or ODP subsystem as necessary prior to performing any processing of a wafer.

Once the setup sequence is completed, a processing sequence of the wafer(s) begins in step 630. In the embodiment of FIG. 6, the wafer processing sequence is controlled by the processing subsystem according to non-tuning data provided to the processing subsystem in step 620. The passthough data can include instructions for processing a wafer in the processing subsystem, and/or instructions for performing an ODP measurement process in the ODP subsystem. The ODP measurement process can be performed on each wafer in a lot, or only on sample wafers of the lot. Further, the ODP measurement process can be performed on a wafer before and/or after processing of the wafer in the processing subsystem. Thus, in step 635, the processing subsystem determines whether an ODP measurement process is required for a wafer. Where no measurement is required, a process such as etching, deposition etc. is performed on the wafer in step 640, and the procedure returns to step 630 where the processing sequence continues. Thus, steps 630-640 are performed until an ODP measurement is required.

When an ODP measurement is required, the procedure proceeds to step 645 where an optical measurement is performed on the wafer using ODP measurement hardware. In one embodiment, the processing subsystem determines when an optical measurement is needed and sends to the ODP measurement hardware only the data necessary for performing that measurement. For example, where a setup sequence was performed for an entire lot of wafers and the processing subsystem stores all non-tuning data for the lot, the processing subsystem can send only non-tuning data needed to perform that measurement (e.g. measurement setup and recipes) to the ODP measurement hardware. The ODP measurement hardware will then load the wafer and make measurements according to the data provided by the processing subsystem. Specifically, the ODP measurement hardware provides light incident on the wafer and detects a diffraction signal from a measurement site on the wafer. The diffraction signal may be spectral data, for example. In a preferred embodiment, a diffraction signal is detected for multiple sites on a wafer, such as the 13 x&y locations listed in Table 1 above.

In one embodiment of the invention, the ODP measurement hardware can include additional sensors for providing internal tuning data (internal to the ODP subsystem) that can also be used to tune an OPD measurement process. For example, a light source and/or detector component of the ODP measurement hardware can include a temperature sensor for providing temperature data associated with each of the diffraction signals detected in step 645. Alternatively, the hardware can be modified to measure thickness, porosity, reflectivity and/or collect any other wafer characteristic data that can be obtained during the measurement process in step 645. This "internal" tuning data can be stored in the ODP subsystem's signal analyzer along with "external" tuning data sent in step 615. All tuning data can then be used to tune the ODP measurement process.

Once the measurement process is performed by the measurement hardware, in step 650 the ODP measurement subsystem determines whether tuning data is available for a diffraction signal obtained in step 645. The available tuning data may be external tuning data or internal tuning data, as noted above. In one embodiment, the ODP signal analyzer receives a preliminary message that prompts the ODP subsystem to retrieve the tuning data for storage.

Where step 650 determines that no tuning data exists, the process proceeds to step 655 where the ODP signal analyzer determines a measurement result without tuning the ODP process. Step 655 includes matching a diffraction signal obtained in step 645 with a simulated diffraction signal, and obtaining a measurement result associated with the simulated diffraction signal. A measurement result can be a CD measurement, a structure profile, a trench or via profile, a depth, a multilayer thickness measurement, and/or any other measurement result that can be obtained by use of ODP techniques. Determination of the measurement result can be based on a library system or regression system for identifying a simulated diffraction signal and associated measurement result. As step 655 is performed without using tuning data, the ODP measurement result is an un-tuned measurement result, as with conventional methods discussed in the background section above.

However, where step 650 determines that tuning data (external or internal) is available, the process proceeds to step 660 where the ODP signal analyzer determines a measurement result by tuning the ODP measurement process. In one embodiment, the ODP signal analyzer can check and validate the tuning data. For example, where the tuning data is an invalid range or an invalid format, the OPD signal analyzer can send an error signal or alarm back to the processing tool (or any other source of the tuning date).

The ODP signal analyzer determines the measurement result based on the diffraction signal obtained in step 645 and any tuning data obtained in step 615 and/or step 645. For example, the tuning data, and in particular wafer characteristic data such as temperature, thickness and n&k values, can be used as variable parameters to override default values for these parameters in the ODP measurement process. With a library based measurement process, this tuning data can be used to pinpoint a small range of possible matches in the library for consideration, thereby reducing the time to achieve the measurement result. Similarly, with the regression based measurement process, the tuning data and/or wafer characteristic data can be used to provide an initial matching possibility that is close to the actual match, thereby reducing the regression iterations and the time to achieve a measurement result. Thus, the tuned measurement result obtained in step 660 can be a measurement result that is obtained more efficiently with the use of tuning data.

Alternatively, the tuning data may be used to improve the accuracy of the measurement result. In one embodiment, the tuning data may be used to tune the measured diffraction signal obtained in step 645 prior to matching this measured signal with a simulated diffraction signal as part of step 660.

For example, wafer n&k values provided from the external tuning data in step 620, or calculated in the optical analysis system can be used to modify the diffraction spectrum obtained in step 645 to have a spectral signature consistent with the n&k value. This tuned diffraction spectrum is then used to obtain a matching simulated diffraction signal.

However, the above-described tuning of the diffraction signal itself can involve complex and time consuming computations. Thus, in an alternative embodiment, the tuning data can be used to tune a preliminary measurement result obtained by the ODP analyzer. For example, wafer temperature data provided in step 620 and/or step 645 may be used by the ODP analyzer to determine a CD shift of +2 nm, for example. Alternatively, this offset value can be determined outside the ODP subsystem and forwarded to the ODP subsystem as part of the external tuning data. Once the ODP signal analyzer determines a preliminary CD measurement result using conventional methods, the CD shift value of +2 nm is simply added to the preliminary measurement to provide a tuned measurement result. Such offset tuning of the measurement result can be achieved more efficiently than the above example of tuning by recalculating the measured diffraction signal itself. In one example, the ODP measurement subsystem can receive a standard tool calibration procedure that is broadcast by the host computer to all similar tools in the factory, and also receive specific tuning data used to offset measurement results of the specific tool. The offset value can be based on known variation in measurement results for the specific tool, known variation in processing subsystems in line with the specific tool etc.

Once a measurement result is determined (either untuned in step 655, or tuned in step 660), the measurement result is sent to the processing subsystem (preferably in real time) for use in a control strategy for optimizing a process, as shown in step 665. The processing subsystem may use the measurement result as part of a "tuning" or "feedback" control strategy for optimizing a process. For example, where the ODP measurement is performed on a wafer prior to processing the wafer in the processing subsystem, the measurement result can be used in a tuning control strategy for optimizing the subsequent process to be performed on the measured wafer in the processing subsystem. Where the measurement is performed on a wafer after processing the wafer in the processing subsystem, the measurement result can be used in a feedback control strategy for optimizing a process to be performed on the next wafer in the processing subsystem.

In the embodiment of FIG. 6, "optimization" of a process means using a measurement result to optimize a process recipe, a process model and/or a process profile. As described above, an RTO associated with a processing subsystem (such as an etch tool, deposition tool etc.) can obtain the measurement result and optimize the process performed by the subsystem. Whether the optimized process is available for a particular wafer can be determined based on timing requirements as described herein.

Once the ODP measurement result is provided for use in a control strategy, the process in FIG. 6 may end or loop back to step 630 where further wafer processing is performed.

In some embodiments, when the message does not include tuning data, the message can be sent in its present form to a process tool or measurement tool as setup data. When the message does include tuning data, a TCD can remove the tuning data from the message and sends the tuning data to the optical measurement hardware, and any remaining part of the message can be sent to another subsystem and/or tool. The process tool can then send a message to the measurement hardware system at the appropriate time (when a wafer is ready to be measurement). For example, setup sequences and/or run-time sequence may be performed. During a setup sequence, a TCD can receive one or more messages and can look for PAS tuning data in each wafer or lot setup message. When the TCD finds a tuning parameter, the TCD can forward just this part of the message to the PAS and the PAS can store this data in a database for later use. In addition, standard setup information can be sent to the process tool. After the process tool accepts the setup messages successfully, then the lot of wafer can start processing. If the first wafer is a pre measurement wafer, then the process tool can send just the setup information for the given wafer to the metrology hardware (wafer 1). The metrology hardware will load the wafer and start making measurements at one or more sites. During each measurement the measurement hardware can send a spectral data set to the PAS. When the PAS receives the spectral data, it then looks for tuning data in the database (e.g., if it was expecting tuning data). The PAS then uses this data with the spectral data to calculate data for the given site. The calculated data can then be sent back to the measurement hardware and/or to the process tool in real-time site by site.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention. Thus, the description is not intended to limit the invention and the configuration, operation, and behavior of the present invention has been described with the understanding that modifications and variations of the embodiments are possible, given the level of detail present herein. Accordingly, the preceding detailed description is not meant or intended to, in any way, limit the invention— rather the scope of the invention is defined by the appended claims.

What is claimed:

1. A method of using a thickness-dependent profile library to facilitate optical measurements, the method comprising:
   receiving a wafer, wafer data, and one or more input messages, wherein the wafer comprises a plurality of dies and a number of measurement sites, the wafer data comprises wafer state data, and at least one of the one or more input messages comprises feed-forwarded tuning data;
   determining a wafer state for the wafer, wherein a thickness-dependent profile library is identified using the wafer state, and comprises data for wavelengths between approximately 100 nm and approximately 1000 nm;
   determining a real-time wafer thickness using the feed-forwarded tuning data;
   establishing a first wafer-thickness-dependent profile data space in the thickness-dependent profile library using the real-time wafer thickness, the first wafer-thickness-dependent profile data space comprising wafer-thickness-dependent profile signal data and associated wafer-thickness-dependent profile structure data based on real-time wafer thickness, and comprising data points having accuracy limits based on real-time wafer thickness data;
   selecting a measurement site using the real-time wafer thickness, wherein the measurement site includes a reference structure;
   establishing an updated measurement recipe using the real-time wafer thickness;
   measuring a signal off the reference structure using the updated measurement recipe, the measurement generating an updated measurement signal that is dependent upon the real-time wafer thickness;

selecting a best estimate signal for the updated measurement signal, the best estimate signal being a data point of the first wafer-thickness-dependent profile data space with a thickness-dependent profile signal substantially close to the updated measurement signal, the best estimate signal having a best estimate profile structure and/or best estimate profile parameters associated therewith;

calculating a difference between the updated measurement signal and the best estimate signal;

comparing the difference to a matching criteria; and either identifying the reference structure as a member of the thickness-dependent profile library and identifying the wafer as an updated wafer if matching criteria is met, or applying a first corrective action if the matching criteria are not met.

2. The method of claim 1, wherein applying a first corrective action comprises:

comparing the difference to a first thickness-dependent profile library creation criteria, and either identifying the reference structure as a wafer-thickness-dependent structure using the best estimate profile structure or best estimate profile parameters associated with the best estimate signal and storing the best estimate signal, the best estimate profile structure, and/or best estimate profile parameters associated with the best estimate signal in the thickness-dependent profile library if the first thickness-dependent profile library creation criteria is met, or applying a second corrective action if the first thickness-dependent profile library creation criteria is not met.

3. The method of claim 2, wherein applying a second corrective action comprises:

selecting a new best estimate signal for the updated measurement signal, the new best estimate signal being a new data point of the first wafer-thickness-dependent profile data space with a new thickness-dependent profile signal substantially close to the updated measurement signal;

calculating a new difference between the updated measurement signal and the new best estimate signal;

comparing the new difference to a new matching criteria; and either:

identifying the reference structure as a member of the thickness-dependent profile library and identifying the wafer as an updated wafer if the new matching criteria is met, or applying a third corrective action if the new matching criteria is not met.

4. The method of claim 2, wherein applying the second corrective action comprises:

selecting a new best estimate signal for the updated measurement signal, the new best estimate signal being a new data point of the first wafer-thickness-dependent profile data space with a new thickness-dependent profile signal substantially close to the updated measurement signal;

calculating a new difference between the updated measurement signal and the new best estimate signal;

comparing the new difference to a new thickness-dependent library creation criteria; and either:

identifying the reference structure as an updated structure using a new thickness-dependent profile structure data associated with the new best estimate signal and storing the reference structure as an updated structure if the new thickness-dependent profile library creation criteria is met, or applying a third corrective action if the new thickness-dependent profile library creation criteria is not met.

5. The method of claim 2, wherein the first thickness-dependent profile library creation criteria includes rules data, goodness of fit data, real-time wafer thickness data, wavelength data, threshold data, limit data, measured data, process data, or historical data.

6. The method of claim 1, wherein applying a first corrective action comprises:

establishing a new updated measurement recipe using the real-time wafer thickness;

measuring a new signal off the reference structure using the new updated measurement recipe, the measurement generating a new updated measurement signal that is dependent upon new real-time wafer thickness;

selecting a new best estimate signal for the new updated measurement signal, the new best estimate signal being a new data point of the first wafer-thickness-dependent profile data space with a new thickness-dependent profile signal substantially close to the new updated measurement signal, the new best estimate signal having a new best estimate profile structure and/or new best estimate profile parameters associated therewith;

calculating a new difference between the new updated measurement signal and the new best estimate signal;

comparing the new difference to a new matching criteria; and either:

identifying the reference structure as a member of the thickness-dependent profile library and identifying the wafer as an updated wafer if the new matching criteria are met, or applying a second corrective action if the new matching criteria are not met.

7. The method of claim 1, wherein applying a first corrective action comprises:

establishing a new updated measurement recipe using the real-time wafer thickness;

measuring a new signal off the reference structure using the new updated measurement recipe, the measurement generating a new updated measurement signal that is dependent upon new real-time wafer thickness;

selecting a new best estimate signal for the new updated measurement signal, the new best estimate signal being a new data point of the first wafer-thickness-dependent profile data space with a new thickness-dependent profile signal substantially close to the new updated measurement signal, the new best estimate signal having a new best estimate profile structure and/or new best estimate profile parameters associated therewith;

calculating a new difference between the new updated measurement signal and the new best estimate signal;

comparing the new difference to a new thickness-dependent profile library creation criteria, and either:

identifying the reference structure as a wafer-thickness-dependent structure using the new best estimate profile structure and/or new best estimate profile parameters associated with the new best estimate signal and storing the new best estimate signal, the new best estimate profile structure, and/or new best estimate profile parameters associated with the new best estimate signal in the thickness-dependent profile library if the new thickness-dependent profile library creation criteria is met, or applying a second corrective action if the new thickness-dependent profile library creation criteria is not met.

8. The method of claim 1, wherein applying a first corrective action comprises:

selecting a new measurement site using the real-time wafer thickness, wherein the new measurement site includes a new reference structure;

measuring a new signal off the new reference structure using the updated measurement recipe, the measurement generating a new updated measurement signal that is dependent upon the real-time wafer thickness;

selecting a new best estimate signal for the new updated measurement signal, the new best estimate signal being a new data point of the first wafer-thickness-dependent profile data space with a new thickness-dependent profile signal substantially close to the new updated measurement signal, the new best estimate signal having a new best estimate profile structure and/or new best estimate profile parameters associated therewith;

calculating a new difference between the new updated measurement signal and the new best estimate signal;

comparing the new difference to a new matching criteria; and either:

identifying the new reference structure as a member of the thickness-dependent profile library and identifying the wafer as an updated wafer if the new matching criteria are met, or applying a second corrective action if the new matching criteria are not met.

9. The method of claim 1, wherein applying a first corrective action comprises:

selecting a new measurement site using the real-time wafer thickness, wherein the new measurement site includes a new reference structure;

measuring a new signal off the new reference structure using the updated measurement recipe, the measurement generating a new updated measurement signal that is dependent upon the real-time wafer thickness;

selecting a new best estimate signal for the new updated measurement signal, the new best estimate signal being a new data point of the first wafer-thickness-dependent profile data space with a new thickness-dependent profile signal substantially close to the new updated measurement signal, the new best estimate signal having a new best estimate profile structure and/or new best estimate profile parameters associated therewith;

calculating a new difference between the new updated measurement signal and the new best estimate signal;

comparing the new difference to a new thickness-dependent profile library creation criteria, and either:

identifying the new reference structure as a wafer-thickness-dependent structure using the new best estimate profile structure and/or new best estimate profile parameters associated with the new best estimate signal and storing the new best estimate signal, the new best estimate profile structure, and/or new best estimate profile parameters associated with the new best estimate signal in the thickness-dependent profile library if the new thickness-dependent profile library creation criteria is met, or applying a second corrective action if the new thickness-dependent profile library creation criteria is not met.

10. The method of claim 1, wherein applying a first corrective action comprises:

establishing a new wafer-thickness-dependent profile data space proximate the first wafer-thickness-dependent profile data space in the thickness-dependent profile library using the real-time wafer thickness, the new wafer-thickness-dependent profile data space comprising new wafer-thickness-dependent profile signal data and associated new wafer-thickness-dependent profile structure data based on real-time wafer thickness, and comprising new data points having accuracy limits based on real-time wafer thickness data;

selecting a new best estimate signal for the updated measurement signal, the new best estimate signal being a data point of the new wafer-thickness-dependent profile data space with a thickness-dependent profile signal substantially close to the updated measurement signal, the new best estimate signal having a new best estimate profile structure and/or new best estimate profile parameters associated therewith;

calculating a new difference between the updated measurement signal and the new best estimate signal;

comparing the new difference to a new matching criteria; and either:

identifying the reference structure as a member of the thickness-dependent profile library and identifying the wafer as an updated wafer if the new matching criteria are met, or applying a second corrective action if the new matching criteria are not met.

11. The method of claim 1, wherein applying a first corrective action comprises:

establishing a new wafer-thickness-dependent profile data space proximate the first wafer-thickness-dependent profile data space in the thickness-dependent profile library using the real-time wafer thickness, the new wafer-thickness-dependent profile data space comprising new wafer-thickness-dependent profile signal data and associated new wafer-thickness-dependent profile structure data based on real-time wafer thickness, and comprising new data points having accuracy limits based on real-time wafer thickness data;

selecting a new best estimate signal for the updated measurement signal, the new best estimate signal being a data point of the new wafer-thickness-dependent profile data space with a thickness-dependent profile signal substantially close to the updated measurement signal, the new best estimate signal having a new best estimate profile structure and/or new best estimate profile parameters associated therewith;

calculating a new difference between the updated measurement signal and the new best estimate signal;

comparing the new difference to a new thickness-dependent profile library creation criteria, and either:

identifying the reference structure as a wafer-thickness-dependent structure using the new best estimate profile structure or new best estimate profile parameters associated with the new best estimate signal, or using both of these, and storing the new best estimate signal, the new best estimate profile structure, or new best estimate profile parameters associated with the new best estimate, or storing all of these criteria is met, or applying a second corrective action if the new thickness-dependent profile library creation criteria is not met.

12. The method of claim 1, wherein applying a first corrective action comprises:

determining a new real-time wafer thickness;

establishing a new wafer-thickness-dependent profile data space in the thickness-dependent profile library using the new real-time wafer thickness, the new wafer-thickness-dependent profile data space comprising new wafer-thickness-dependent profile signal data and associated new wafer-thickness-dependent profile structure data based on the new real-time wafer thickness, and comprising data points having accuracy limits based on the new real-time wafer thickness;

selecting a new best estimate signal for the updated measurement signal, the new best estimate signal being a data point of the new wafer-thickness-dependent profile data space with a thickness-dependent profile signal substantially close to the updated measurement signal, the new best estimate signal having a new best estimate profile structure and/or new best estimate profile parameters associated therewith;

calculating a new difference between the updated measurement signal and the new best estimate signal;

comparing the new difference to a new matching criteria; and either:

identifying the reference structure as a member of the thickness-dependent profile library and identifying the wafer as an updated wafer if the new matching criteria are met, or applying a second corrective action if the new matching criteria are not met.

13. The method of claim 1, wherein applying a first corrective action comprises:

determining a new real-time wafer thickness;

establishing a new wafer-thickness-dependent profile data space in the thickness-dependent profile library using the new real-time wafer thickness, the new wafer-thickness-dependent profile data space comprising new wafer-thickness-dependent profile signal data and associated new wafer-thickness-dependent profile structure data based on the new real-time wafer thickness, and comprising data points having accuracy limits based on the new real-time wafer thickness;

selecting a new best estimate signal for the updated measurement signal, the new best estimate signal being a data point of the new wafer-thickness-dependent profile data space with a thickness-dependent profile signal substantially close to the updated measurement signal, the new best estimate signal having a new best estimate profile structure and/or new best estimate profile parameters associated therewith;

comparing a new difference to a new thickness-dependent profile library creation criteria, and either:

identifying the reference structure as a wafer-thickness-dependent structure using the new best estimate profile structure and/or new best estimate profile parameters associated with the new best estimate signal and storing the new best estimate signal, the new best estimate profile structure, and/or new best estimate profile parameters associated with the new best estimate signal in the thickness-dependent profile library if the new thickness-dependent profile library creation criteria is met, or applying a second corrective action if the new thickness-dependent profile library creation criteria is not met.

14. The method of claim 1, wherein applying a first corrective action comprises:

determining a best estimate structure for the updated measurement signal, the best estimate structure being a data point of a new thickness-dependent profile data space with a thickness-dependent profile shape substantially close to the reference structure, wherein the best estimate structure includes a thickness-dependent height, width, thickness, depth, volume, area, dielectric property, critical dimension, spacing, period, position, or line width;

simulating a signal off a hypothetical structure corresponding to the best estimate structure;

calculating a second difference between the updated measurement signal and the simulated signal;

comparing the second difference to a second matching criteria; and either:

identifying the reference structure as a member of the thickness-dependent profile library and identifying the wafer as an updated wafer if second matching criteria are met, or applying a second corrective action if the second matching criteria are not met.

15. The method of claim 1, wherein applying a first corrective action comprises:

selecting a new best estimate structure for the updated measurement signal, the new best estimate structure being a new data point of a new thickness-dependent profile data space with a new thickness-dependent profile shape substantially close to the reference structure, wherein the new best estimate structure includes a new thickness-dependent height, width, thickness, depth, volume, area, dielectric property, critical dimension, spacing, period, position, or line width;

simulating a new signal off a hypothetical structure corresponding to the new best estimate structure;

calculating a new difference between the updated measurement signal and the new simulated signal;

comparing the new difference to a second thickness-dependent profile library creation criteria, and either:

identifying the reference structure as a wafer-thickness-dependent structure using a new best estimate profile structure and/or new best estimate profile parameters associated with a new best estimate signal and storing the new best estimate signal, the new best estimate profile structure, and/or new best estimate profile parameters associated with the new best estimate signal in the thickness-dependent profile library if the second thickness-dependent profile library creation criteria is met, or applying a second corrective action if the second thickness-dependent profile library creation criteria is not met.

16. The method as claimed in claim 1, wherein when the updated measurement recipe is established the real-time wafer thickness data is used to determine:

a wafer radius for aligning the wafer and/or for aligning an optical beam, a wafer curvature for the wafer, a contaminant level, a contamination probability, and/or an out-gassing rate for the wafer, an actual wafer thickness for the wafer when the wafer is measured, the amount of energy radiated by the wafer in an alignment and/or measurement chamber, optical properties for the wafer, a calibration factor for optical properties for the wafer, properties of a photoresist layer, or a correct location for a measurement site on the wafer.

17. The method of claim 1, wherein an optimization technique is performed to select the best estimate signal, and the optimization technique involves applying a global optimization technique and/or a local optimization technique.

18. The method of claim 1, wherein the matching criteria includes rules data, goodness of fit data, real-time wafer thickness data, wavelength data, threshold data, limit data, measured data, process data, or historical data.

19. The method of claim 1, wherein the reference structure is created using a deposition process, a coating process, an etching process, a thermal process, a cleaning process, an oxidation process, an ionization process, or a development process.

20. The method of claim 1, wherein the reference structure is verified using CD-scanning electron microscope (CD-SEM) data, transmission electron microscope (TEM) data, Atomic Force Microscope (AFM) data, or focused ion beam (FIB) data.

21. The method of claim 1, further comprising:
determining an accuracy value for the best estimate signal;
comparing the accuracy value to accuracy limits;
performing a refinement procedure if the accuracy value does not meet the accuracy limits.

22. The method of claim 1, wherein the updated measurement signal comprises wafer-thickness-dependent intensity signals, wafer-thickness-dependent transmission signals, wafer-thickness-dependent reflection signals, wafer-thickness-dependent diffraction signals, or thickness-dependent diffraction spectra.

23. The method of claim 1, wherein the electing of the best estimate signal further comprises:
selecting a set of weighting vectors, each weighting vector having vector elements, each vector element associated with the thickness-dependent profile signal corresponding to a selected data point;
calculating the total cost function for each weighting vector of the set of weighting vectors;
selecting the weighting vector that yields the minimum total cost function; and
creating the best estimate signal using the weighting vector associated with the minimum total cost function.

24. The method of claim 1, wherein the wafer comprises semiconductor material, dielectric material, glass material, ceramic material, or metallic material.

25. The method of claim 1, further comprising:
establishing the updated measurement recipe using a first real-time parameter tuning (RTPT) procedure that uses the real-time wafer thickness as tuning data;
determining a completion time for the first RTPT procedure;
comparing the completion time to a measurement start time; and either
measuring the wafer using the updated measurement recipe if the completion time is less than the processing start time, or measuring the wafer using a non-updated measurement recipe if the completion time is not less than the processing start time.

26. The method of claim 1, wherein the real time wafer thickness data is created using a Transparent Coupling Device (TCD), the real-time wafer thickness data being created when an input message includes a real-time feedforward message that includes real-time wafer thickness data.

27. The method of claim 1, wherein the establishing an updated measurement recipe using the real-time wafer thickness data further comprises:
establishing the updated measurement recipe using one or more Real-Time Parameter Tuning (RTPT) procedures that use the real-time wafer thickness data as tuning data when a RTPT state is a first value.

28. The method of claim 1, wherein the establishing an updated measurement recipe using the real-time wafer thickness data further comprises:
creating real-time wafer-thickness-dependent measurement recipe data, real-time wafer-thickness-dependent measurement profile data, or real-time wafer-thickness-dependent measurement model data, using a Real-Time Parameter Tuning (RTPT) procedure that uses the real-time wafer thickness data as tuning data when a RTPT state is a first value, or when the input message includes a real-time feedforward message; and
establishing the updated measurement recipe using the real-time wafer-thickness-dependent measurement recipe data, the real-time wafer-thickness-dependent measurement profile data, or the real-time wafer-thickness-dependent measurement model data.

29. The method of claim 1, wherein the establishing an updated measurement recipe using the real-time wafer thickness data further comprises:
feed-forwarding real-time wafer thickness data when the feedforward state is a first value, and not feed-forwarding the real-time wafer thickness data when the feedforward state is a second value, wherein the feedforward state is the first value when the real-time wafer thickness data can be fed-forward before an update process is performed for the wafer, and wherein the feedforward state is the second value when the real-time wafer thickness data cannot be fed forward before the update process is performed for the wafer.

30. The method of claim 1, wherein the establishing an updated measurement recipe using the real-time wafer thickness data further comprises:
creating tuned measurement recipe data, tuned measurement profile data, or tuned measurement model data, or any combination thereof using a Real-Time Parameter Tuning (RTPT) procedure that uses the real-time wafer thickness data and/or tuning data when the RTPT state is the first value, wherein the tuned measurement recipe data, the tuned measurement profile data, or the tuned measurement model data is created when the RTPT state is the first value; and
establishing the updated measurement recipe using the tuned measurement recipe data, the tuned measurement profile data, or the tuned measurement model data.

31. The method of claim 1, wherein the establishing an updated measurement recipe using the real-time wafer thickness data further comprises:
creating optimized measurement recipe data, optimized measurement profile data, or optimized measurement model data using a Real-Time Parameter Tuning (RTPT) procedure that uses the real-time wafer thickness data and/or optimization data when the optimization state is the first value, wherein the optimized measurement recipe data, the optimized measurement profile data, or the optimized measurement model data, is created when the optimization state is the first value; and
establishing the updated measurement recipe using the optimized measurement recipe data, the optimized measurement profile data, or the optimized measurement model data.

32. A method of using a thickness-dependent profile library for facilitating optical measurements, the method comprising:
receiving a wafer, wafer data, and one or more input messages, wherein the wafer comprises a plurality of dies and a number of measurement sites, the wafer data comprises wafer state data, and at least one of the one or more input messages comprises feed-forwarded tuning data;
determining a wafer state for the wafer, wherein a thickness-dependent profile library is identified using the wafer state;
determining a real-time wafer thickness using the feed-forwarded tuning data;
establishing a first wafer-thickness-dependent profile data space in the thickness-dependent profile library using the real-time wafer thickness, the first wafer-thickness-dependent profile data space comprising wafer-thickness-dependent profile signal data and associated waferthickness-dependent profile structure data based on real-time wafer thickness, and comprising data points having accuracy limits based on real-time wafer thickness data;

selecting a measurement site using the real-time wafer thickness, wherein the measurement site includes a reference structure;

establishing an updated measurement recipe using the real-time wafer thickness;

measuring a signal off the reference structure using the updated measurement recipe, the measurement generating an updated measurement signal that is dependent upon the real-time wafer thickness;

selecting a best estimate signal for the updated measurement signal, the best estimate signal being a data point of the first wafer-thickness-dependent profile data space with a thickness-dependent profile signal substantially close to the updated measurement signal, the best estimate signal having a best estimate profile structure and/or best estimate profile parameters associated therewith, wherein an optimization technique is performed to select the best estimate signal;

calculating a difference between the updated measurement signal and the best estimate signal;

comparing the difference to a product requirement; and either:
  continuing to process the wafer if the product requirement is met, or
  applying a first corrective action if the product requirement is not met.

* * * * *